United States Patent
Yamazaki et al.

(10) Patent No.: US 10,243,005 B2
(45) Date of Patent: Mar. 26, 2019

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Junichiro Sakata, Atsugi (JP); Masayuki Sakakura, Tochigi (JP); Yoshiaki Oikawa, Sagamihara (JP); Kenichi Okazaki, Tochigi (JP); Hotaka Maruyama, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/265,932

(22) Filed: Sep. 15, 2016

(65) Prior Publication Data
US 2017/0005118 A1    Jan. 5, 2017

Related U.S. Application Data

(60) Continuation of application No. 13/937,561, filed on Jul. 9, 2013, now Pat. No. 9,466,756, which is a
(Continued)

(30) Foreign Application Priority Data

Aug. 7, 2009    (JP) .................................. 2009-185318

(51) Int. Cl.
*H01L 21/385*     (2006.01)
*H01L 27/12*     (2006.01)
(Continued)

(52) U.S. Cl.
CPC ........ *H01L 27/1225* (2013.01); *H01L 21/385* (2013.01); *H01L 27/124* (2013.01);
(Continued)

(58) Field of Classification Search
CPC ......... H01L 2924/0002; H01L 2924/00; H01L 21/385; H01L 27/1214; H01L 27/1225;
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| CN | 001607561 A | 4/2005 |
| CN | 001908788 A | 2/2007 |

(Continued)

OTHER PUBLICATIONS

Ohara, H., Sasaki, T., Noda, K., Ito, S., Sasaki, M., Toyosumi, Y., Endo, Y., Yoshitomi, S., Sakata, J., Serikawa, T. and Yamazaki, S. (2009), 21.3: 4.0 In. QVGA AMOLED Display Using In—Ga—Zn—Oxide TFTs with a Novel Passivation Layer. SID Symposium Digest of Technical Papers, 40: 284-287.*

(Continued)

*Primary Examiner* — Tom Thomas
*Assistant Examiner* — Benjamin T Liu
(74) *Attorney, Agent, or Firm* — Robinson Intellectual Property Law Office; Eric J. Robinson

(57) ABSTRACT

An object is to improve reliability of a semiconductor device. A semiconductor device including a driver circuit portion and a display portion (also referred to as a pixel portion) over the same substrate is provided. The driver circuit portion and the display portion include thin film transistors in which a semiconductor layer includes an oxide semiconductor; a first wiring; and a second wiring. The thin film transistors each include a source electrode layer and a drain electrode layer which each have a shape whose end portions are located on an inner side than end portions of the
(Continued)

semiconductor layer. In the thin film transistor in the driver circuit portion, the semiconductor layer is provided between a gate electrode layer and a conductive layer. The first wiring and the second wiring are electrically connected in an opening provided in a gate insulating layer through an oxide conductive layer.

16 Claims, 35 Drawing Sheets

Related U.S. Application Data division of application No. 12/848,406, filed on Aug. 2, 2010, now Pat. No. 8,502,220.

(51) Int. Cl.
*H01L 33/00* (2010.01)
*H01L 29/49* (2006.01)
*H01L 29/786* (2006.01)

(52) U.S. Cl.
CPC ........ *H01L 27/127* (2013.01); *H01L 27/1214* (2013.01); *H01L 27/1251* (2013.01); *H01L 27/1255* (2013.01); *H01L 27/1288* (2013.01); *H01L 33/0041* (2013.01); *H01L 29/4908* (2013.01); *H01L 29/7869* (2013.01); *H01L 29/78648* (2013.01); *H01L 2924/0002* (2013.01)

(58) Field of Classification Search
CPC ............... H01L 27/124; H01L 27/1251; H01L 27/1255; H01L 27/127; H01L 27/1288; H01L 29/4908; H01L 29/78648; H01L 29/7869; H01L 33/0041; H01L 33/041
See application file for complete search history.

(56) References Cited

U.S. PATENT DOCUMENTS

| | | | |
|---|---|---|---|
| 6,252,248 B1 | 6/2001 | Sano et al. | |
| 6,294,274 B1 | 9/2001 | Kawazoe et al. | |
| 6,504,215 B1 * | 1/2003 | Yamanaka | G02F 1/13454 |
| | | | 257/350 |
| 6,563,174 B2 | 5/2003 | Kawasaki et al. | |
| 6,727,522 B1 | 4/2004 | Kawasaki et al. | |
| 6,894,674 B2 | 5/2005 | Nakajima et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,154,225 B2 | 12/2006 | Kim et al. | |
| 7,211,825 B2 | 5/2007 | Shih et al. | |
| 7,218,048 B2 | 5/2007 | Choi et al. | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,432,906 B2 | 10/2008 | Nakajima et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,517,464 B2 | 4/2009 | Matsushita et al. | |
| 7,674,650 B2 | 3/2010 | Akimoto et al. | |
| 7,704,859 B2 | 4/2010 | Sato | |
| 7,719,185 B2 | 5/2010 | Jin et al. | |
| 7,732,819 B2 | 6/2010 | Akimoto et al. | |
| 7,738,050 B2 | 6/2010 | Yamazaki | |
| 7,745,798 B2 | 6/2010 | Takahashi | |
| 7,833,845 B2 | 11/2010 | Yamazaki et al. | |
| 7,884,360 B2 | 2/2011 | Takechi et al. | |
| 7,910,490 B2 | 3/2011 | Akimoto et al. | |
| 7,932,521 B2 | 4/2011 | Akimoto et al. | |
| 7,993,991 B2 | 8/2011 | Miyairi et al. | |
| 8,071,985 B2 | 12/2011 | Sakurai et al. | |
| 8,106,400 B2 | 1/2012 | Miyairi et al. | |
| 8,110,436 B2 | 2/2012 | Hayashi et al. | |
| 8,111,362 B2 | 2/2012 | Yamazaki et al. | |
| 8,143,115 B2 | 3/2012 | Omura et al. | |
| 8,148,721 B2 | 4/2012 | Hayashi et al. | |
| 8,193,045 B2 | 6/2012 | Omura et al. | |
| 8,242,496 B2 | 8/2012 | Yamazaki et al. | |
| 8,263,421 B2 | 9/2012 | Yamazaki et al. | |
| 8,274,077 B2 | 9/2012 | Akimoto et al. | |
| 8,325,285 B2 | 12/2012 | Yamazaki et al. | |
| 8,334,959 B2 | 12/2012 | Hirabayashi et al. | |
| 8,378,343 B2 | 2/2013 | Yamazaki et al. | |
| 8,415,198 B2 | 4/2013 | Itagaki et al. | |
| 8,420,442 B2 | 4/2013 | Takechi et al. | |
| 8,462,286 B2 | 6/2013 | Yamazaki et al. | |
| 8,466,463 B2 | 6/2013 | Akimoto et al. | |
| 8,557,641 B2 | 10/2013 | Sasaki et al. | |
| 8,586,979 B2 | 11/2013 | Son et al. | |
| 8,629,069 B2 | 1/2014 | Akimoto et al. | |
| 8,669,550 B2 | 3/2014 | Akimoto et al. | |
| 8,785,240 B2 | 7/2014 | Watanabe | |
| 8,790,959 B2 | 7/2014 | Akimoto et al. | |
| 8,796,069 B2 | 8/2014 | Akimoto et al. | |
| 8,842,230 B2 | 9/2014 | Yamazaki et al. | |
| 8,889,480 B2 | 11/2014 | Takechi et al. | |
| 8,900,916 B2 | 12/2014 | Yamazaki et al. | |
| 9,000,431 B2 | 4/2015 | Miyairi et al. | |
| 9,099,562 B2 | 8/2015 | Akimoto et al. | |
| 9,209,026 B2 | 12/2015 | Takechi et al. | |
| 9,219,158 B2 | 12/2015 | Miyairi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0134878 A1 | 7/2004 | Matsushita et al. | |
| 2005/0017302 A1 | 1/2005 | Hoffman | |
| 2005/0073051 A1 | 4/2005 | Yamamoto et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0069626 A1 | 3/2007 | Kim et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0171157 A1 | 7/2007 | Choi et al. | |

(56) References Cited

U.S. PATENT DOCUMENTS

| | | |
|---|---|---|
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0148971 A1 | 6/2009 | Fujii et al. |
| 2009/0152506 A1 | 6/2009 | Umeda et al. |
| 2009/0152541 A1 | 6/2009 | Maekawa et al. |
| 2009/0152559 A1* | 6/2009 | Miyairi ............. H01L 27/1214 257/66 |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0244022 A1 | 9/2010 | Takahashi et al. |
| 2010/0295042 A1 | 11/2010 | Yano et al. |
| 2011/0104851 A1 | 5/2011 | Akimoto et al. |
| 2011/0121290 A1 | 5/2011 | Akimoto et al. |
| 2012/0168750 A1 | 7/2012 | Hayashi et al. |
| 2012/0298990 A1 | 11/2012 | Yamazaki et al. |
| 2014/0011320 A1 | 1/2014 | Sasaki et al. |
| 2015/0001546 A1 | 1/2015 | Yamazaki et al. |
| 2015/0084048 A1 | 3/2015 | Hayashi et al. |
| 2015/0340513 A1 | 11/2015 | Akimoto et al. |

FOREIGN PATENT DOCUMENTS

| | | |
|---|---|---|
| CN | 101335293 A | 12/2008 |
| CN | 101728434 A | 6/2010 |
| EP | 1343134 A | 9/2003 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2086013 A | 8/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-053147 A | 3/1993 |
| JP | 05-251705 A | 9/1993 |
| JP | 08-264794 A | 10/1996 |
| JP | 11-505377 | 5/1999 |
| JP | 11-354802 A | 12/1999 |
| JP | 2000-044236 A | 2/2000 |
| JP | 2000-150900 A | 5/2000 |
| JP | 2002-076356 A | 3/2002 |
| JP | 2002-175053 A | 6/2002 |
| JP | 2002-289859 A | 10/2002 |
| JP | 2003-029293 A | 1/2003 |
| JP | 2003-069028 A | 3/2003 |
| JP | 2003-086000 A | 3/2003 |
| JP | 2003-086808 A | 3/2003 |
| JP | 2003-179069 A | 6/2003 |
| JP | 2004-047566 A | 2/2004 |
| JP | 2004-103957 A | 4/2004 |
| JP | 2004-177946 A | 6/2004 |
| JP | 2004-273614 A | 9/2004 |
| JP | 2004-273732 A | 9/2004 |
| JP | 2007-081362 A | 3/2007 |
| JP | 2007-096055 A | 4/2007 |
| JP | 2007-123861 A | 5/2007 |
| JP | 2007-163467 A | 6/2007 |
| JP | 2007-171932 A | 7/2007 |
| JP | 2007-316110 A | 12/2007 |
| JP | 2008-042088 A | 2/2008 |
| JP | 2008-096962 A | 4/2008 |
| JP | 2008-166716 A | 7/2008 |
| JP | 2008-281988 A | 11/2008 |
| JP | 2009-010362 A | 1/2009 |
| JP | 2009-021612 A | 1/2009 |
| JP | 2009-033120 A | 2/2009 |
| JP | 2009-038353 A | 2/2009 |
| JP | 2009-135380 A | 6/2009 |
| JP | 2009-158940 A | 7/2009 |
| JP | 2009-158941 A | 7/2009 |
| JP | WO2009/093722 * | 7/2009 ............ H01L 29/786 |
| JP | 2009-265271 A | 11/2009 |
| JP | 2010-098280 A | 4/2010 |
| KR | 2009-0018587 A | 2/2009 |
| KR | 2009-0041506 A | 4/2009 |
| WO | WO-2004/114391 | 12/2004 |
| WO | WO-2008/069056 | 6/2008 |
| WO | WO-2008/069255 | 6/2008 |
| WO | WO-2008/126879 | 10/2008 |
| WO | WO-2008/149873 | 12/2008 |
| WO | WO-2009/041713 | 4/2009 |
| WO | WO-2009/072451 | 6/2009 |
| WO | WO-2009/093625 | 7/2009 |
| WO | WO-2009/093722 | 7/2009 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "66.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Van de Walle.C, "Hydrogen as a Cause of Doping in Zinc Oxide", Phys. Rev. Lett. (Physical Review Letters), Jul. 31, 2000, vol. 35, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Nakamura.M, "Synthesis of Homologous Compound with New Long-Period Structure", Nirim Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2003, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Cho.Y et al., "Characteristics of a-Si:H Dual-Gate TFTS Using ITO Electrode for LCD Driver", AM-FPD '08 Digest of Technical Papers, Jul. 2, 2008, pp. 229-232.

Chinese Office Action (Application No. 201010246753.2) dated Feb. 27, 2014.

Taiwanese Office Action (Application No. 099124554) dated Jan. 21, 2015.

Korean Office Action (Application No. 2010-0075172) dated Jun. 30, 2016.

Chinese Office Action (Application No. 201510001758.1) dated Feb. 20, 2017.

Chinese Office Action (Application No. 201510001758.1) dated Sep. 26, 2017.

Korean Office Action (Application No. 2017-0156330) dated Dec. 27, 2017.

\* cited by examiner

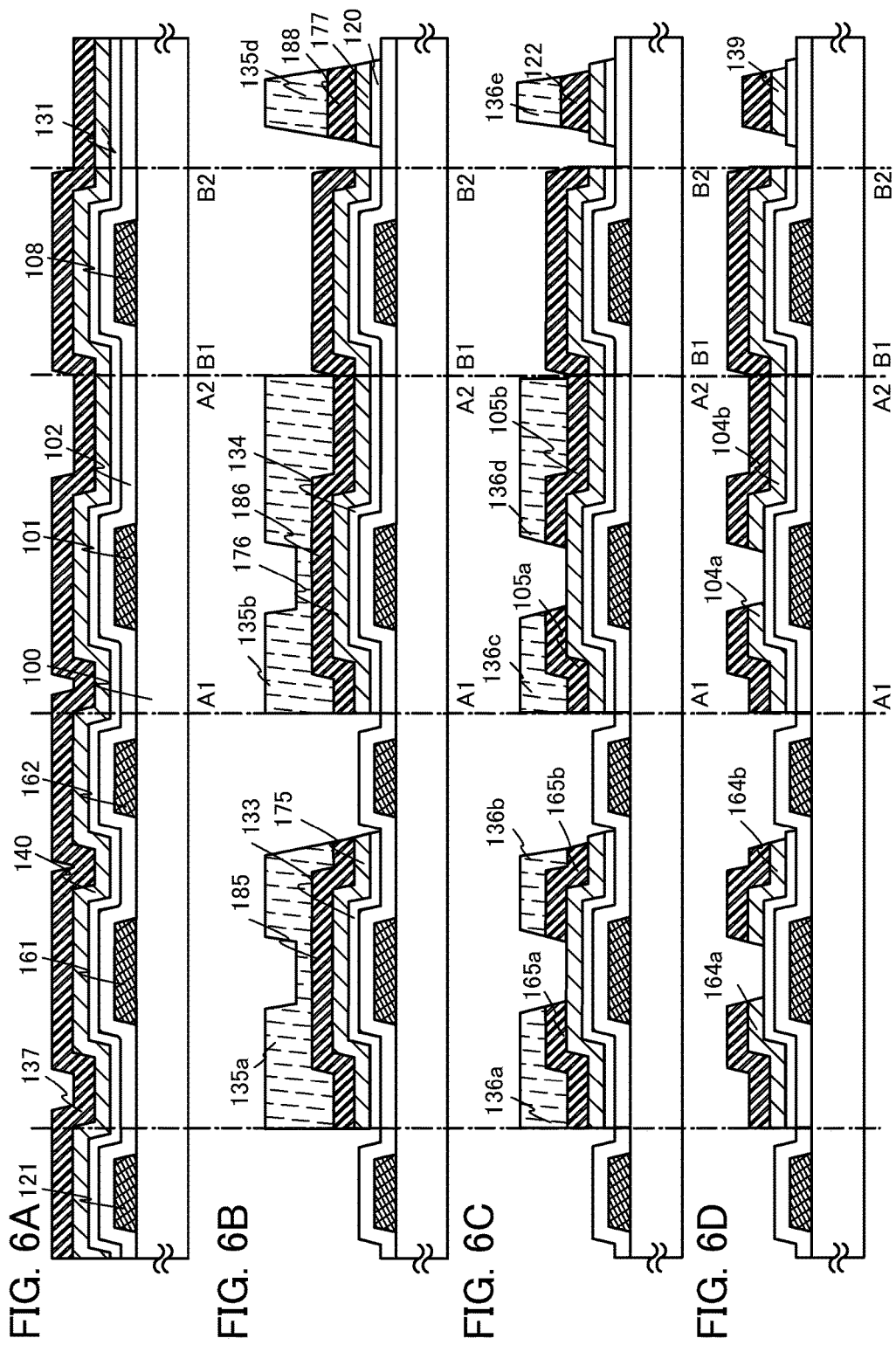

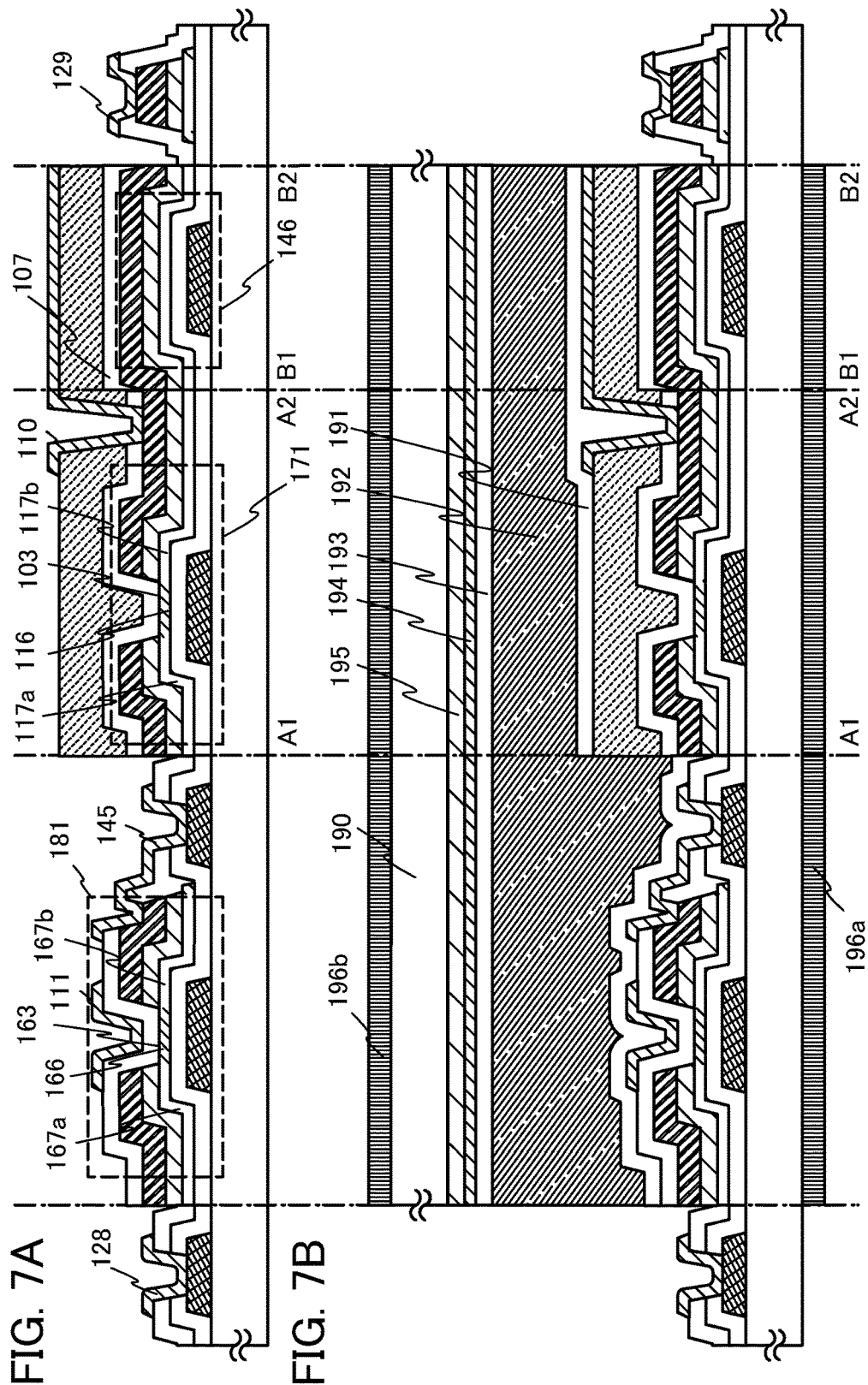

FIG. 11A1 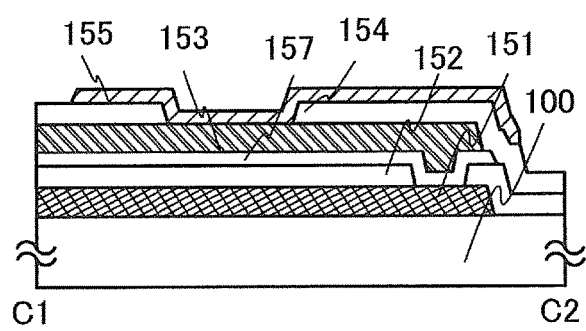
FIG. 11A2 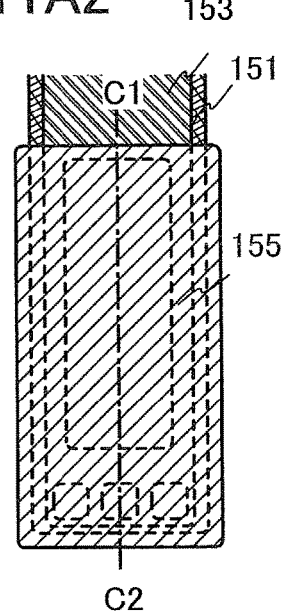
FIG. 11B1 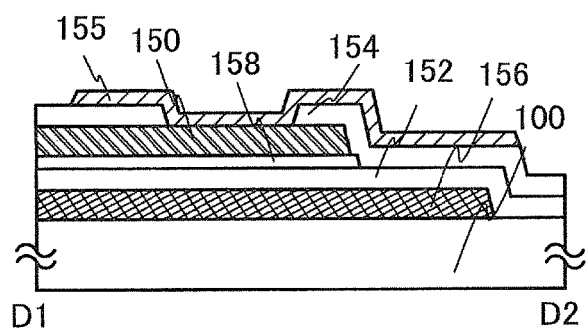
FIG. 11B2 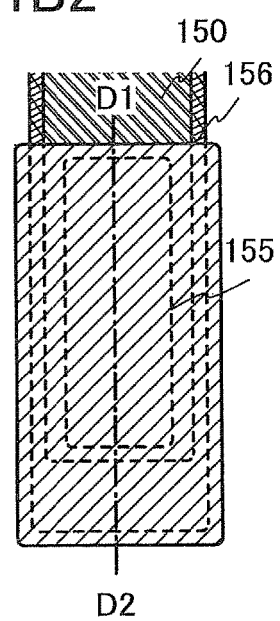

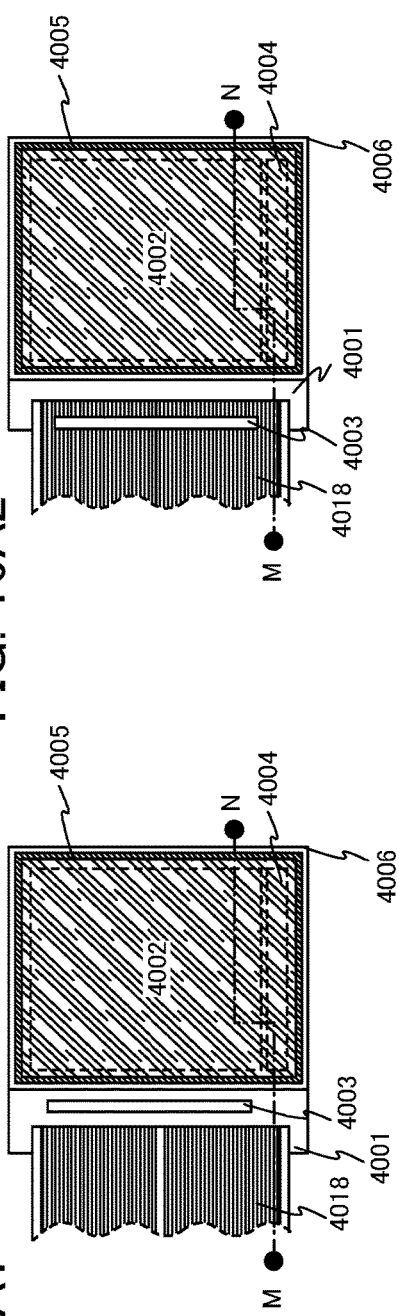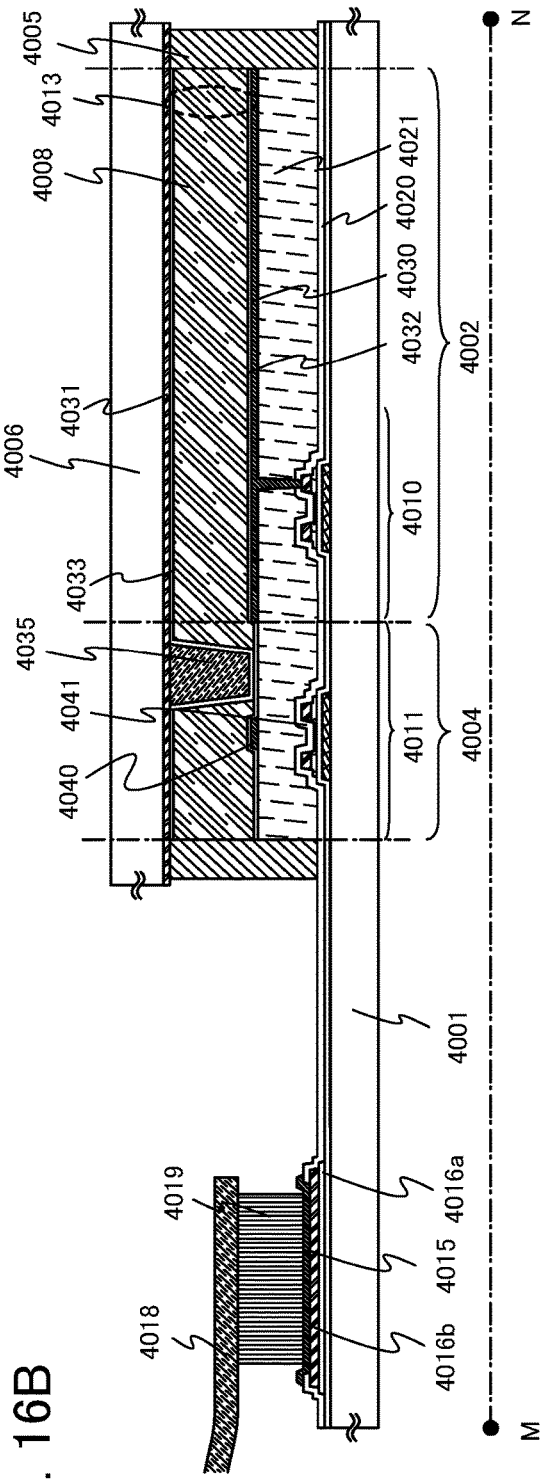

SEMICONDUCTOR DEVICE AND MANUFACTURING METHOD THEREOF

BACKGROUND OF THE INVENTION

1. Field of the Invention

The present invention relates to a semiconductor device including an oxide semiconductor.

In this specification, a semiconductor device means all types of devices which can function by utilizing semiconductor characteristics, and an electro-optical device such as a liquid crystal display device, a semiconductor circuit, and an electronic device are all semiconductor devices.

2. Description of the Related Art

In recent years, a technique for forming a thin film transistor (TFT) by using a semiconductor thin film (having a thickness of approximately several nanometers to several hundreds of nanometers) formed over a substrate having an insulating surface has attracted attention. Thin film transistors are applied to a wide range of electronic devices such as integrated circuits (ICs) and electro-optical devices, and thin film transistors that are used as switching elements in image display devices are, in particular, urgently developed. A wide variety of metal oxides exist and are used for various applications. Indium oxide is a well-known material and is used as a transparent electrode material which is necessary for liquid crystal displays and the like.

Some metal oxides have semiconductor characteristics. Examples of the metal oxides having semiconductor characteristics are tungsten oxide, tin oxide, indium oxide, zinc oxide, and the like. Thin film transistors in which a channel formation region is formed using such a metal oxide having semiconductor characteristics are already known (Patent Document 1 and Patent Document 2).

REFERENCE

Patent Document

[Patent Document 1] Japanese Published Patent Application No. 2007-123861

[Patent Document 2] Japanese Published Patent Application No. 2007-96055

SUMMARY OF THE INVENTION

High-speed operation, a relatively easy manufacturing process, and sufficient reliability are demanded for a thin film transistor including an oxide semiconductor layer.

An object is to improve operation characteristics and reliability of a thin film transistor including an oxide semiconductor layer.

In particular, higher operation speed of a thin film transistor used in a driver circuit is preferable.

For example, the operation speed becomes higher when the channel length (L) of a thin film transistor is shortened or when the channel width (W) is increased. However, in the case where the channel length is shortened, a problem of switching characteristics such as a small on-off ratio arises. Further, there is a problem in that the capacity load of the thin film transistor is increased when the channel width (W) is increased.

Another object is to provide a semiconductor device including a thin film transistor having stable electric characteristics even if a channel length is small.

When a plurality of circuits which are different from each other are formed over an insulating surface, for example, when a pixel portion and a driver circuit are formed over the same substrate, excellent switching characteristics such as a high on-off ratio is needed for a thin film transistor used for the pixel portion, while high operation speed is needed for a thin film transistor used for the driver circuit. In particular, as the definition of a display device is higher, writing time of a displayed image is reduced. Therefore, it is preferable that the thin film transistor used for the driver circuit operate at high speed.

Another object is to reduce variation in electric characteristics of thin film transistors each including an oxide semiconductor layer.

Another object is to simplify a manufacturing process of a thin film transistor including an oxide semiconductor layer.

One embodiment of the present invention is a semiconductor device which includes a driver circuit portion and a display portion (also referred to as a pixel portion) over the same substrate, in which the driver circuit portion and the display portion include thin film transistors, a first wiring (also referred to as a terminal or a connection electrode), and a second wiring (also referred to as a terminal or a connection electrode); in which the thin film transistors each include a gate electrode including metal, a gate insulating layer over the gate electrode, an oxide semiconductor layer over the gate insulating layer, a source electrode (also referred to as a source electrode layer) and a drain electrode (also referred to as a drain electrode layer) which include metal and which each have a shape whose end portions are located on an inner side than end portions of the oxide semiconductor layer over the oxide semiconductor layer, and a protective insulating layer over the oxide semiconductor layer and the source and drain electrodes; in which the thin film transistor in the driver circuit portion includes a conductive layer in a region overlapping with the oxide semiconductor layer over the protective insulating layer; in which the thin film transistor in the display portion is electrically connected to a pixel electrode (also referred to as a pixel electrode layer); and in which the first wiring is formed using the same material as the gate electrode, the second wiring is formed using the same material as the source and drain electrodes, and the first wiring and the second wiring are electrically connected to each other through an opening (a contact hole) formed in the gate insulating layer and the protective insulating layer.

As the thin film transistor for the pixel and the thin film transistor for the driver circuit, inverted-staggered thin film transistors having a bottom-gate structure are used. The thin film transistor for the pixel and the thin film transistor for the driver circuit are each a channel-etched thin film transistor in which an oxide insulating layer is provided in contact with an oxide semiconductor layer exposed between a source electrode layer and a drain electrode layer.

The thin film transistor for the driver circuit has a structure in which the oxide semiconductor layer is sandwiched between the gate electrode and the conductive layer. With this structure, variation in threshold voltage of thin film transistor can be reduced; accordingly, a semiconductor device including the thin film transistor with stable electric characteristics can be provided. The conductive layer may have the same potential as the gate electrode layer or may have a floating potential or a fixed potential such as GND potential or 0V. By setting the potential of the conductive layer to an appropriate value, the threshold voltage of the thin film transistor can be controlled.

One embodiment of the present invention for realizing the above structure is a method for manufacturing a semiconductor device, including the steps of forming first electrodes each serving as a gate electrode and a first wiring using the same material as the first electrodes in a first region in which a driver circuit portion is formed and a second region in which a display portion is formed over the same substrate by a first photolithography step; forming a first insulating film serving as a gate insulating layer over the first electrodes and the first wiring; forming an oxide semiconductor layer over the first insulating film; performing heat treatment for dehydrating or dehydrogenating the oxide semiconductor layer; forming a metal film for forming source electrodes and drain electrodes over the oxide semiconductor layer; forming a resist mask having regions with different thicknesses over the metal film with use of a multi-tone mask, and etching the oxide semiconductor layer and the metal film with use of the resist mask having regions with different thicknesses as a mask layer to be processed into island-shaped oxide semiconductor layers and island-shaped metal layers, by a second photolithography step; conducting ashing on the mask layer to reduce the mask layer and remove a thin region of the resist mask, so that mask layers which are separated from each other are formed; etching exposed portions of the mask layer to form second electrodes each serving as a source electrode, third electrodes each serving as a drain electrode, and a second wiring using the same material as the source electrodes and the drain electrodes, which each have a shape whose end portions are located on an inner side than end portions of the oxide semiconductor layer; removing the mask layer; forming a second insulating film which is an oxide insulating layer over the second electrodes, the third electrodes, and the oxide semiconductor layers; selectively removing the first insulating film and the second insulating film which overlap with the first wiring to form a first opening, selectively removing the second insulating film which overlaps with the second wiring to form a second opening, and selectively removing the second insulating film in the second region to form a third opening at a position overlapping with one of the second electrode and the third electrode, by a third photolithography step; and forming a first conductive layer which electrically connects the first wiring and the second wiring through the first opening and the second opening, forming a fourth electrode using the same material as the first conductive layer at a position overlapping with the oxide semiconductor layer with the second insulating film interposed therebetween in the first region, and forming a fifth electrode which is electrically connected to a thin film transistor in the second region through the third opening, is formed using the same material as the first conductive layer, and serves as a pixel electrode, by a fourth photolithography step.

The number of photomasks can be reduced, resulting in simplified process.

Since a mask layer formed with the use of a multi-tone mask has a plurality of film thicknesses and further can be changed in shape by performing etching on the mask layer, the mask layer can be used in a plurality of etching steps for processing into different patterns. Therefore, a mask layer corresponding to at least two kinds or more of different patterns can be formed with one multi-tone mask. Thus, the number of light-exposure masks can be reduced and the number of corresponding photolithography steps can also be reduced, whereby simplification of a process can be realized.

With the above structure, at least one of the above problems can be resolved.

For example, the oxide semiconductor used in this specification is formed into a thin film represented by $InMO_3(ZnO)_m$ (m>0), and a thin film transistor whose oxide semiconductor layer is formed using the thin film is manufactured. Note that M represents one or more metal elements selected from Ga, Fe, Ni, Mn, or Co. As an example, M may be Ga or may include the above metal element in addition to Ga; for example, M may be Ga and Ni or Ga and Fe. Moreover, in the above oxide semiconductor, in some cases, a transition metal element such as Fe or Ni or an oxide of the transition metal is included as an impurity element in addition to a metal element included as M. In this specification, among the oxide semiconductor layers whose composition formulae are represented by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As a metal oxide applied to the oxide semiconductor layer, any of the following metal oxides can be applied besides the above: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon oxide may be included in the oxide semiconductor layer formed using the above metal oxide.

In the case where heat treatment is performed in an atmosphere of an inert gas such as nitrogen or a rare gas (e.g., argon or helium), the oxide semiconductor layer is changed into an oxygen-deficient oxide semiconductor layer by the heat treatment so as to be a low-resistance oxide semiconductor layer, that is, an n-type (such as n⁻-type) oxide semiconductor layer. Then, the oxide semiconductor layer is placed in an oxygen-excess state by formation of an oxide insulating layer which is in contact with the oxide semiconductor layer and heat treatment after the formation so as to be a high-resistance oxide semiconductor layer, that is, an i-type oxide semiconductor layer. In addition, it also can be said that solid phase oxidation by which the oxide semiconductor layer is in an oxygen-excess state is performed. Accordingly, it is possible to manufacture and provide a semiconductor device including a highly reliable thin film transistor having favorable electric characteristics.

As dehydration or dehydrogenation, heat treatment is performed in an atmosphere of an inert gas such as nitrogen or a rare gas (e.g., argon or helium) at higher than or equal to 400° C. and lower than the strain point of the substrate, preferably higher than or equal to 420° C. and lower than or equal to 570° C., so that impurities such as moisture included in the oxide semiconductor layer is reduced. Further, water ($H_2O$) can be prevented from being contained in the oxide semiconductor layer again later.

The heat treatment for dehydration or dehydrogenation is preferably performed in a nitrogen atmosphere with an $H_2O$ concentration of 20 ppm or lower. Alternatively, the heat treatment may be performed in ultra-dry air with an $H_2O$ concentration of 20 ppm or lower.

The oxide semiconductor layer is subjected to dehydration or dehydrogenation under a heat treatment condition that two peaks of water or at least one peak of water at around 300° C. is not detected even if TDS (Thermal Desorption Spectroscopy) is performed at up to 450° C. on the oxide semiconductor layer subjected to dehydration or dehydrogenation. Therefore, even if TDS (Thermal Desorption Spectroscopy) is performed at up to 450° C. on a thin film transistor including an oxide semiconductor layer subjected to dehydration or dehydrogenation, at least the peak of water at around 300° C. is not detected.

In addition, it is important to prevent water and hydrogen from being reincorporated into the oxide semiconductor layer, without exposure to air, with the use of a furnace in which dehydration or dehydrogenation is performed on the oxide semiconductor layer when the temperature is lowered from a heat temperature T at which dehydration or dehydrogenation is performed. When a thin film transistor is formed using an oxide semiconductor layer obtained by changing an oxide semiconductor layer into a low-resistance oxide semiconductor layer, that is, an n-type (such as n⁻-type) oxide semiconductor layer by dehydration or dehydrogenation and by changing the low-resistance oxide semiconductor layer into a high-resistance oxide semiconductor layer so as to be an i-type oxide semiconductor layer, the threshold voltage value of the thin film transistor can be positive, so that a so-called normally-off switching element can be realized. It is desirable for a semiconductor device (a display device) that a channel be formed with gate threshold voltage that is a positive value and as close to 0 V as possible. If the threshold voltage value of the thin film transistor is negative, it tends to be normally on; in other words, current flows between the source electrode and the drain electrode even when the gate voltage is 0 V. In an active matrix display device, electric characteristics of thin film transistors included in a circuit are important and performance of the display device depends on the electric characteristics. Among the electric characteristics of thin film transistors, in particular, threshold voltage ($V_{th}$) is important. When the threshold voltage value is high or is on the minus side although the field effect mobility is high, it is difficult to control the circuit. When a thin film transistor has a large threshold voltage value and a large absolute value of its threshold voltage, the thin film transistor cannot perform the switching function as a TFT and may be a load when the transistor is driven at low voltage. In the case of an n-channel thin film transistor, it is preferable that a channel be formed and drain current begin to flow after the positive voltage is applied as gate voltage. A transistor in which a channel is not formed unless the driving voltage is increased and a transistor in which a channel is formed and drain current flows even in the case of the negative voltage state are unsuitable for a thin film transistor used in a circuit.

In addition, a gas atmosphere in which the temperature is lowered from the heating temperature T may be switched to a gas atmosphere which is different from the gas atmosphere in which the temperature is raised to the heating temperature T. For example, cooling is performed by using the furnace in which dehydration or dehydrogenation is performed and by filling the furnace with a high-purity oxygen gas, a high-purity $N_2O$ gas, or ultra-dry air (having a dew point of −40° C. or lower, preferably −60° C. or lower) without exposure to air.

The electric characteristics of a thin film transistor are improved using an oxide semiconductor layer cooled slowly (or cooled) in an atmosphere (having a dew point of −40° C. or lower, preferably −60° C. or lower) which does not include moisture after moisture which is included in the film is reduced by heat treatment for dehydration or dehydrogenation, and high-performance thin film transistors which can be mass-produced are realized.

In this specification, heat treatment in an atmosphere of an inert gas such as nitrogen or a rare gas (e.g., argon or helium) is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

In the case where heat treatment is performed in an atmosphere of an inert gas such as nitrogen or a rare gas (e.g., argon or helium), the oxide semiconductor layer is changed into an oxygen-deficient oxide semiconductor layer by the heat treatment so as to be a low-resistance oxide semiconductor layer, that is, an n-type (such as n⁻-type) oxide semiconductor layer.

Further, a region overlapping with the drain electrode layer is formed as a high-resistance drain region (also referred to as an HRD region) which is an oxygen-deficient region. In addition, a region overlapping with the source electrode layer is formed as a high-resistance source region (also referred to as an HRS region) which is an oxygen-deficient region.

Specifically, the carrier concentration of the high-resistance drain region is higher than or equal to $1 \times 10^{18}/cm^3$ and is at least higher than the carrier concentration of a channel formation region (lower than $1 \times 10^{18}/cm^3$). Note that the carrier concentration in this specification is a carrier concentration obtained by Hall effect measurement at room temperature.

Then, the channel formation region is formed by placing at least part of the dehydrated or dehydrogenated oxide semiconductor layer in an oxygen-excess state so as to be a high-resistance oxide semiconductor layer, that is, an i-type oxide semiconductor layer. Note that as the treatment for placing the dehydrated or dehydrogenated oxide semiconductor layer in an oxygen-excess state, the following treatment is given, for example: deposition of an oxide insulating layer which is in contact with the dehydrated or dehydrogenated oxide semiconductor layer by a sputtering method; heat treatment or heat treatment in an atmosphere including oxygen, or cooling treatment in an oxygen atmosphere or ultra-dry air (having a dew point of −40° C. or lower, preferably −60° C. or lower) after heat treatment in an inert gas atmosphere, after the deposition of the oxide insulating layer; or the like.

In order to form a channel formation region in at least part (a portion which overlaps with the gate electrode layer) of the dehydrated or dehydrogenated oxide semiconductor layer, the oxide semiconductor layer may be selectively made in an oxygen-excess state; thus, the resistance in the oxygen-excess region can be increased; that is, the region can have i-type conductivity. A source electrode layer and a drain electrode layer which are metal electrodes of Ti or the like are formed over and in contact with the dehydrated or dehydrogenated oxide semiconductor layer, and an exposed region which overlaps with neither the source electrode layer nor the drain electrode layer may be selectively made in an oxygen-excess state, so that a channel formation region can be formed. In the case where the oxide semiconductor layer is selectively made in an oxygen-excess state, a first high-resistance source region which overlaps with the source electrode layer and a second high-resistance drain region which overlaps with the drain electrode layer are formed, and a channel formation region is formed between the first high-resistance source region and the second high-resistance drain region. In other words, the channel formation region is formed between the source electrode layer and the drain electrode layer in a self-aligned manner.

Accordingly, it is possible to manufacture and provide a semiconductor device including a highly reliable thin film transistor having favorable electric characteristics.

Note that by forming the high-resistance drain region in the oxide semiconductor layer overlapping with the drain electrode layer, the reliability of a driver circuit to be formed can be improved. Specifically, by forming the high-resistance drain region, a structure can be obtained in which conductivity can be varied from the drain electrode layer to the high-resistance drain region and the channel formation region. Therefore, in the case where the thin film transistor operates with the drain electrode layer connected to a wiring for supplying a high power supply potential VDD, the high-resistance drain region serves as a buffer and a high electric field is not applied locally even if a high electric field is applied between the gate electrode layer and the drain electrode layer, so that the withstand voltage of the transistor can be improved.

In addition, the high-resistance drain region and the high-resistance source region are formed in the oxide semiconductor layer overlapping with the drain electrode layer and the source electrode layer, respectively, so that reduction in leakage current can be achieved in the channel formation region in the formed driver circuit. In particular, when the high-resistance drain region is formed, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In this case, in the channel formation region, leakage current flowing from the high-resistance drain region on the drain electrode layer side to the channel region can be concentrated on the vicinity of an interface between the channel formation region and a gate insulating layer which has high resistance when the transistor is off. Thus, the amount of leakage current in a back channel portion (part of a surface of the channel formation which is apart from the gate electrode layer) can be reduced.

Further, the high-resistance source region which overlaps with the source electrode layer and the high-resistance drain region which overlaps with the drain electrode layer overlap with each other with part of the gate electrode layer and the gate insulating layer interposed therebetween, depending on the width of the gate electrode layer, and the intensity of an electric field in the vicinity of an end portion of the drain electrode layer can be reduced more effectively.

Further, an oxide conductive layer may be formed between the oxide semiconductor layer and the source and drain electrodes. The oxide conductive layer preferably contains zinc oxide as a component and preferably does not contain indium oxide. For example, zinc oxide, zinc aluminum oxide, zinc aluminum oxynitride, gallium zinc oxide, or the like can be used. The oxide conductive layer also functions as a low-resistance drain (LRD, also referred to as an LRN (low-resistance n-type conductivity)) region. Specifically, the carrier concentration of the low-resistance drain region is higher than that of the high-resistance drain region (the HRD region) and preferably in a range of $1 \times 10^{20}/cm^3$ or higher and $1 \times 10^{21}/cm^3$ or lower. Provision of the oxide conductive layer between the oxide semiconductor layer and the source and drain electrodes can reduce contact resistance and realizes higher speed operation of the transistor. Accordingly, frequency characteristics of a peripheral circuit (a driver circuit) can be improved.

In the case where formation of the oxide conductive layer is applied to the above manufacturing method, the oxide conductive layer may be formed after the oxide semiconductor layer is formed. Then, the metal film may be formed. The oxide conductive layer may be formed either before or after the heat treatment performed for dehydration or dehydrogenation of the oxide semiconductor layer.

The oxide conductive layer and the metal film for forming the source and drain electrodes can be formed in succession.

Further, the above-described first wiring and the second wiring may be formed using a wiring that is formed by stacking a metal material and the same material as that of the oxide conductive layer functioning as an LRN region or an LRD region. By stacking the metal and the oxide conductive layer, coverage at the step such as an overlapping portion of wirings or an opening can be improved; thus, wiring resistance can be lowered. Furthermore, effects of preventing local increase in resistance of a wiring due to migration or the like and preventing disconnection of a wiring can be expected; accordingly, a highly reliable semiconductor device can be provided.

Regarding the above-described connection between the first wiring and the second wiring, when the oxide conductive layer is sandwiched therebetween, it is expected to prevent increase in contact resistance which is caused by formation of an insulating oxide on a metal surface in the connection portion (contact portion); accordingly, a highly reliable semiconductor device can be provided.

Since a thin film transistor is easily broken due to static electricity or the like, a protective circuit for protecting the thin film transistor for the pixel portion is preferably provided over the same substrate for a gate line or a source line. The protective circuit is preferably formed using a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

A semiconductor device including a thin film transistor which uses an oxide semiconductor layer and has excellent electric characteristics and high reliability can be realized.

BRIEF DESCRIPTION OF THE DRAWINGS

FIGS. 2A to 2C are diagrams illustrating a method for manufacturing a semiconductor device.

FIGS. 6A to 6D are diagrams illustrating a method for manufacturing a semiconductor device.

FIGS. 7A and 7B are diagrams illustrating a method for manufacturing a semiconductor device.

FIGS. 11A1, 11A2, 11B1, and 11B2 are diagrams illustrating a semiconductor device.

FIGS. 16A1, 16A2, and 16B are diagrams illustrating semiconductor devices.

DETAILED DESCRIPTION OF THE INVENTION

Figure 1:
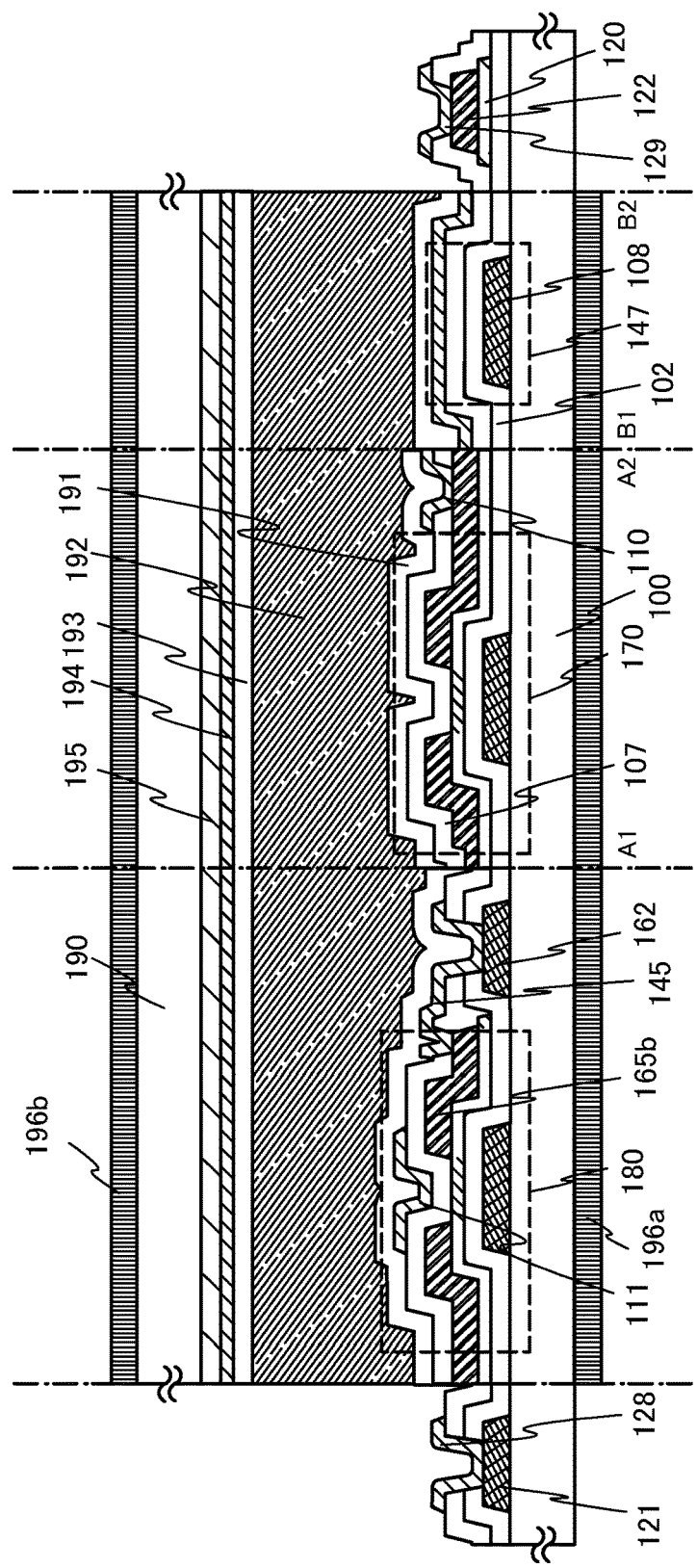
FIG. 1 is a diagram illustrating a semiconductor device.

Embodiments of the present invention will be described in detail with reference to the accompanying drawings. Note that the present invention is not limited to the following description, and it is easily understood by those skilled in the art that various changes may be made in modes and details without departing from the spirit and the scope of the present invention. Therefore, the present invention should not be construed as being limited to the description in the following embodiments. Note that in the structures described below, the same portions or portions having similar functions are denoted by the same reference numerals in different drawings, and explanation thereof will not be repeated.

Embodiment 1

A manufacturing process of a semiconductor device including a thin film transistor will be described with reference to FIG. 1, FIGS. 2A to 2C, FIGS. 3A and 3B, FIGS. 4A to 4C, and FIG. 5.

A liquid crystal display device as a semiconductor device which is one embodiment of the present invention is illustrated in FIG. 1. In the liquid crystal display device in FIG. 1, a substrate 100 which is provided with a pixel portion including a thin film transistor 170 and a capacitor 147, a driver circuit portion including a thin film transistor 180, a pixel electrode layer 110, and an insulating layer 191 serving as an alignment film, and a substrate 190 which is provided with an insulating layer 193 serving as an alignment film, a counter electrode layer 194, and a coloring layer 195 serving as a color filter face each other with a liquid crystal layer 192 positioned between the substrates. The substrate 100 is provided with a polarizing plate (a layer including a polarizer, also simply referred to as a polarizer) 196a on the side opposite to the liquid crystal layer 192, and the substrate 190 is provided with a polarizing plate 196b on the side opposite to the liquid crystal layer 192. A first terminal 121 and a terminal electrode 128 for connection are provided in a terminal portion for a gate wiring, and a second terminal 122 and a terminal electrode 129 for connection are provided in a terminal portion for a source wiring.

The second terminal 122 is stacked over an oxide semiconductor layer 120. The second terminal 122 and the oxide semiconductor layer 120 are formed by a photolithography step in which a resist mask formed using a multi-tone mask is used.

In the thin film transistor 180 of the driver circuit portion, a conductive layer 111 is provided over a gate electrode layer and a semiconductor layer, and a drain electrode layer 165b is electrically connected to a conductive layer 162 which is formed in the same step as the gate electrode layer through a wiring layer 145. In the pixel portion, a drain electrode layer of the thin film transistor 170 is electrically connected to the pixel electrode layer 110.

In manufacture of the thin film transistors 170 and 180, etching is performed with use of a mask layer formed using a multi-tone mask which is a light-exposure mask and through which light is transmitted so as to have a plurality of intensities. Therefore, an oxide semiconductor layer 103 has a shape whose end portions are covered with neither a source electrode layer 105a nor a drain electrode layer 105b and are exposed, and an oxide semiconductor layer 163 has a shape whose end portions are covered with neither a source electrode layer 165a nor the drain electrode layer 165b and are exposed. Note that the exposed end portions of the oxide semiconductor layer 103 are in contact with an oxide insulating layer 107; similarly, the exposed end portions of the oxide semiconductor layer 163 are in contact with the oxide insulating layer 107. When the oxide semiconductor layers 103 and 163 each have such exposed end portions, the coverage with the oxide insulating layer 107 stacked thereover is favorable.

Hereinafter, a manufacturing method will be described with reference to FIGS. 2A to 2C, FIGS. 3A and 3B, FIGS. 4A to 4C, and FIG. 5. FIG. 5 is a plan view of the pixel portion of the liquid crystal display device, and FIG. 1, FIGS. 2A to 2C, FIGS. 3A and 3B, and FIGS. 4A to 4C correspond to cross-sectional views taken along lines A1-A2 and B1-B2 of FIG. 5.

A conductive layer is formed over the entire surface of the substrate 100 having an insulating surface, and then a first photolithography step is performed. A resist mask is formed, and unnecessary portions are removed by etching, so that wirings and electrodes (a gate electrode layer 101, a gate electrode layer 161, the conductive layer 162, a capacitor wiring layer 108, and the first terminal 121) are formed. Etching is preferably performed so that end portions of the wirings and electrodes have tapered shapes as illustrated in FIG. 2A, because coverage with a film stacked thereover can be improved. Note that the gate electrode layer 101 and the gate electrode layer 161 are included in the gate wiring.

Although there is no particular limitation on a substrate that can be used as the substrate 100 having an insulating surface, it is necessary that the substrate 100 having an insulating surface have at least enough heat resistance to heat treatment to be performed later. A glass substrate can be used as the substrate 100 having an insulating surface.

As the glass substrate, the one whose strain point is 730° C. or higher may be used in the case where the temperature of the heat treatment to be performed later is high. As a material of the glass substrate, a glass material such as aluminosilicate glass, aluminoborosilicate glass, or barium borosilicate glass is used. Note that by containing a larger amount of barium oxide (BaO) than boric acid, a glass substrate is heat-resistant and of more practical use. Therefore, it is preferable that a glass substrate containing more BaO than $B_2O_3$ be used.

Note that a substrate formed of an insulator such as a ceramic substrate, a quartz substrate, or a sapphire substrate may be used instead of the above glass substrate. Alternatively, crystallized glass or the like may be used. Since the liquid crystal display device described in this embodiment is a transmissive liquid crystal display device, a light-transmitting substrate is used as the substrate 100; however, in the case where a reflective liquid crystal display device is formed, a non-light-transmitting substrate such as a metal substrate may be used as the substrate 100.

An insulating film serving as a base film may be provided between the substrate 100, and the gate electrode layer 101, the gate electrode layer 161, the conductive layer 162, the capacitor wiring layer 108, and the first terminal 121. The base film has a function of preventing diffusion of an impurity element from the substrate 100, and can be formed to have a single-layer structure or a stacked-layer structure of a silicon nitride film, a silicon oxide film, a silicon nitride oxide film, or a silicon oxynitride film.

The gate electrode layer 101, the gate electrode layer 161, the conductive layer 162, the capacitor wiring layer 108, and the first terminal 121 can be formed to have a single-layer structure or a stacked-layer structure using a metal material such as molybdenum, titanium, chromium, tantalum, tungsten, aluminum, copper, neodymium, or scandium or an alloy material containing any of these materials as its main component.

For example, as a two-layer structure of the gate electrode layer 101, the gate electrode layer 161, the conductive layer 162, the capacitor wiring layer 108, and the first terminal 121, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. Alternatively, a three-layer structure in which a tungsten layer or a tungsten nitride layer, an aluminum-silicon alloy layer or an aluminum-titanium alloy layer, and a titanium nitride layer or a titanium layer are stacked is preferable.

Next, a gate insulating layer 102 is formed over the gate electrode layer 101, the gate electrode layer 161, the conductive layer 162, the capacitor wiring layer 108, and the first terminal 121.

The gate insulating layer 102 can be formed to have a single-layer structure or a stacked-layer structure of a silicon oxide layer, a silicon nitride layer, a silicon oxynitride layer, a silicon nitride oxide layer, or an aluminum oxide layer by a plasma CVD method, a sputtering method, or the like. For example, a silicon oxynitride layer may be formed by a plasma CVD method using $SiH_4$, oxygen, and nitrogen as a film formation gas. The thickness of the gate insulating layer 102 is set to greater than or equal to 100 nm and less than or equal to 500 nm. In the case where the gate insulating layer 102 has a stacked-layer structure, stacked layers including a first gate insulating layer having a thickness of greater than or equal to 50 nm and less than or equal to 200 nm and a second gate insulating layer having a thickness of greater than or equal to 5 nm and less than or equal to 300 nm over the first gate insulating layer are employed.

In this embodiment, a silicon nitride layer having a thickness of 200 nm or less which is formed by a plasma CVD method is used as the gate insulating layer 102.

Next, an oxide semiconductor layer 130 is formed over the gate insulating layer 102.

Note that before the oxide semiconductor layer is formed by a sputtering method, dust on a surface of the gate insulating layer 102 is preferably removed by reverse sputtering in which an argon gas is introduced and plasma is generated. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

Next, the oxide semiconductor layer 130 having a thickness of greater than or equal to 2 nm and less than or equal to 200 nm is formed over the gate insulating layer 102 (see FIG. 2A). In order that the oxide semiconductor layer 130 may be amorphous even through heat treatment for dehydration or dehydrogenation after formation of the oxide semiconductor layer 130, the oxide semiconductor layer 130 preferably has a small thickness of 50 nm or less. When the oxide semiconductor layer is formed to have a small thickness, crystallization of the oxide semiconductor layer can be suppressed even through heat treatment which is performed after the oxide semiconductor layer is formed.

The oxide semiconductor layer 130 is formed using an In—Ga—Zn—O-based non-single-crystal layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, an In—Ga—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, the oxide semiconductor layer 130 is formed by a sputtering method with the use of an In—Ga—Zn—O-based oxide semiconductor target. Further, the oxide semiconductor layer 130 can be formed by a sputtering method in a rare gas (typically argon) atmosphere, an oxygen atmosphere, or an atmosphere of a rare gas (typically argon) and oxygen. In the case of using a sputtering method, deposition is performed with the use of a target containing $SiO_2$ at greater than or equal to 2 wt % and less than or equal to 10 wt %, so that $SiO_x$ (x>0) which hinders crystallization is contained in the oxide semiconductor layer 130. Thus, it is preferable that the oxide semiconductor layer 130 be prevented from being crystallized in heat treatment for dehydration or dehydrogenation performed later.

Here, the oxide semiconductor layer is formed in an atmosphere of argon and oxygen (argon:oxygen=30 sccm:20 sccm and the oxygen flow ratio is 40%), with the use of an oxide semiconductor target containing In, Ga, and Zn ($In_2O_3$:$Ga_2O_3$:ZnO=1:1:1 [molar ratio] and In:Ga:Zn=1:1:0.5 [atomic ratio]), under conditions as follows: the distance between the substrate and the target is 100 mm; the pressure is 0.2 Pa; and the direct current (DC) power source is 0.5 kW. Note that a pulse direct current (DC) power source is preferable because dust can be reduced and the film thickness can be uniform. The In—Ga—Zn—O-based non-single-crystal film is formed to a thickness of greater than or equal to 5 nm and less than or equal to 200 nm. In this embodiment, as the oxide semiconductor layer, a 20-nm-thick In—Ga—Zn—O-based non-single-crystal film is formed by a sputtering method with the use of an In—Ga—Zn—O-based oxide semiconductor target.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, and films of plural kinds of materials can be deposited by electric discharge at the same time in the same chamber.

In addition, there are also a sputtering apparatus provided with a magnet system inside the chamber and used for a magnetron sputtering method, and a sputtering apparatus used for an ECR sputtering method in which plasma generated with the use of microwaves is used without using glow discharge.

In addition, as a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

A resist pattern may be directly formed over the gate insulating layer, and then a contact hole may be formed. In that case, after the resist is removed, heat treatment is preferably performed for dehydration, dehydrogenation, or dehydroxylation of the surface of the gate insulating layer. For example, impurities such as hydrogen and water included in the gate insulating layer may be removed by heat treatment (at higher than or equal to 400° C. and less than the strain point of the substrate) under an inert gas (nitrogen, helium, neon, or argon) atmosphere or an oxygen atmosphere.

Next, dehydration or dehydrogenation is performed on the oxide semiconductor layer 130, so that an oxide semiconductor layer 131 which is dehydrated or dehydrogenated is formed (see FIG. 2B). The temperature of first heat treatment in which dehydration or dehydrogenation is performed is higher than or equal to 400° C. and lower than the strain point of the substrate, preferably 425° C. or higher. Note that in the case where the temperature of the first heat treatment is 425° C. or higher, the heat treatment time may be one hour or less; while in the case where the temperature of the first heat treatment is lower than 425° C., the heat treatment time is set to more than one hour. Here, the substrate is introduced into an electric furnace which is one example of a heat treatment apparatus, and the oxide semiconductor layer 130 is subjected to heat treatment under a nitrogen atmosphere. Then, the oxide semiconductor layer is not exposed to air, and water and hydrogen can be prevented from being contained again in the oxide semiconductor layer. In this manner, the oxide semiconductor layer 131 is formed. In this embodiment, slow cooling is performed from a heating temperature T at which the dehydration or dehydrogenation is performed on the oxide semiconductor layer 130 to such a temperature that water is not contained again, specifically, to a temperature that is lower than the heating temperature T by 100° C. or more, with use of one electric furnace under a nitrogen atmosphere. The dehydration or dehydrogenation may be performed under a rare gas (e.g., helium, neon, or argon) atmosphere or reduced pressure instead of a nitrogen atmosphere.

When the oxide semiconductor layer 130 is subjected to heat treatment at 400° C. to 700° C., the dehydration or dehydrogenation of the oxide semiconductor layer 130 can be achieved; thus, water ($H_2O$) can be prevented from being contained in the oxide semiconductor layer again later.

Note that in the first heat treatment, it is preferable that water, hydrogen, and the like be not contained in nitrogen or a rare gas such as helium, neon, or argon. In particular, the heat treatment which is performed on the oxide semiconductor layer 130 for dehydration or dehydrogenation at 400° C. to 700° C. is preferably performed in a nitrogen atmosphere in which the concentration of water ($H_2O$) is 20 ppm or lower. Alternatively, it is preferable that nitrogen or a rare gas such as helium, neon, or argon introduced into an apparatus for heat treatment have a purity of 6N (99.9999%) or more, more preferably, 7N (99.99999%) or more; that is, an impurity concentration is preferably set to 1 ppm or lower, more preferably, 0.1 ppm or lower.

Depending on conditions of the first heat treatment and the material of the oxide semiconductor layer, the oxide semiconductor layer may crystallize to be a microcrystalline film or a polycrystalline film.

The heat treatment for dehydration or dehydrogenation of the oxide semiconductor layer may be performed at any of the following timings: after the oxide semiconductor layer is formed; after a source electrode layer and a drain electrode layer are formed over the oxide semiconductor layer; and after a passivation film is formed over the source electrode layer and the drain electrode layer.

Next, a metal conductive layer 137 is formed using a metal material over the oxide semiconductor layer 131 by a sputtering method or a vacuum evaporation method (see FIG. 2C).

As a material for the metal conductive layer 137, an element selected from Al, Cr, Cu, Ta, Ti, Mo, or W; an alloy containing any of these elements as a component; an alloy film containing any of these elements in combination; and the like can be given. The metal conductive layer may have a single-layer structure or a stacked-layer structure of two or more layers. For example, a single-layer structure of an aluminum film containing silicon; a two-layer structure of an aluminum film and a titanium film stacked thereover; a three-layer structure of a Ti film, an aluminum film stacked thereover, and a Ti film stacked thereover; and the like can be given. Alternatively, an alloy film containing aluminum and one or more elements selected from titanium (Ti), tantalum (Ta), tungsten (W), molybdenum (Mo), chromium (Cr), neodymium (Nd), or scandium (Sc), or a nitride film containing any of these elements may be used.

If heat treatment is performed after formation of the metal conductive layer 137, the metal conductive layer 137 preferably has heat resistance enough to withstand the heat treatment.

A second photolithography step is performed. Resist masks 135a, 135b, and 135c are formed over the gate insulating layer 102, the oxide semiconductor layer 131, and the metal conductive layer 137.

In this embodiment, an example in which light exposure using a high-tone mask is performed for forming the resist masks 135a, 135b, and 135c is described. A resist is formed in order to form the resist masks 135a, 135b, and 135c. As the resist, a positive resist or a negative resist can be used.

A positive resist is employed here. The resist may be formed by a spin coating method or may be selectively formed by an inkjet method. When the resist is selectively formed by an inkjet method, a resist can be prevented from being formed in an unintended portion, which results in reducing waste of the material.

Next, the resist is irradiated with light with use of a multi-tone mask 81a or a multi-tone mask 81b as a light-exposure mask, and the resist is exposed to the light.

Here, light exposure using the multi-tone masks 81a and 81b is described with reference to FIGS. 9A to 9D.

A multi-tone mask can achieve three levels of light exposure: an exposed portion, a half-exposed portion, and an unexposed portion. A multi-tone mask is a mask through which light is transmitted to have a plurality of intensities. One-time light exposure and development process can form a resist mask with regions of plural thicknesses (typically, two kinds of thicknesses). Accordingly, with the use of a multi-tone mask, the number of light-exposure masks can be reduced.

Figure 9A:
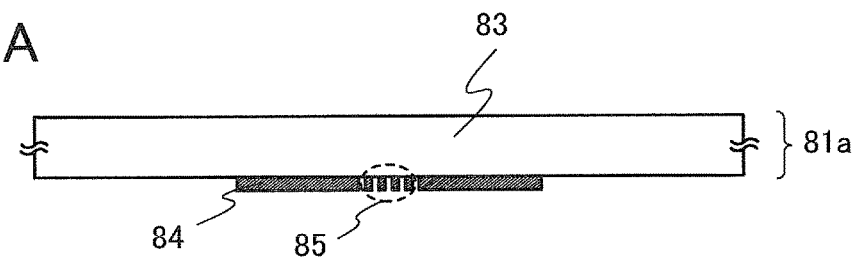
FIGS. 9A to 9D are diagrams illustrating multi-tone masks.
Figure 9B:
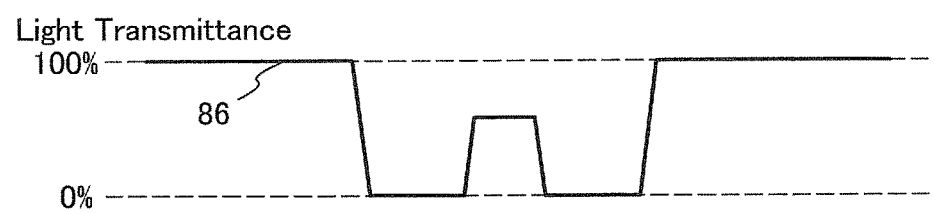
Figure 9C:
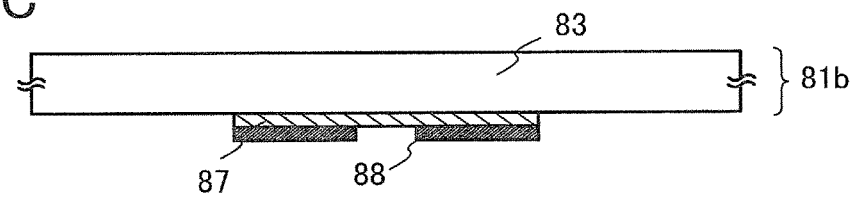

Typical examples of the multi-tone mask include a gray-tone mask 81a illustrated in FIG. 9A and a half-tone mask 81b illustrated in FIG. 9C.

As illustrated in FIG. 9A, the gray-tone mask 81a includes a light-transmitting substrate 83, and a light-blocking portion 84 and a diffraction grating 85 which are formed on the light-transmitting substrate 83. The light transmittance of the light-blocking portion 84 is 0%. On the other hand, the diffraction grating 85 has a light-transmitting portion in a slit form, a dot form, a mesh form, or the like with intervals less than or equal to the resolution limit of light used for the exposure; thus, the light transmittance can be controlled. Note that the diffraction grating 85 can be in a slit form, a dot form, or a mesh form with regular intervals; or in a slit form, a dot form, or a mesh form with irregular intervals.

As the light-transmitting substrate 83, a light-transmitting substrate such as a quartz substrate can be used. The light-blocking portion 84 and the diffraction grating 85 can be formed using a light-blocking material such as chromium or chromium oxide, which absorbs light.

When the gray-tone mask 81a is irradiated with light for exposure, a light transmittance 86 of the light-blocking portion 84 is 0% and that of a region where neither the light-blocking portion 84 nor the diffraction grating 85 is provided is 100%, as illustrated in FIG. 9B. The light transmittance of the diffraction grating 85 can be controlled in a range of 10% to 70%. The light transmittance of the diffraction grating 85 can be controlled with an interval or a pitch of slits, dots, or meshes of the diffraction grating 85.

As illustrated in FIG. 9C, the half-tone mask 81b includes the light-transmitting substrate 83 provided with a semi-light-transmitting portion 87 and a light-blocking portion 88. The semi-light-transmitting portion 87 can be formed using MoSiN, MoSi, MoSiO, MoSiON, CrSi, or the like. The light-blocking portion 88 can be formed using a light-blocking material such as chromium or chromium oxide, which absorbs light.

Figure 9D:
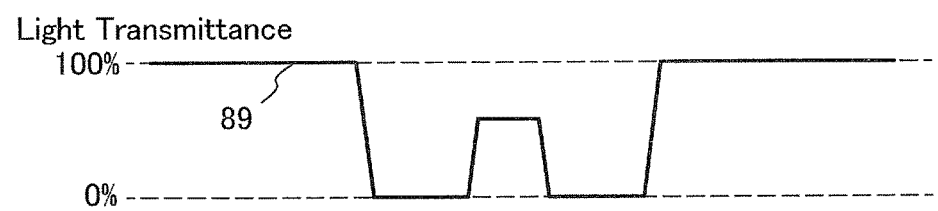

When the half-tone mask 81b is irradiated with light for exposure, a light transmittance 89 of the light-blocking portion 88 is 0% and that of a region where neither the light-blocking portion 88 nor the semi-light-transmitting portion 87 is provided is 100%, as illustrated in FIG. 9D. The light transmittance of the semi-light-transmitting portion 87 can be controlled within a range of 10% to 70%. The light transmittance of the semi-light-transmitting portion 87 can be controlled with the material of the semi-light-transmitting portion 87.

Figure 3:
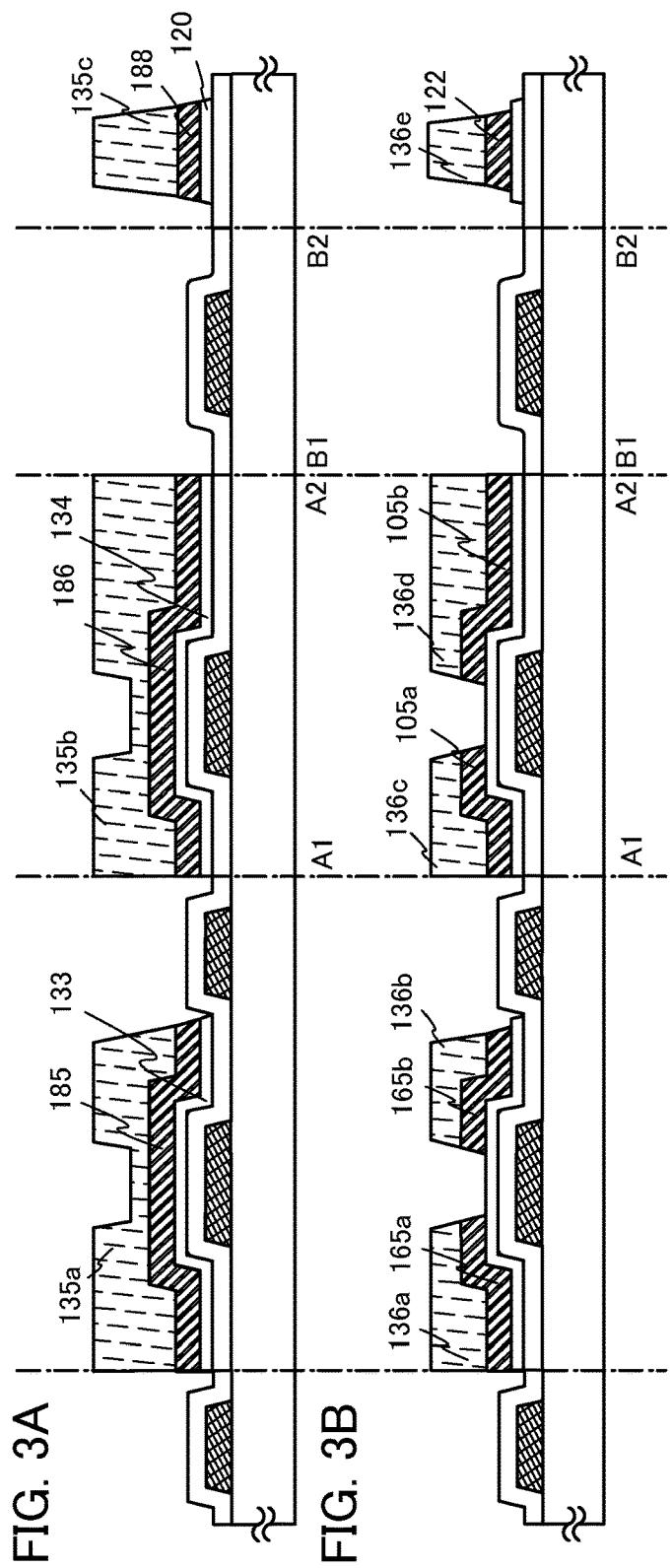
FIGS. 3A and 3B are diagrams illustrating a method for manufacturing a semiconductor device.

After the light exposure using the multi-tone is performed, development is carried out, whereby the resist masks 135a, 135b, and 135c each having regions with different thicknesses can be formed, as illustrated in FIG. 3A.

Next, a first etching step is performed using the resist masks 135a, 135b, and 135c. The oxide semiconductor layer 131 and the metal conductive layer 137 are etched into island shapes. As a result, oxide semiconductor layers 133 and 134, the oxide semiconductor layer 120, and metal conductive layers 185, 186, and 188 can be formed (see FIG. 3A).

Next, ashing is conducted on the resist masks 135a, 135b, and 135c. As a result, the areas (three-dimensionally, the volumes) of the resist masks are decreased and the thicknesses thereof are reduced. At this time, the resist of the resist mask in a region with a small thickness (a region overlapping with part of the gate electrode layer 161) is removed, so that resist masks 136a and 136b which are separated from each other can be formed. Similarly, the ashing is also conducted on the resist masks 135b and 135c; thus, the areas (three-dimensionally, the volumes) of the resist masks are decreased. Accordingly, resist masks 136c, 136d, and 136e can be formed.

Unnecessary portions are removed by etching with use of the resist masks 136a, 136b, 136c, 136d, and 136e, so that the source electrode layer 165a, the drain electrode layer 165b, the source electrode layer 105a, the drain electrode layer 105b, and the second terminal 122 are formed (see FIG. 3B).

Materials of the layers and etching conditions are adjusted as appropriate so that the oxide semiconductor layers 133 and 134 are not removed in etching of the metal conductive layer.

In this embodiment, a Ti film is used as the metal conductive layer; an In—Ga—Zn—O-based oxide is used for the oxide semiconductor layers 133 and 134; and an ammonia hydrogen peroxide solution (a mixed solution of ammonia, water, and a hydrogen peroxide solution) is used as an etchant.

In the second photolithography step, the second terminal 122 which is formed from the same material as the oxide semiconductor layer 120, the source electrode layers 105a and 165a, and the drain electrode layers 105a and 165b is formed in the terminal portion. Note that the second terminal 122 is electrically connected to the source wiring (the source wiring including the source electrode layers 105a and 165a).

Note that the etching of the metal conductive layer, the oxide semiconductor layer, and the insulating film may be dry etching, without being limited to wet etching.

As an etching gas used for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the films into desired shapes, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a mixed solution of phosphoric acid, acetic acid, and nitric acid, an ammonia peroxide mixture (hydrogen peroxide:ammonia:water=5:2:2), or the like can be used. In addition, ITO-07N (produced by KANTO CHEMICAL CO., INC.) may also be used.

The etchant used in the wet etching is removed by cleaning together with the material which is etched off. Waste liquid of the etchant containing the removed material may be purified and the material contained in the waste liquid may be reused. When a material such as indium contained in the oxide semiconductor layer is collected from the waste liquid after the etching and reused, the resources can be efficiently used and the cost can be reduced.

In order to etch the films into desired shapes, etching conditions (e.g., etchant, etching time, temperature, or the like) are controlled as appropriate depending on the material.

Next, the resist masks 136a, 136b, 136c, 136d, and 136e are removed, and the oxide insulating layer 107 serving as a protective insulating layer in contact with the oxide semiconductor layers 133 and 134 is formed.

In each of the oxide semiconductor layers 133 and 134, a region in contact with the oxide insulating layer is formed at this stage. In these regions, portions which are in contact with the oxide insulating layer 107 and overlap with the gate electrode layer and the gate insulating layer serve as channel formation regions.

The oxide insulating layer 107 is formed to a thickness of at least 1 nm or more and can be formed using a method by which impurities such as water and hydrogen are prevented from entering the oxide insulating layer 107, for example, by a sputtering method, as appropriate. In this embodiment, a silicon oxide film is formed to a thickness of 300 nm as the oxide insulating layer 107 by a sputtering method. The substrate temperature in film formation may be from room temperature to 300° C. or lower and in this embodiment, is room temperature. The formation of the silicon oxide film by a sputtering method can be performed under a rare gas (typically, argon) atmosphere, an oxygen atmosphere, or an atmosphere of a rare gas (typically, argon) and oxygen. As a target, a silicon oxide target or a silicon target can be used. For example, with use of a silicon target, a silicon oxide film can be formed by a sputtering method under an oxygen atmosphere. Note that as the oxide insulating layer formed in contact with the oxide semiconductor layer which is to have low resistance later, an inorganic insulating film which does not contain impurities such as moisture, hydrogen ions, and OH⁻ and which blocks entry of these from the outside is used. Typically, a silicon oxide film, a silicon nitride oxide film, a gallium oxide film, an aluminum oxide film, an aluminum oxynitride film, or the like is used.

Figure 4:
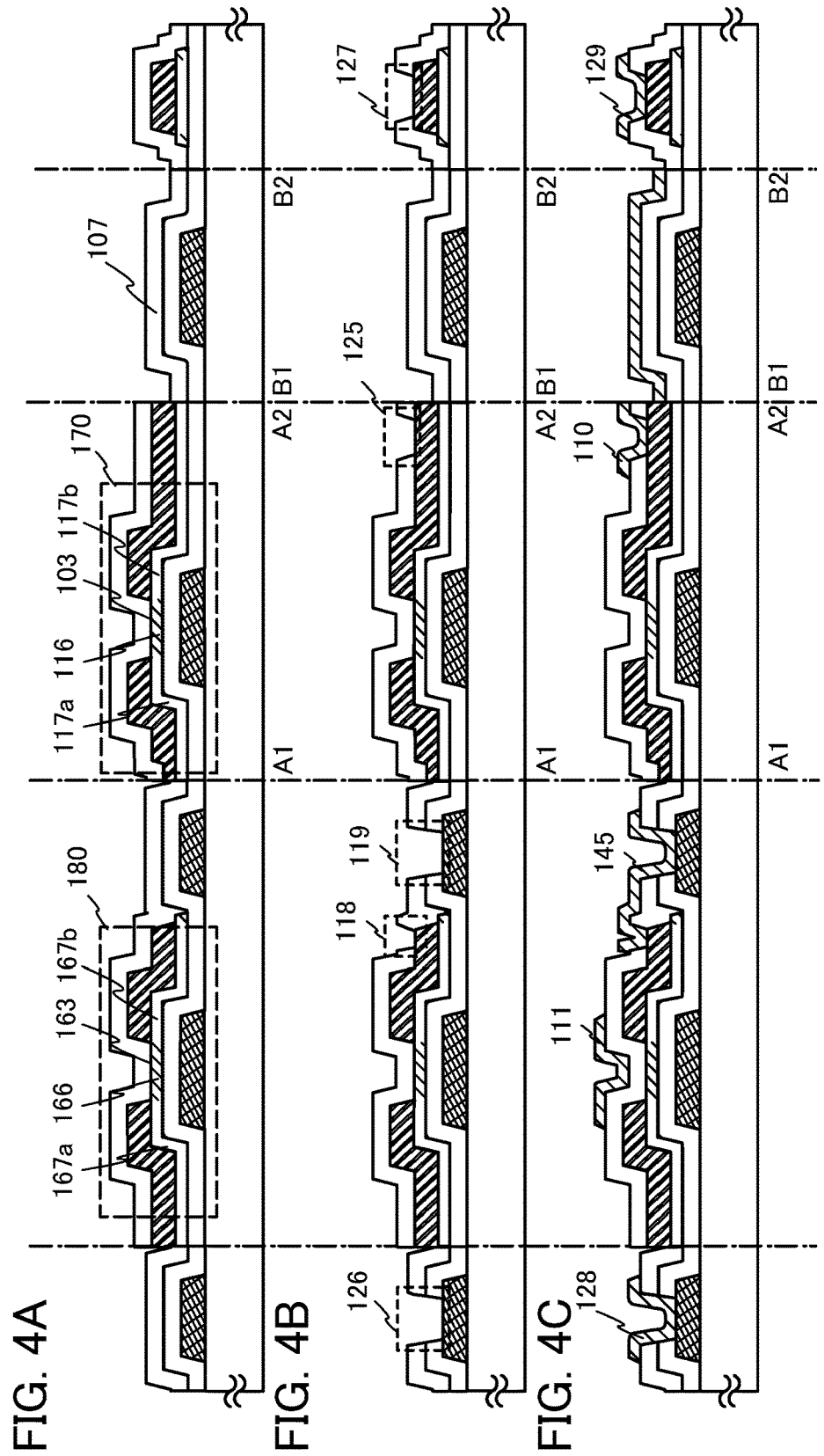
FIGS. 4A to 4C are diagrams illustrating a method for manufacturing a semiconductor device.
Figure 5:
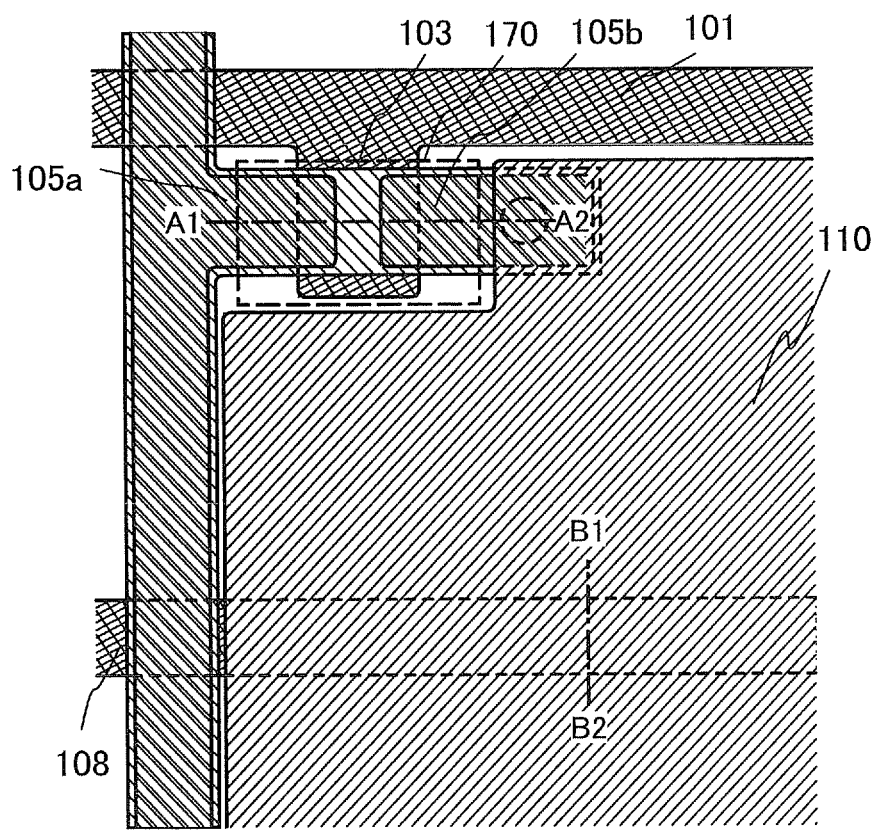
FIG. 5 is a diagram illustrating a semiconductor device.

Next, second heat treatment (preferably at higher than or equal to 200° C. and lower than or equal to 400° C., for example, higher than or equal to 250° C. and lower than or equal to 350° C.) is performed in an inert gas atmosphere or a nitrogen gas atmosphere (see FIG. 4A). For example, second heat treatment is performed at 250° C. for one hour in a nitrogen atmosphere. By the second heat treatment, part of the oxide semiconductor layers 133 and 134 which overlaps with the oxide insulating layer 107 is heated in the state of being in contact with the oxide insulating layer 107.

Through the above steps, heat treatment for dehydration or dehydrogenation is performed on the oxide semiconductor layers after deposition to reduce the resistance, and then, part of the oxide semiconductor layers is selectively made to be in an oxygen-excess state.

As a result, in the oxide semiconductor layer 133, a channel formation region 166 overlapping with the gate electrode layer 161 has i-type conductivity, and a high-resistance source region 167a overlapping with the source electrode layer 165a and a high-resistance drain region 167b overlapping with the drain electrode layer 165b are formed in a self-aligned manner; thus, the oxide semiconductor layer 163 is formed. Similarly, in the oxide semiconductor layer 134, a channel formation region 116 overlapping with the gate electrode layer 101 has i-type conductivity, and a high-resistance source region 117a overlapping with the source electrode layer 105a and a high-resistance drain region 117b overlapping with the drain electrode layer 105b are formed in a self-aligned manner; thus, the oxide semiconductor layer 103 is formed.

By formation of the high-resistance drain regions 117b and 167b (or the high-resistance source regions 117a and 167a) in the oxide semiconductor layers 103 and 163 which overlap with the drain electrode layers 105b and 165b (and the source electrode layers 105a and 165a), respectively, reliability in a formed circuit can be improved. Specifically, by formation of the high-resistance drain region 117b, a structure can be employed in which conductivity is gradually changed from the drain electrode layer 105b to the channel formation region 116 through the high-resistance drain region 117b; similarly, by formation of the high-resistance drain region 167b, a structure can be employed in which conductivity is gradually changed from the drain electrode layer 165b to the channel formation region 166 through the high-resistance drain region 167b. Therefore, when the transistors operate in the state of being connected to a wiring which supplies the drain electrode layers 105b and 165b with a high power source potential VDD, the high-resistance drain regions serve as buffers so that a local high electric field is not applied even when a high electric field is applied between the gate electrode layer 101 and the drain electrode layer 105b and between the gate electrode layer 161 and the drain electrode layer 165b; in this manner, the transistors each can have a structure with an increased withstand voltage.

In addition, by formation of the high-resistance drain regions 117b and 167b (or the high-resistance source regions 117a and 167a) in the oxide semiconductor layers 103 and 163 which overlap with the drain electrode layers 105b and 165b (and the source electrode layers 105a and 165a), respectively, leakage current in the channel formation regions 116 and 166 which may flow in a formed circuit can be reduced.

In this embodiment, after a silicon oxide film is formed by a sputtering method as the oxide insulating layer 107, heat treatment is performed at 250° C. to 350° C., whereby oxygen enters each of the oxide semiconductor layers from the exposed portion (the channel formation region) of the oxide semiconductor layer between the source region and the drain region, and is diffused thereinto. By formation of the silicon oxide film by a sputtering method, an excessive amount of oxygen can be contained in the silicon oxide film, and oxygen can enter the oxide semiconductor layer and can be diffused thereinto through the heat treatment. Oxygen enters the oxide semiconductor layer and is diffused thereinto, whereby the channel region can have higher resistance (i.e., the channel region can have i-type conductivity). Thus, the thin film transistors can serve as normally-off transistors.

Through the above steps, the thin film transistors 170 and 180 can be manufactured in the pixel portion and the driver circuit portion, respectively, over the same substrate. Each of the thin film transistors 170 and 180 is a bottom-gate thin film transistor including an oxide semiconductor layer in which a high-resistance source region, a high-resistance drain region, and a channel formation region are formed. Therefore, in each of the thin film transistors 170 and 180, the high-resistance drain region or the high-resistance source region serves as a buffer so that a local high electric field is not applied even when a high electric field is applied; in this manner, the thin film transistors 170 and 180 can each have a structure with an increased withstand voltage.

By formation of the driver circuit and the pixel portion over the same substrate, a connection wiring between the driver circuit and an external signal can be shortened; thus, reduction in size and cost of the semiconductor device can be realized.

A protective insulating layer may be additionally formed over the oxide insulating layer 107. For example, a silicon nitride film is formed by an RF sputtering method. The RF sputtering method is preferable as a formation method of the protective insulating layer because it achieves high mass productivity. The protective insulating layer is formed using an inorganic insulating film which does not contain impurities such as moisture, hydrogen ions, and OH⁻ and blocks entry of these from the outside. Typically, a silicon nitride film, an aluminum nitride film, a silicon nitride oxide film, an aluminum oxynitride film, or the like is used.

Next, a third photolithography step is performed. A resist mask is formed, and the oxide insulating layer 107 is etched, so that a contact hole 125 reaching the drain electrode layer 105*b*, a contact hole 118 reaching the drain electrode layer 165*b*, and a contact hole 119 reaching the conductive layer 162 are formed. Then, the resist mask is removed (see FIG. 4B). In addition, by this etching, a contact hole 127 reaching the second terminal 122 and a contact hole 126 reaching the first terminal 121 are also formed. Note that the resist mask for forming the contact holes may be formed by an inkjet method. When the resist mask is formed by an inkjet method, a photomask is not used; thus, the manufacturing cost can be reduced.

Next, a conductive film having a light-transmitting property is formed. The conductive film having a light-transmitting property is formed using indium oxide ($In_2O_3$), an indium oxide-tin oxide alloy ($In_2O_3$—$SnO_2$, abbreviated as ITO), or the like by a sputtering method, a vacuum evaporation method, or the like. Alternatively, the conductive film having a light-transmitting property may be formed using an Al—Zn—O-based non-single-crystal film containing nitrogen (i.e., an Al—Zn—O—N-based non-single-crystal film), a Zn—O—N-based non-single-crystal film containing nitrogen, or a Sn—Zn—O—N-based non-single-crystal film containing nitrogen. Note that the proportion (atomic %) of zinc in the Al—Zn—O—N-based non-single-crystal film is 47 atomic % or less, and is larger than that of aluminum in the Al—Zn—O—N-based non-single-crystal film. The proportion (atomic %) of aluminum in the Al—Zn—O—N-based non-single-crystal film is larger than that of nitrogen in the Al—Zn—O—N-based non-single-crystal film. Etching treatment of such a material is performed with a hydrochloric acid based solution. However, since a residue is easily generated particularly in etching of ITO, indium oxide-zinc oxide alloy ($In_2O_3$—ZnO) may be used to improve etching processability.

Note that the unit of the proportion of the conductive film having a light-transmitting property is atomic %, and the proportion is evaluated by analysis using an electron probe X-ray microanalyzer (EPMA).

Next, a fourth photolithography step is performed. A resist mask is formed, and unnecessary portions are removed by etching, so that the pixel electrode layer 110, the conductive layer 111, the wiring layer 145, and the terminal electrodes 128 and 129 are formed. Then, the resist mask is removed. FIG. 4C illustrates a cross-sectional view at this stage. Note that FIG. 5 is a plan view at this stage.

In the fourth photolithography step, a storage capacitor is formed with the capacitor wiring layer 108 and the pixel electrode layer 110, in which the gate insulating layer 102 and the oxide insulating layer 107 in the capacitor portion are used as a dielectric.

The capacitor 147, which is a storage capacitor including the gate insulating layer 102 as a dielectric, the capacitor wiring layer, and the capacitor electrode, can also be formed over the same substrate as the driver circuit portion and the pixel portion. Instead of providing the capacitor wiring, the pixel electrode may be overlapped with a gate wiring of an adjacent pixel with the protective insulating layer and the gate insulating layer interposed therebetween, so that a storage capacitor is formed.

The terminal electrodes 128 and 129 which are formed in the terminal portions function as electrodes or wirings connected to an FPC. The terminal electrode 128 formed over the first terminal 121 serves as a connection terminal electrode which functions as an input terminal for the gate wiring. The terminal electrode 129 formed over the second terminal 122 serves as a connection terminal electrode which functions as an input terminal for the source wiring.

Figure 2:
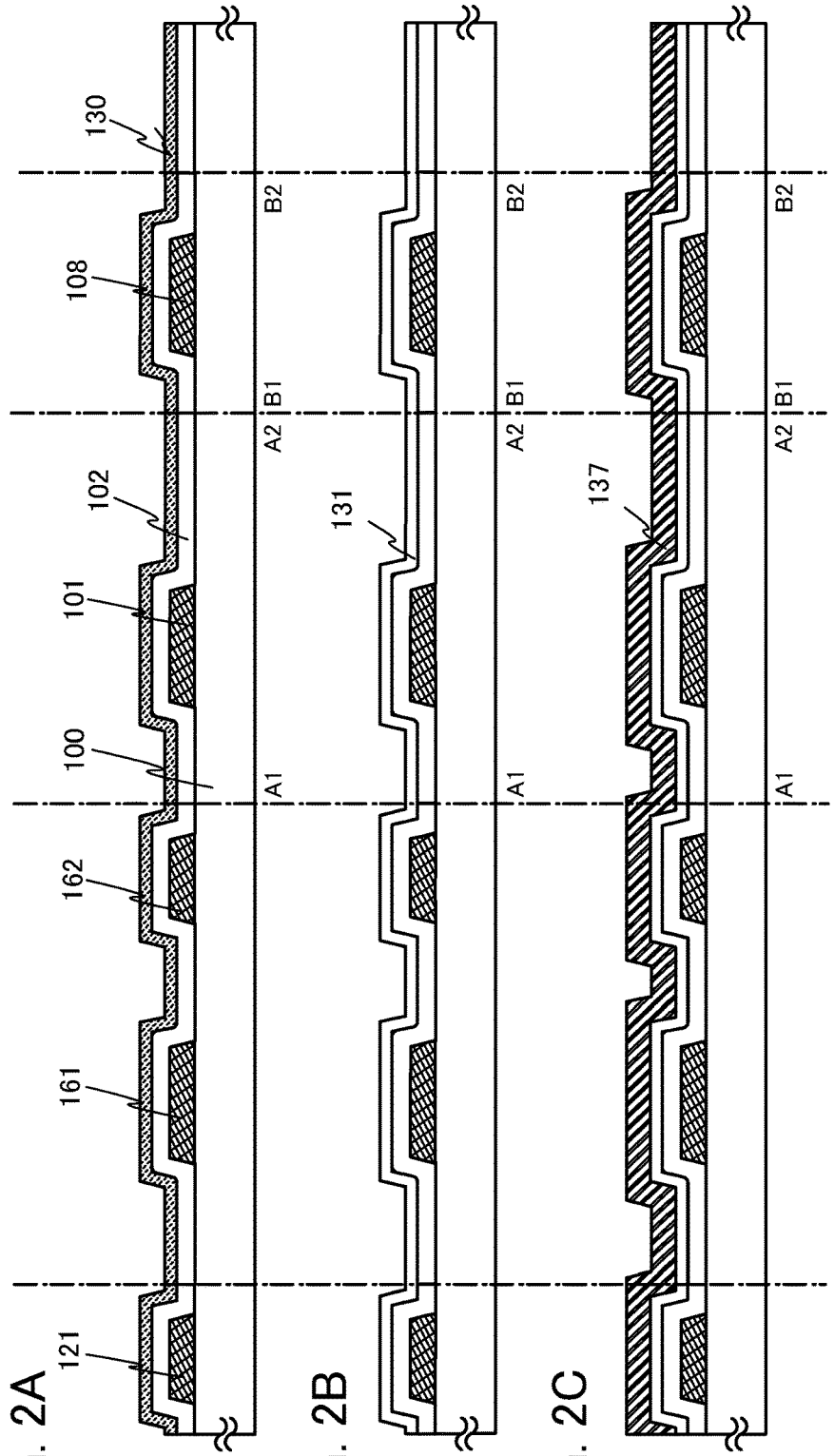

Further, FIGS. 11A1 and 11A2 are a cross-sectional view of a gate wiring terminal portion at this stage and a top view thereof, respectively. FIG. 11A1 is a cross-sectional view taken along line C1-C2 of FIG. 11A2. In FIG. 11A1, a conductive film 155 formed over a protective insulating layer 154 is a connection terminal electrode serving as an input terminal. Furthermore, in FIG. 11A1, in the terminal portion, a first terminal 151 formed from the same material as the gate wiring and a connection electrode 153 formed from the same material as the source wiring are electrically connected through an oxide semiconductor layer 157 in a contact hole provided in a gate insulating layer 152. In addition, the connection electrode 153 and the conductive film 155 are in direct contact with each other in a contact hole provided in the protective insulating layer and are electrically connected.

Further, FIGS. 11B1 and 11B2 are a cross-sectional view of a source wiring terminal portion and a top view thereof, respectively. FIG. 11B1 is a cross-sectional view taken along line D1-D2 of FIG. 11B2. In FIG. 11B1, the conductive film 155 formed over the protective insulating layer 154 is a connection terminal electrode serving as an input terminal. In FIG. 11B1, in the terminal portion, an electrode 156 formed from the same material as the gate wiring is located below and overlapped with a second terminal 150 electrically connected to the source wiring with the gate insulating layer 152 interposed therebetween. The electrode 156 is not electrically connected to the second terminal 150. When the electrode 156 is set to, for example, floating, GND, or 0 V such that the potential of the electrode 156 is different from the potential of the second terminal 150, a capacitor for preventing noise or static electricity can be formed. The second terminal 150 is electrically connected to the conductive film 155 through the protective insulating layer 154. An oxide semiconductor layer 158 is formed below the second terminal 150.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of terminals, and the number of terminals may be determined by a practitioner as appropriate.

Through these four photolithography steps using six photomasks, the driver circuit portion including the thin film transistor 180, the pixel portion including the thin film transistor 170, the capacitor 147 including the storage capacitor, and external extraction terminal portions can be completed. The thin film transistors and the storage capacitor are arranged in matrix in respective pixels so that a pixel portion is formed, which can be used as one of substrates for manufacturing an active matrix display device. In this specification, such a substrate is referred to as an active matrix substrate for convenience.

Further, by use of a resist mask having regions with plural thicknesses (typically, two different thicknesses) which is formed using a multi-tone mask, the number of resist masks can be reduced, resulting in simplified process and lower cost. Accordingly, a semiconductor device can be manufactured at low cost with high productivity.

When an active matrix liquid crystal display device is manufactured, an active matrix substrate and a counter substrate provided with a counter electrode are attached to each other with a liquid crystal layer positioned therebetween. Note that a common electrode electrically connected to the counter electrode on the counter substrate is provided over the active matrix substrate, and a fourth terminal electrically connected to the common electrode is provided in the terminal portion. This fourth terminal is a terminal for setting the common electrode at a fixed potential such as GND or 0 V.

The insulating layer 191 serving as an alignment film is formed over the oxide insulating layer 107, the conductive layer 111, the wiring layer 145, and the pixel electrode layer 110.

The coloring layer 195, the counter electrode layer 194, and the insulating layer 193 serving as an alignment film are formed over the counter substrate 190. The substrate 100 and the counter substrate 190 are attached to each other with use of a spacer which adjusts a cell gap of the liquid crystal display device. The two substrates are attached to each other with the liquid crystal layer 192 positioned therebetween with use of a sealant (not illustrated). This attachment step may be performed under reduced pressure.

As the sealant, it is typically preferable to use a visible light curable resin, an ultraviolet curable resin, or a thermosetting resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant.

The liquid crystal layer 192 is formed by filling a space with a liquid crystal material. The liquid crystal layer 192 may be formed by a dispenser method (a dripping method) in which liquid crystals are dripped before the attachment of the substrate 100 to the counter substrate 190, or by an injection method in which liquid crystals are injected by using a capillary phenomenon after the attachment of the substrate 100 to the counter substrate 190. There is no particular limitation on the kind of liquid crystal material, and a variety of materials can be used. If a material exhibiting a blue phase is used as the liquid crystal material, an alignment film does not need to be provided.

The polarizing plate 196a is provided on the outer side of the substrate 100, and the polarizing plate 196b is provided on the outer side of the counter substrate 190. In this manner, a transmissive liquid crystal display device of this embodiment can be manufactured (see FIG. 1).

Although not illustrated in this embodiment, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique which is so-called black insertion by which an entirely black image is displayed every other frame.

Alternatively, a driving method called double-frame rate driving may be employed in which a frame frequency is 1.5 times or more, preferably 2 times or more as high as a usual frame frequency (60 Hz), whereby the moving image characteristics are improved, and the grayscale to be written is selected for a plurality of divided fields in each frame.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

The use of an oxide semiconductor for a thin film transistor leads to reduction in manufacturing cost. In particular, an oxide insulating layer is formed in contact with an oxide semiconductor layer using the above method, whereby a thin film transistor having stable electric characteristics can be manufactured and provided. Therefore, a semiconductor device which includes highly reliable thin film transistors having favorable electric characteristics can be provided.

The channel formation region in the semiconductor layer is a high-resistance region; thus, electric characteristics of the thin film transistor are stabilized and increase in off current can be prevented. Therefore, a semiconductor device including a highly reliable thin film transistor having favorable electric characteristics can be provided.

Since s thin film transistor is easily broken due to static electricity or the like, a protective circuit is preferably provided over the same substrate as the pixel portion or the driver circuit portion. The protective circuit is preferably formed using a non-linear element including an oxide semiconductor layer. For example, a protective circuit is provided between the pixel portion, and a scan line input terminal and a signal line input terminal. In this embodiment, a plurality of protective circuits are provided so that the pixel transistor and the like are not broken when surge voltage due to static electricity or the like is applied to the scan line, the signal line, or a capacitor bus line. Accordingly, the protective circuit has a structure for releasing charge to a common wiring when surge voltage is applied to the protective circuit. The protective circuit includes non-linear elements which are arranged in parallel to each other with the scan line therebetween. Each of the non-linear elements includes a two-terminal element such as a diode or a three-terminal element such as a transistor. For example, the non-linear element can be formed through the same steps as the thin film transistor 170 of the pixel portion. For example, characteristics similar to those of a diode can be achieved by connecting a gate terminal to a drain terminal of the transistor.

This embodiment can be implemented in combination with any of the structures disclosed in the other embodiments as appropriate.

Embodiment 2

In this embodiment, an example in which oxide conductive layers serving as source and drain regions are provided between the oxide semiconductor layer and the source and drain electrode layers in Embodiment 1 will be described with reference to FIGS. 6A to 6D and FIGS. 7A and 7B. Therefore, the thin film transistor, except the oxide conductive layers, can be formed in a manner similar to that shown in Embodiment 1; thus, description of the same components or components having the same functions as those in Embodiment, and the manufacturing process thereof will be omitted. FIGS. 6A to 6D and FIGS. 7A and 7B are similar to FIG. 1, FIGS. 2A to 2C, FIGS. 3A and 3B, FIGS. 4A to 4C, and FIG. 5 except that part of the process in FIGS. 6A to 6D and FIGS. 7A and 7B is different from that in FIG. 1, FIGS. 2A to 2C, FIGS. 3A and 3B, FIGS. 4A to 4C, and FIG. 5; thus, the same portions as those in FIG. 1, FIGS. 2A to 2C, FIGS. 3A and 3B, FIGS. 4A to 4C, and FIG. 5 are denoted by the same reference numerals and description thereof will be omitted.

First, as in Embodiment 1, a metal conductive layer is formed over a substrate 100. The metal conductive layer is etched with use of a resist mask which is formed in a first photolithography step, whereby a first terminal 121, a gate electrode layer 161, a conductive layer 162, a gate electrode layer 101, and a capacitor wiring layer 108 are formed.

A gate insulating layer 102 is formed over the first terminal 121, the gate electrode layer 161, the conductive layer 162, the gate electrode layer 101, and the capacitor wiring layer 108, and an oxide semiconductor layer, an oxide conductive layer, and a metal conductive layer are stacked thereover. The gate insulating layer 102, the oxide semiconductor layer, the oxide conductive layer, and the metal conductive layer can be successively formed without being exposed to air.

As the formation method of the oxide conductive layer, a sputtering method, a vacuum evaporation method (an electron beam evaporation method or the like), an arc discharge ion plating method, or a spray method can be used. A material of the oxide conductive layer preferably contains zinc oxide as a component and preferably does not contain indium oxide. For such an oxide conductive layer, zinc oxide, zinc aluminum oxide, zinc aluminum oxynitride, gallium zinc oxide, or the like can be used. The thickness of the oxide conductive layer is set as appropriate in a range of 50 nm to 300 nm inclusive. In the case of using a sputtering method, it is preferable to use a target including $SiO_2$ at greater than or equal to 2 wt % and less than or equal to 10 wt % and make $SiO_x$ (x>0) which inhibits crystallization be contained in the oxide conductive layer in order to suppress crystallization at the time of heat treatment for dehydration or dehydrogenation in a later step.

Next, heat treatment for dehydration or dehydrogenation is performed in the state where the oxide semiconductor layer and the oxide conductive layer are stacked, whereby an oxide semiconductor layer 131, an oxide conductive layer 140, and a metal conductive layer 137 are formed (see FIG. 6A). When heat treatment is performed at 400° C. to 700° C., the dehydration or dehydrogenation of the oxide semiconductor layer can be achieved; thus, water ($H_2O$) can be prevented from being contained in the oxide semiconductor layer again later.

Through this heat treatment, the oxide conductive layer is crystallized unless the oxide conductive layer includes a substance which suppresses crystallization such as silicon oxide. Crystals of the oxide conductive layer grow in a columnar shape with respect to a base surface. As a result, in the case where the metal conductive layer formed over the oxide conductive layer is etched in order to form source and drain electrode layers, formation of undercut can be prevented.

By the heat treatment for dehydration or dehydrogenation of the oxide semiconductor layer, conductivity of the oxide conductive layer can be improved. Note that only the oxide conductive layer may be heated at a temperature lower than the temperature of the heat treatment performed on the oxide semiconductor layer.

In a second photolithography step, light exposure using a high-tone mask is performed. Resist masks 135a, 135b, and 135d are formed over the gate insulating layer 102, the oxide semiconductor layer 131, and the metal conductive layer 137.

Next, a first etching step is performed using the resist masks 135a, 135b, and 135d. The oxide semiconductor layer 131 and the metal conductive layer 137 are etched into island shapes. As a result, oxide semiconductor layers 133, 134, and 120, oxide conductive layers 175, 176, and 177, and metal conductive layers 185, 186, and 188 can be formed (see FIG. 6B).

Next, ashing is conducted on the resist masks 135a, 135b, and 135d. As a result, the areas (three-dimensionally, the volumes) of the resist masks are decreased and the thicknesses thereof are reduced. At this time, the resist of the resist mask in a region with a small thickness (a region overlapping with part of the gate electrode layer 161) is removed, so that resist masks 136a and 136b which are separated from each other can be formed. Similarly, the ashing is also conducted on the resist masks 135b and 135d; thus, the areas (three-dimensionally, the volumes) of the resist masks are decreased. Accordingly, resist masks 136c, 136d, and 136e can be formed.

Unnecessary portions are removed by etching with use of the resist masks 136a, 136b, 136c, 136d, and 136e, so that a source electrode layer 165a, a drain electrode layer 165b, a source electrode layer 105a, a drain electrode layer 105b, and a second terminal 122 are formed (see FIG. 6C).

In this step, the second terminal 122 which is formed from the same material as the oxide semiconductor layer 120, the source electrode layers 105a and 165a, and the drain electrode layers 105b and 165b is formed in the terminal portion. Note that the second terminal 122 is electrically connected to a source wiring (a source wiring including the source electrode layers 105a and 165a).

Note that materials of the layers and etching conditions are adjusted as appropriate so that the oxide conductive layers 175, 176, and 177 and the oxide semiconductor layers 133, 134, and 120 are not removed by etching of the metal conductive layer.

Next, the resist masks 136a, 136b, 136c, 136d, and 136e are removed, and the oxide conductive layer 140 is etched using the source electrode layer 105a, the drain electrode layer 105b, the source electrode layer 165a, and the drain electrode layer 165b as masks, so that oxide conductive layers 164a and 164b and oxide conductive layers 104a and 104b are formed (see FIG. 6D). The oxide conductive layer 140 containing zinc oxide as a component can be easily etched with an alkaline solution such as a resist stripping solution, for example. In addition, an oxide conductive layer 139 is also formed in a terminal portion in this step.

Etching treatment for dividing the oxide conductive layer to form channel formation regions is performed by utilizing the difference in etching rates between the oxide semiconductor layers and the oxide conductive layer. The oxide conductive layer over the oxide semiconductor layers is selectively etched utilizing a higher etching rate of the oxide conductive layer as compared with that of the oxide semiconductor layers.

Therefore, removal of the resist masks 136a, 136b, 136c, 136d, and 136e is preferably performed by ashing. In the case of etching with a stripping solution, etching conditions (the kind of etchant, the concentration, and the etching time) are adjusted as appropriate so that the oxide conductive layers 175 and 176 and the oxide semiconductor layers 133 and 134 are not etched excessively.

As described in this embodiment, in the case where the oxide conductive layer and the metal conductive layer are stacked and etching is performed using the same masks to form a wiring pattern including source electrode layers and drain electrode layers, oxide conductive layers can be left under the wiring pattern of the metal conductive layer.

At the contact portion between the gate wiring and the source wiring, the oxide conductive layer is formed below the source wiring. The oxide conductive layer serves as a buffer, and further an insulating oxide is not formed with metal, which is preferable.

An oxide insulating layer 107 serving as a protective insulating layer is formed in contact with the oxide semiconductor layers 133 and 134. In this embodiment, a silicon oxide film with a thickness of 300 nm is formed by a sputtering method as the oxide insulating layer 107.

Then, second heat treatment (preferably at higher than or equal to 200° C. and lower than or equal to 400° C., for example, higher than or equal to 250° C. and lower than or equal to 350° C.) is performed in an inert gas atmosphere or a nitrogen gas atmosphere. For example, the second heat treatment is performed at 250° C. for one hour in a nitrogen atmosphere. By the second heat treatment, part of the oxide semiconductor layers 133 and 134 which overlaps with the oxide insulating layer 107 is heated in the state of being in contact with the oxide insulating layer 107.

In the above-described steps, the formed oxide semiconductor layers are subjected to heat treatment for dehydration or dehydrogenation to have a lower resistance and then part of the oxide semiconductor layers is selectively made in an oxygen-excess state.

As a result, a channel formation region 166, which overlaps with the gate electrode layer 161, in the oxide semiconductor layer 133 comes to have i-type conductivity, and a high-resistance source region 167a which overlaps with the source electrode layer 165a and the oxide conductive layer 164a and a high-resistance drain region 167b which overlaps with the drain electrode layer 165b and the oxide conductive layer 164b are formed in a self-aligned manner; thus an oxide semiconductor layer 163 is formed. In a similar manner, a channel formation region 116, which overlaps with the gate electrode layer 101, in the oxide semiconductor layer 134 comes to have i-type conductivity, and a high-resistance source region 117a which overlaps with the source electrode layer 105a and the oxide conductive layer 104a and a high-resistance drain region 117b which overlaps with the drain electrode layer 105b and the oxide conductive layer 104b are formed in a self-aligned manner; thus an oxide semiconductor layer 103 is formed.

The oxide conductive layers 104b and 164b which are disposed between the oxide semiconductor layers 103 and 163 and the drain electrode layers 105b and 165b each also function as a low-resistance drain (LRD, also referred to as an LRN (low-resistance n-type conductivity)) region. Similarly, the oxide conductive layers 104a and 164a which are disposed between the oxide semiconductor layers 103 and 163 and the source electrode layers 105a and 165a each also function as a low-resistance source (LRS, also referred to as an LRN (low-resistance n-type conductivity)) region. With the structure of the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (the HRD region) and preferably in a range of $1\times10^{20}/\text{cm}^3$ or higher and $1\times10^{21}/\text{cm}^3$ or lower.

Through the above-described steps, a thin film transistor 181 and a thin film transistor 171 can be manufactured in a driver circuit portion and a pixel portion, respectively, over the same substrate. The thin film transistors 171 and 181 are each a bottom-gate thin film transistor which includes an oxide semiconductor layer including a high-resistance source region, a high-resistance drain region, and a channel formation region. Therefore, even when a high electric field is applied to the thin film transistors 171 and 181, the high-resistance drain regions and the high-resistance source regions each serve as a buffer and a local high electric field is not applied; in this manner, the structure realizes the improved withstand voltage of the transistors.

In a capacitor portion, a capacitor 146 which is formed from the stack of the capacitor wiring layer 108, the gate insulating layer 102, an oxide conductive layer formed in the same step as the oxide conductive layer 104b and a metal conductive layer formed in the same step as the drain electrode layer 105b is formed.

Next, a planarization insulating layer 109 is formed over the oxide insulating layer 107. In this embodiment, the planarization insulating layer 109 is formed only in the pixel portion. The planarization insulating layer 109 can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer 109 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer 109, and any of the following can be used depending on a material thereof: a method such as a sputtering method, an SOG method, spin coating, dipping, spray coating, or a droplet discharging method (e.g., an inkjet method, screen printing, or offset printing). Furthermore, the planarization insulating layer 109 can be formed by using a tool such as doctor knife, roll coater, curtain coater, or knife coater; or the like. In this embodiment, photosensitive acrylic is used to form the planarization insulating layer 109.

Next, a third photolithography step is performed. A resist mask is formed, and a contact hole 125 reaching the drain electrode layer 105b is formed by etching the planarization insulating layer 109 and the oxide insulating layer 107. Then, the resist mask is removed. In addition, a contact hole 126 reaching the first terminal 121 and a contact hole 127 reaching the second terminal 122 are also formed by this etching.

Next, a light-transmitting conductive film is formed, and a fourth photolithography step is performed. A resist mask is formed and unnecessary portions are removed by etching to form a pixel electrode layer 110, a conductive layer 111, and terminal electrodes 128 and 129. Then, the resist mask is removed (see FIG. 7A).

As in Embodiment 1, a counter substrate 190 is attached to the substrate 100 with the liquid crystal layer 192 positioned therebetween; thus, a liquid crystal display device of this embodiment is manufactured (see FIG. 7B).

When the oxide conductive layers are provided as the source region and the drain region between the oxide semiconductor layer and the source and drain electrode layers, the source region and the drain region can have lower resistance and the transistor can operate at high speed. It is effective to use the oxide conductive layers for a source region and a drain region in order to improve frequency characteristics of a peripheral circuit (a driver circuit). This is because the contact between a metal electrode (e.g., Ti) and an oxide conductive layer can reduce the contact resistance as compared with the contact between a metal electrode (e.g., Ti) and an oxide semiconductor layer.

There has been a problem in that molybdenum (Mo) which is used as a part of a wiring material (e.g., Mo/Al/Mo) in a liquid crystal panel has high contact resistance with an oxide semiconductor layer. This is because Mo is less likely to be oxidized and has a weaker effect of extracting oxygen from the oxide semiconductor layer as compared with Ti, and a contact interface between Mo and the oxide semiconductor layer is not changed to have n-type conductivity. However, even in such a case, the contact resistance can be reduced by interposing an oxide conductive layer between the oxide semiconductor layer and source and drain electrode layers; accordingly, frequency characteristics of a peripheral circuit (a driver circuit) can be improved.

The channel length of the thin film transistor is determined at the time of etching the oxide conductive layer; accordingly, the channel length can be further shortened. For example, the channel length (L) can be set as small as 0.1 μm to 2 μm inclusive; in this way, operation speed can be increased.

Embodiment 3

This embodiment shows an example of a liquid crystal display device in which a liquid crystal layer is placed between a first substrate and a second substrate, and a common connection portion is formed over the first substrate so as to be electrically connected to a counter electrode provided on the second substrate. Note that a thin film transistor is formed as a switching element over the first substrate, and the common connection portion is manufactured in the same process as the switching element in a pixel portion, resulting in simplified process.

The common connection portion is provided in a position overlapping with a sealant for attaching the first substrate and the second substrate to each other and is electrically connected to a counter electrode through conductive particles in the sealant. Alternatively, the common connection portion is provided in a position which does not overlap with the sealant (except for the pixel portion) and a paste including conductive particles is provided separately from the sealant so as to overlap with the common connection portion, whereby the common connection portion can be electrically connected to the counter electrode through the conductive particles in the paste.

Figure 8A:
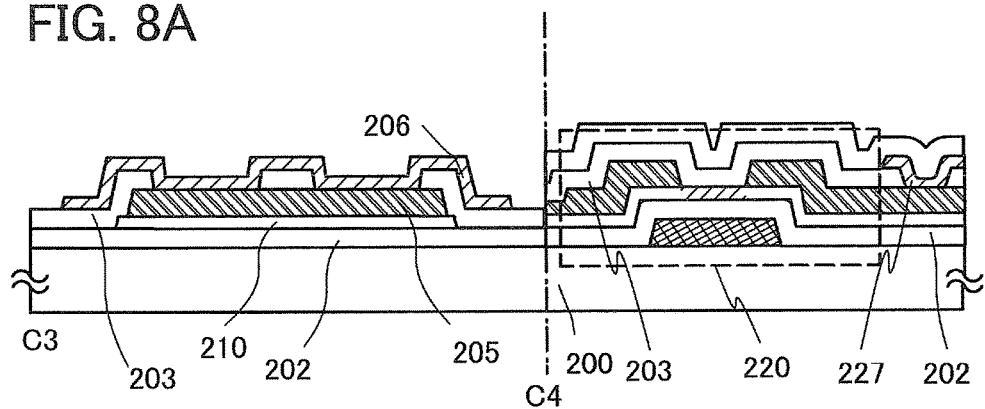
FIGS. 8A and 8B are diagrams illustrating a semiconductor device.

FIG. 8A is a cross-sectional view of a semiconductor device in which a thin film transistor and a common connection portion are formed over the same substrate.

In FIG. 8A, a thin film transistor 220 which is electrically connected to a pixel electrode layer 227 is a channel protective thin film transistor provided in a pixel portion, and in this embodiment has a structure similar to the structure of the thin film transistor 170 of Embodiment 1.

Figure 8B:
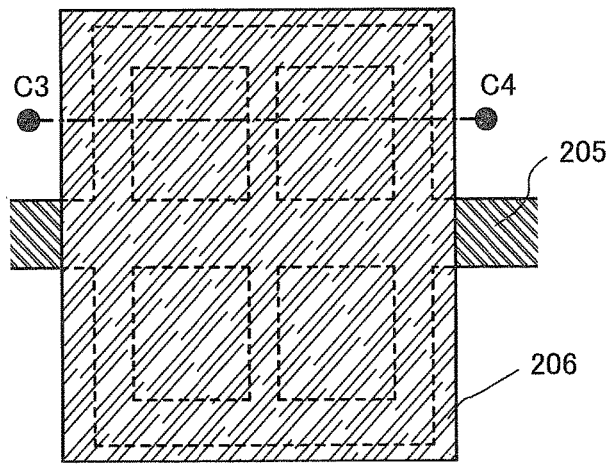

FIG. 8B illustrates an example of a top view of the common connection portion, and dashed line C3-C4 in FIG. 8B corresponds to a cross section of the common connection portion of FIG. 8A. Note that in FIG. 8B, portions similar to those in FIG. 8A are denoted by the same reference numerals.

A common potential line 205 over an oxide semiconductor layer 210 is provided over a gate insulating layer 202 and manufactured of the same material and in the same process as source and drain electrode layers of the thin film transistor 220.

The common potential line 205 is covered with a protective insulating layer 203, and the protective insulating layer 203 has a plurality of openings at positions overlapping with the common potential line 205. These openings are formed in the same process as a contact hole for connecting the drain electrode layer of the thin film transistor 220 and the pixel electrode layer 227.

Note that the contact hole in the pixel portion and the openings in the common connection portion are distinctively described because their sizes differ considerably. In FIG. 8A, the pixel portion and the common connection portion are not illustrated on the same scale. For example, the length of dashed line C3-C4 in the common connection portion is about 500 μm, and the width of the thin film transistor is less than 50 μm; thus, the area of the common connection portion is ten times or more as large as that of the thin film transistor. However, the scales of the pixel portion and the common connection portion are changed in FIG. 8A for simplification.

A common electrode layer 206 is provided over the protective insulating layer 203 and formed of the same material and in the same process as the pixel electrode layer 227 in the pixel portion.

In this manner, the common connection portion is formed in the same process as the switching element in the pixel portion. The common potential line preferably has a structure with which wiring resistance as a metal wiring can be reduced.

Then, a first substrate 200 provided with the pixel portion and the common connection portion is fixed to a second substrate provided with a counter electrode with a sealant.

In the case where the sealant contains conductive particles, the pair of substrates are aligned so that the sealant overlaps with the common connection portion. For example, in the case of a small liquid crystal panel, two common connection portions overlap with the sealant at opposite corners of the pixel portion and the like.

In the case of a large liquid crystal panel, four or more common connection portions overlap with the sealant.

Note that the common electrode layer 206 is an electrode in contact with the conductive particles contained in the sealant, and is electrically connected to the counter electrode of the second substrate.

In the case of using a liquid crystal injection method, the pair of substrates are fixed with a sealant, and then liquid crystals are injected between the pair of substrates. In the case of using a liquid crystal dropping method, a sealant is drawn on the second substrate or the first substrate and liquid crystals are dropped thereon; then, the pair of substrates are attached to each other under reduced pressure.

This embodiment shows an example of the common connection portion electrically connected to the counter electrode, but without limitation thereto, such a common connection portion can be used as a connection portion connected to another wiring or a connection portion connected to an external connection terminal or the like.

This embodiment can be implemented in combination with any of the structures disclosed in the other embodiments as appropriate.

Embodiment 4

Figure 10:
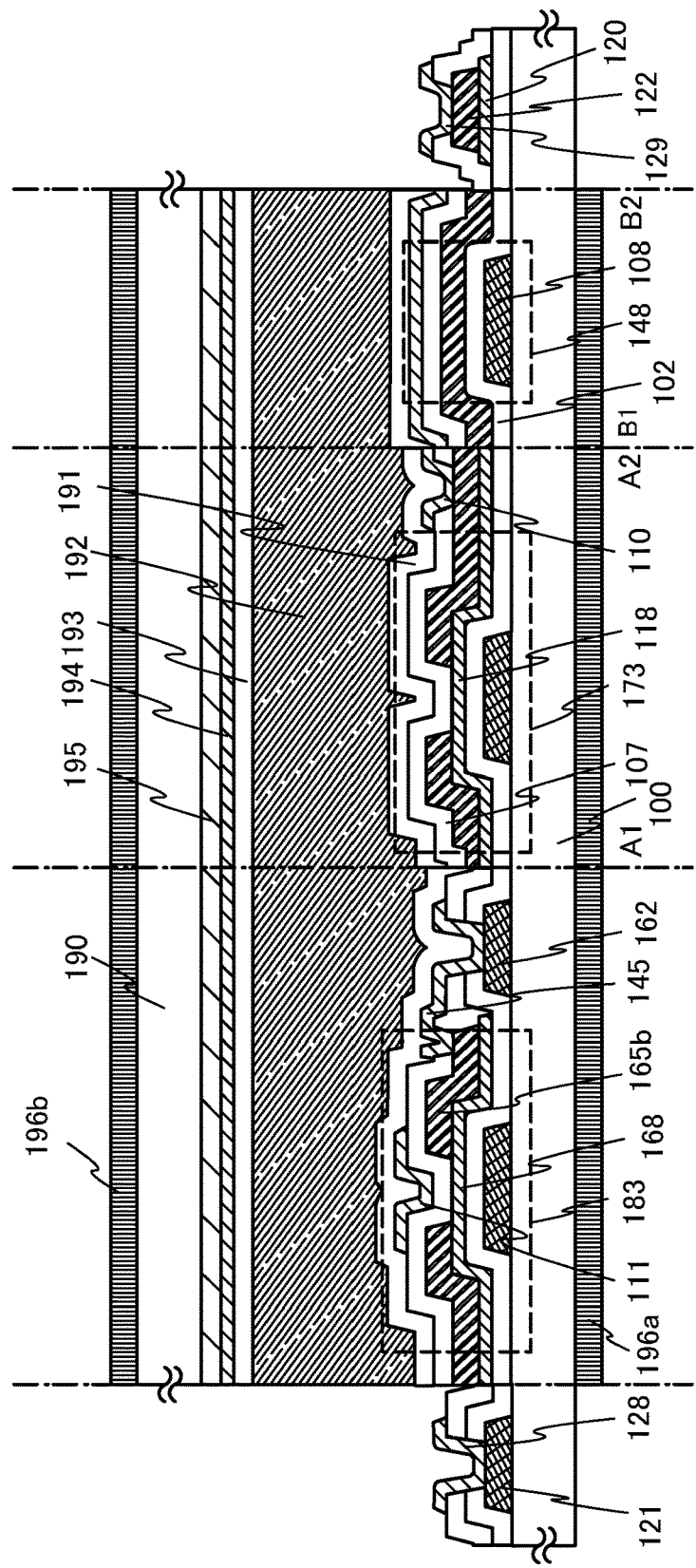
FIG. 10 is a diagram illustrating a semiconductor device.

In this embodiment, an example of a manufacturing process of a thin film transistor, which is different from that in Embodiment 1, will be described with reference to FIG. 10. FIG. 10 is similar to FIG. 1, FIGS. 2A to 2C, FIGS. 3A and 3B, FIGS. 4A to 4C, and FIG. 5 except that part of the process in FIG. 10 is different from that in FIG. 1, FIGS. 2A to 2C, FIGS. 3A and 3B, FIGS. 4A to 4C, and FIG. 5; thus, the same portions as those in FIG. 1, FIGS. 2A to 2C, FIGS. 3A and 3B, FIGS. 4A to 4C, and FIG. 5 are denoted by the same reference numerals and description thereof will be omitted.

First, as in Embodiment 1, gate electrode layers, a gate insulating layer 102, and an oxide semiconductor layer 130 are formed over a substrate 100.

Next, dehydration or dehydrogenation of the oxide semiconductor layer 130 is performed. The temperature of first heat treatment for dehydration or dehydrogenation is set at higher than or equal to 400° C. and lower than the strain point of the substrate, preferably 425° C. or higher. Note that the heat treatment time may be one hour or shorter when the temperature of the heat treatment is 425° C. or higher, but is set to longer than one hour when the temperature of the heat treatment is lower than 425° C. In this embodiment, the substrate is introduced into an electric furnace, which is one of heat treatment apparatuses, and heat treatment is performed on the oxide semiconductor layer in a nitrogen atmosphere. Then, the oxide semiconductor layer is not exposed to air, which prevents reincorporation of water and hydrogen into the oxide semiconductor layer, so that an oxide semiconductor layer is obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas and the $N_2O$ gas do not include water, hydrogen, and the like. Alternatively, the purity of an oxygen gas or an $N_2O$ gas which is introduced into the heat treatment apparatus is preferably 6N (99.9999%) or higher, more preferably 7N (99.99999%) or higher (that is, the impurity concentration of the oxygen gas or the $N_2O$ gas is 1 ppm or lower, preferably 0.1 ppm or lower).

Further, after the first heat treatment for dehydration or dehydrogenation, heat treatment may be performed at higher than or equal to 200° C. and lower than or equal to 400° C., preferably higher than or equal to 200° C. and lower than or equal to 300° C., in an atmosphere of an oxygen gas or an $N_2O$ gas.

Through the above process, an entire region of the oxide semiconductor layer is made to be in an oxygen-excess state; thus, the oxide semiconductor layer has higher resistance, that is, the oxide semiconductor layer has i-type conductivity. Accordingly, an oxide semiconductor film which has i-type conductivity in its entirety is obtained.

Next, a metal conductive layer is formed over the oxide semiconductor layer, and a second photolithography step is performed using a multi-tone mask. A resist mask is formed, and selective etching is performed, so that source and drain electrode layers and oxide semiconductor layers 168 and 118 are formed. Then, an oxide insulating layer 107 is formed by a sputtering method.

Next, in order to reduce variation in electric characteristics of the thin film transistors, heat treatment (preferably at higher than or equal to 150° C. and lower than 350° C.) may be performed in an inert gas atmosphere or a nitrogen gas atmosphere. For example, heat treatment is performed at 250° C. for one hour in a nitrogen atmosphere.

A third photolithography step is performed. A resist mask is formed, and selective etching is performed, so that a contact hole reaching a first terminal 121, a contact hole reaching a conductive layer 162, a contact hole reaching a drain electrode layer 105b, and a contact hole reaching a second terminal 122 stacked over an oxide semiconductor layer 120 are formed in the gate insulating layer and the oxide insulating layer. After a conductive film having a light-transmitting property is formed, a fifth photolithography step is performed. A resist mask is formed, and selective etching is performed, so that a pixel electrode layer 110, a terminal electrode 128, a terminal electrode 129, and a wiring layer 145 are formed.

In this embodiment, the first terminal 121 and the terminal electrode 128 are directly contact to each other not through the connection electrode 120. A drain electrode layer 165b and the conductive layer 162 are connected to each other through the wiring layer 145.

In a capacitor portion, a capacitor 148 is formed from a stack of a capacitor wiring layer 108, the gate insulating layer 102, a metal conductive layer formed in the same process as the source and drain electrode layers, the oxide insulating layer 107, and the pixel electrode layer 110.

Through the above steps, a thin film transistor 183 and a thin film transistor 173 can be manufactured in a driver circuit portion and in a pixel portion, respectively, over the same substrate.

As in Embodiment 1, a counter substrate 190 is attached to the substrate 100 with a liquid crystal layer 192 positioned therebetween, whereby a liquid crystal display device of this embodiment is manufactured (see FIG. 10).

This embodiment can be implemented in combination with any of the structures disclosed in the other embodiments as appropriate.

Embodiment 5

In this embodiment, an example will be described below, in which at least part of a driver circuit and a thin film transistor arranged in a pixel portion are formed over the same substrate.

The thin film transistor to be arranged in the pixel portion is formed according to any of Embodiments 1 to 4. Further, the thin film transistors described in Embodiments 1 to 4 are n-channel TFTs, and thus part of a driver circuit that can include an n-channel TFT among driver circuits is formed over the same substrate as the thin film transistor of the pixel portion.

Figure 12A:
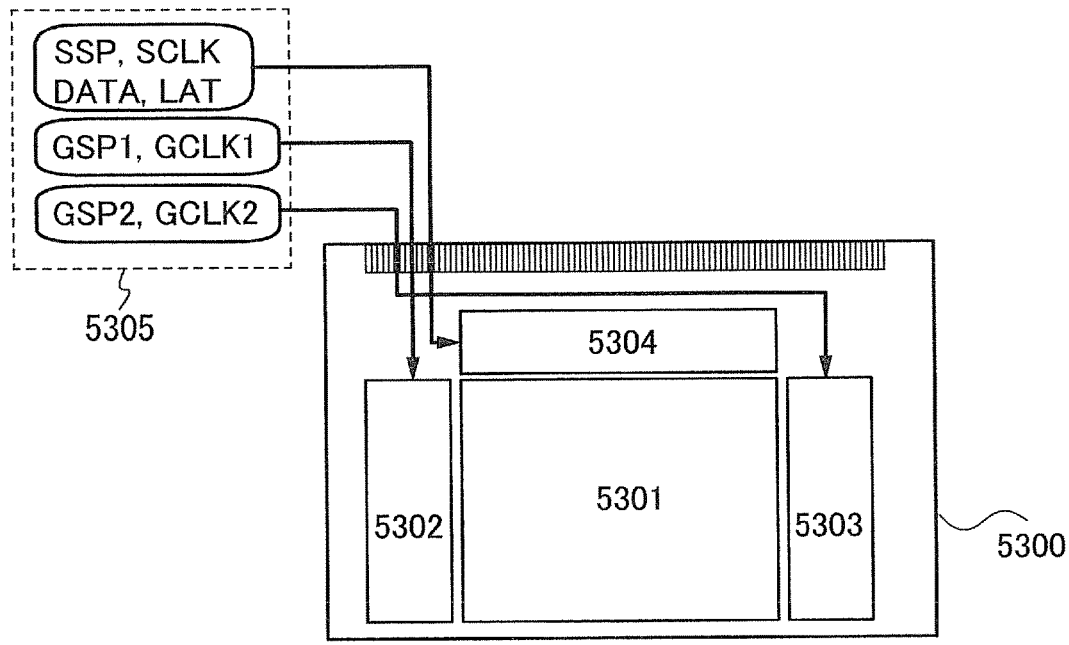
FIGS. 12A and 12B are block diagrams illustrating semiconductor devices.

FIG. 12A is an example of a block diagram of an active matrix display device. A pixel portion 5301, a first scan line driver circuit 5302, a second scan line driver circuit 5303, and a signal line driver circuit 5304 are formed over a substrate 5300 of the display device. A plurality of signal lines which are extended from the signal line driver circuit 5304 and a plurality of scan lines which are extended from the first scan line driver circuit 5302 and the second scan line driver circuit 5303 are provided in the pixel portion 5301. Note that pixels each including a display element are provided in matrix in intersection regions of the scan lines and the signal lines. The substrate 5300 of the display device is connected to a timing control circuit 5305 (also referred to as a controller or a control IC) through a connection portion such as a flexible printed circuit (FPC) or the like.

In FIG. 12A, the first scan line driver circuit 5302, the second scan line driver circuit 5303, and the signal line driver circuit 5304 are formed over the same substrate 5300 as the pixel portion 5301. Accordingly, the number of components such as a driver circuit provided in an external portion is reduced, which can lead to cost reduction. Further, the number of connections which are formed at the connection portions by extension of wirings in the case of providing a driver circuit outside the substrate 5300 can be reduced. Accordingly, improvement in reliability and yield can be achieved.

The timing control circuit 5305 supplies, for example, a first scan line driver circuit start signal (GSP1) and a scan line driver circuit clock signal (GCLK1) to the first scan line driver circuit 5302. In addition, the timing control circuit 5305 supplies, for example, a second scan line driver circuit start signal (GSP2) (also referred to as a start pulse) and a scan line driver circuit clock signal (GCLK2) to the second scan line driver circuit 5303. The timing control circuit 5305 supplies a signal line driver circuit start signal (SSP), a signal line driver circuit clock signal (SCLK), video signal data (DATA) (also simply referred to as a video signal), and a latch signal (LAT) to the signal line driver circuit 5304. Each clock signal may be a plurality of clock signals with shifted phases or may be supplied together with a signal (CKB) obtained by inverting the clock signal. One of the first scan line driver circuit 5302 and the second scan line driver circuit 5303 can be omitted.

Figure 12B:
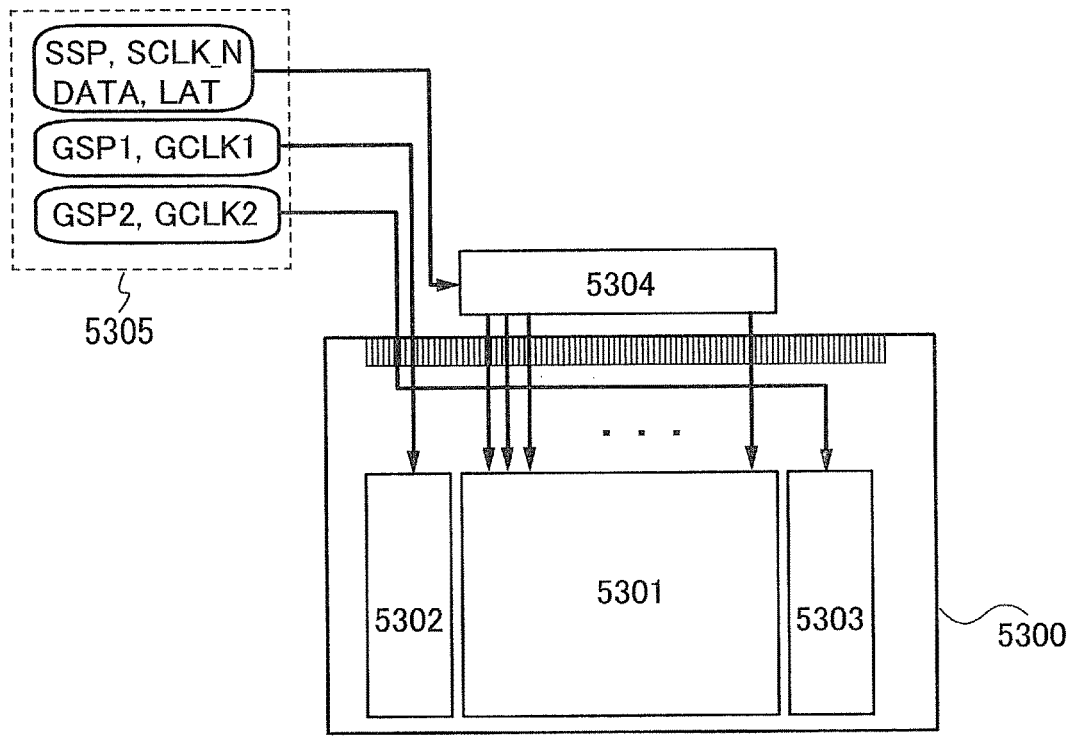

FIG. 12B shows a structure in which circuits with low driving frequency (e.g., the first scan line driver circuit 5302 and the second scan line driver circuit 5303) are formed over the same substrate 5300 as the pixel portion 5301 and the signal line driver circuit 5304 is formed over a different substrate from the pixel portion 5301. With this structure, the driver circuits formed over the substrate 5300 can be formed using a thin film transistor having lower field effect mobility as compared with that of a transistor formed using a single crystal semiconductor. Accordingly, increase in the size of the display device, reduction in cost, improvement in yield, or the like can be achieved.

The thin film transistors described in Embodiments 1 to 4 are n-channel TFTs. An example of a structure and operation of a signal line driver circuit including the n-channel TFT will be described with reference to FIGS. 13A and 13B.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ ($k$ is a natural number). A case in which the thin film transistors 5603_1 to 5603_$k$ are n-channel TFTs will be exemplified.

A connection relation of the signal line driver circuit will be described using the switching circuit 5602_1 as an example. Respective first terminals of the thin film transistors 5603_1 to 5603_$k$ are connected to corresponding wirings 5604_1 to 5604_$k$. Respective second terminals of the thin film transistors 5603_1 to 5603_$k$ are connected to corresponding signal lines S1 to Sk. Gates of the thin film transistors 5603_1 to 5603$k$ are connected to the shift register 5601.

The shift register 5601 has a function of sequentially selecting the switching circuits 5602_1 to 5602_N by sequentially outputting an H-level signal (also referred to as an H signal or a high power supply potential level signal) to wirings 5605_1 to 5605_N.

The switching circuit 5602_1 has a function of controlling conduction between the wirings 5604_1 to 5604_$k$ and the signal lines S1 to Sk (conduction between the first terminals and the second terminals), that is, a function of determining whether potentials of the wirings 5604_1 to 5604_$k$ are supplied to the signal lines S1 to Sk. Thus, the switching circuit 5602_1 has a function as a selector. Further, the thin film transistors 5603_1 to 5603_$k$ have a function of controlling conduction between the wirings 5604_1 to 5604_$k$ and the signal lines S1 to Sk, that is, a function of supplying potentials of the wirings 5604_1 to 5604_$k$ to the signal lines S1 to Sk. Thus, the thin film transistors 5603_1 to 5603_$k$ each function as a switch.

Note that video signal data (DATA) is input to each of the wirings 5604_1 to 5604_$k$. The video signal data (DATA) is, in many cases, an analog signal corresponding to image data or an image signal.

Figure 13A:
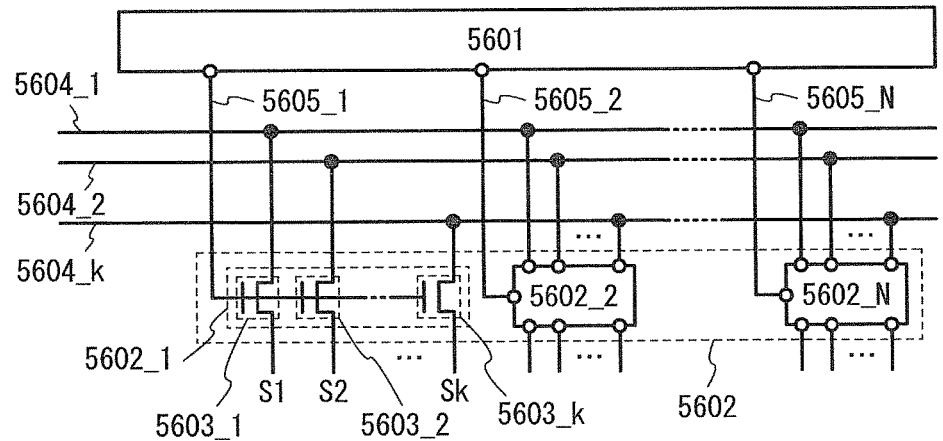
FIGS. 13A and 13B are diagrams illustrating a structure of a signal line driver circuit.
Figure 13B:
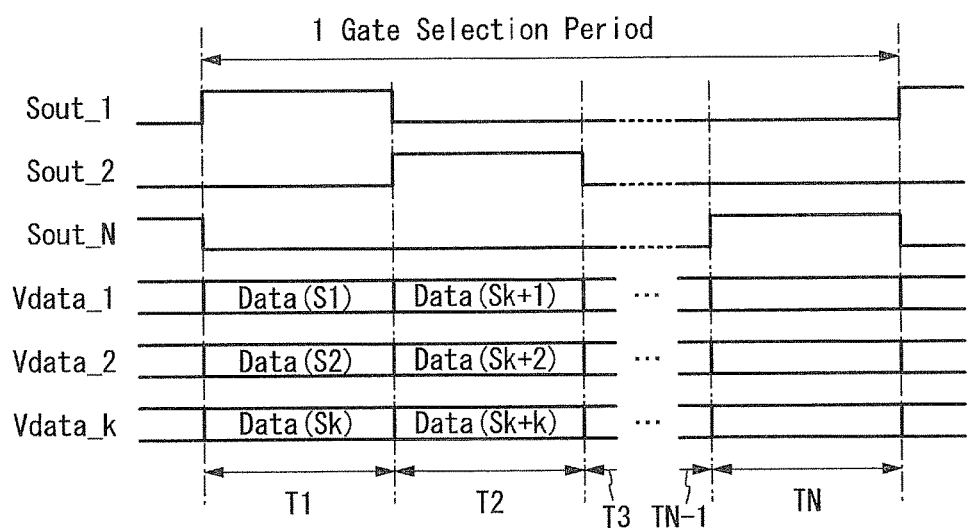

Next, operation of the signal line driver circuit shown in FIG. 13A is described with reference to a timing chart of FIG. 13B. Examples of signals Sout_1 to Sout_N and signals Vdata_1 to Vdata_k are shown in FIG. 13B. The signals Sout_1 to Sout_N are examples of output signals of the shift register 5601, and the signals Vdata_1 to Vdata_k are examples of signals which are input to the wirings 5604_1 to 5604$k$. Note that one operation period of the signal line driver circuit corresponds to one gate selection period in the display device. For example, one gate selection period is divided into periods T1 to TN. Each of the periods T1 to TN is a period for writing video signal data (DATA) to pixels belonging to the selected row.

Note that as for some components shown in drawings and the like of this embodiment, distortion of signal waveforms or the like is exaggerated for the purpose of clarity. Therefore, the scale is not necessarily limited to that illustrated in the drawings and the like.

In the periods T1 to TN, the shift register 5601 sequentially outputs an H-level signal to the wirings 5605_1 to 5605_N. For example, in the period T1, the shift register 5601 outputs a high-level signal to the wiring 5605_1. Then, the thin film transistors 5603_1 to 5603_k are turned on, so that the wirings 5604_1 to 5604_k and the signal lines Si to Sk are brought into conduction. At this time, Data (Si) to Data (Sk) are input to the wirings 5604_1 to 5604_k. The Data (S1) to Data (Sk) are input to pixels in the first to k-th columns in the selected row through the thin film transistors 5603_1 to 5603_k. Thus, video signal data (DATA) are sequentially written to pixels in the selected row by k columns in the periods T1 to TN.

By writing video signal data (DATA) to pixels by plural columns in the above-described manner, the number of video signal data (DATA) or the number of wirings can be reduced. Accordingly, the number of connections to an external circuit can be reduced. Further, by writing video signals to pixels by plural columns, writing time can be extended and shortage of writing of video signals can be prevented.

Note that a circuit including the thin film transistor described in any of Embodiments 1 to 5 can be used as the shift register 5601 and the switching circuit 5602. In this case, all transistors included in the shift register 5601 can be formed to have only either n-channel or p-channel.

The structure of a scan line driver circuit will be described. The scan line driver circuit includes a shift register. Additionally, the scan line driver circuit may include a level shifter or a buffer depending on the conditions. In the scan line driver circuit, when a clock signal (CLK) and a start pulse signal (SP) are input to the shift register, a selection signal is generated. The generated selection signal is buffered and amplified by a buffer, and the resulting signal is supplied to a corresponding scan line. Gate electrodes of transistors of pixels in one line are connected to a scan line. Since the transistors of the pixels in one line have to be turned on all at once, a buffer which can supply a large current is used.

One mode of the shift register used for part of the scan line driver circuit and/or the signal line driver circuit is described with reference to FIGS. 14A to 14D and FIGS. 15A and 15B.

Figure 14A:
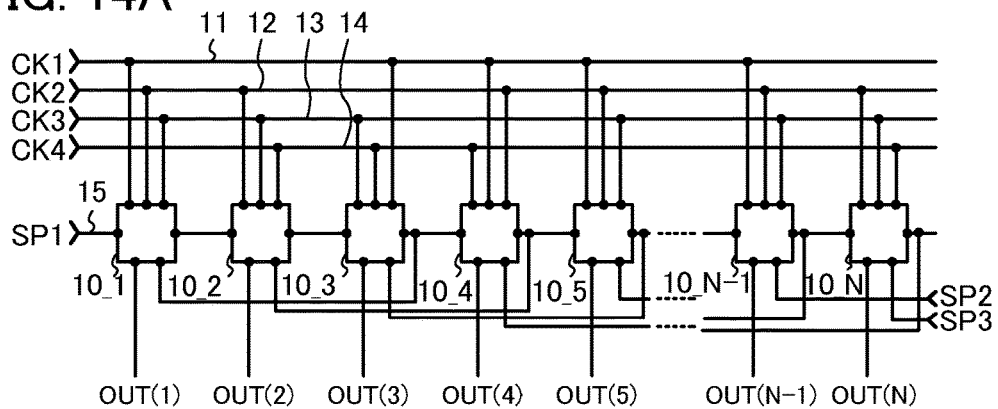
FIGS. 14A to 14D are circuit diagrams illustrating a structure of a shift register.

A shift register of a scan line driver circuit and/or a signal line driver circuit is described with reference to FIGS. 14A to 14D and FIGS. 15A and 15B. The shift register includes first to N-th pulse output circuits 10_1 to 10_N (N is a natural number and larger than or equal to 3) (see FIG. 14A). A first clock signal CK1, a second clock signal CK2, a third clock signal CK3, and a fourth clock signal CK4 are supplied to the first to N-th pulse output circuits 10_1 to 10_N of the shift register shown in FIG. 14A from a first wiring 11, a second wiring 12, a third wiring 13, and a fourth wiring 14, respectively. Further, a start pulse SP1 (first start pulse) is input to the first pulse output circuit 10_1 from a fifth wiring 15. A signal output from the pulse output circuit 10_(n−1) in the previous stage (referred to as a previous stage signal OUT(n−1)) is input to an n-th pulse output circuit 10_n (n is a natural number and larger than or equal to 2 and smaller than or equal to N) in the second or later stage. In addition, a signal from the third pulse output circuit 10_3 is input to the first pulse output circuit 10_1 in the two stages before the third pulse output circuit 10_3. In a similar manner, a signal from the pulse output circuit 10_(n+2) in two stages after the n-th pulse output circuit 10_n (also referred to as a later-stage signal OUT(n+2)) is input to the n-th pulse output circuit 10_n in the second or later stage. Therefore, from the pulse output circuit in each stage, a first output signal (OUT(1) (SR) to OUT(N) (SR)) to be input to a pulse output circuit in the later and/or previous two stages and a second output signal (OUT(1) to OUT(N)) input to another circuit or the like are output. Since later-stage signals OUT(n+2) are not input to the pulse output circuits in the last two stages of the shift register, a structure in which a second start pulse SP2 and a third start pulse SP3 are input to the respective pulse output circuits may be employed, for example, as shown in FIG. 14A.

Note that the clock signal (CK) is a signal which becomes an H-level signal and an L-level signal (also referred to as an L signal or a low power supply potential level signal) repeatedly at a regular interval. Here, the first to fourth clock signals (CK1) to (CK4) are sequentially deviated by ¼ period. In this embodiment, by using the first to fourth clock signals (CK1) to (CK4), control of driving of the pulse output circuits or the like is performed. Although the clock signal is also represented by GCLK or SCLK depending on the driver circuit to which the signal is input, CK is used here.

A first input terminal 21, a second input terminal 22, and a third input terminal 23 are electrically connected to any of the first to fourth wirings 11 to 14. For example, in FIG. 14A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 102 is electrically connected to the second wiring 12, the second input terminal 22 of the second pulse output circuit 102 is electrically connected to the third wiring 13, and the third input terminal 23 of the second pulse output circuit 10_2 is electrically connected to the fourth wiring 14.

Figure 14B:
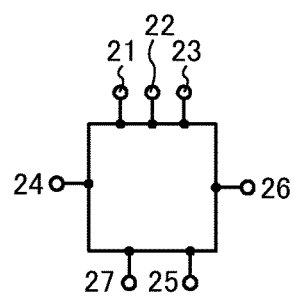

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 14B). A first clock signal CK1, a second clock signal CK2, a third clock signal CK3, a start pulse, a later-stage signal OUT(3) are input to the first input terminal 21, the second input terminal 22, the third input terminal 23, the fourth input terminal 24, and the fifth input terminal 25 of the first pulse output circuit 10_1, respectively. A first output signal OUT(1) (SR) and a second output signal OUT(1) are output from the first output terminal 26 and the second output terminal 27, respectively.

Figure 14C:
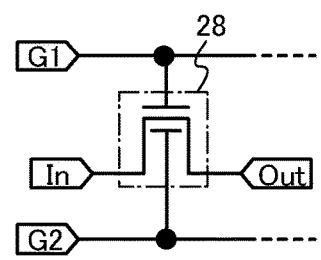

In the first to N-th pulse output circuits 10_1 to 10_N, the thin film transistor (TFT) having four terminals described in the above embodiment can be used in addition to a thin film transistor having three terminals. Symbols of a thin film transistor 28 having four terminals described in the above embodiments are illustrated in FIG. 14C. The thin film transistor 28 in FIG. 14C corresponds to the thin film transistor having four terminals described in any of Embodiments 1, 2, 5, and 6, and the symbols are used for description below. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the thin film transistor can be controlled to be a desired level by providing gate electrodes above and below a channel formation region of the thin film transistor 28 with a gate insulating layer interposed between the upper gate electrode and the channel formation region and between the lower gate electrode and the channel formation region, and by controlling a potential of the upper gate electrode and/or the lower gate electrode.

Next, an example of a specific circuit structure of the pulse output circuit shown in FIG. 14B will be described with reference to FIG. 14D.

Figure 14D:
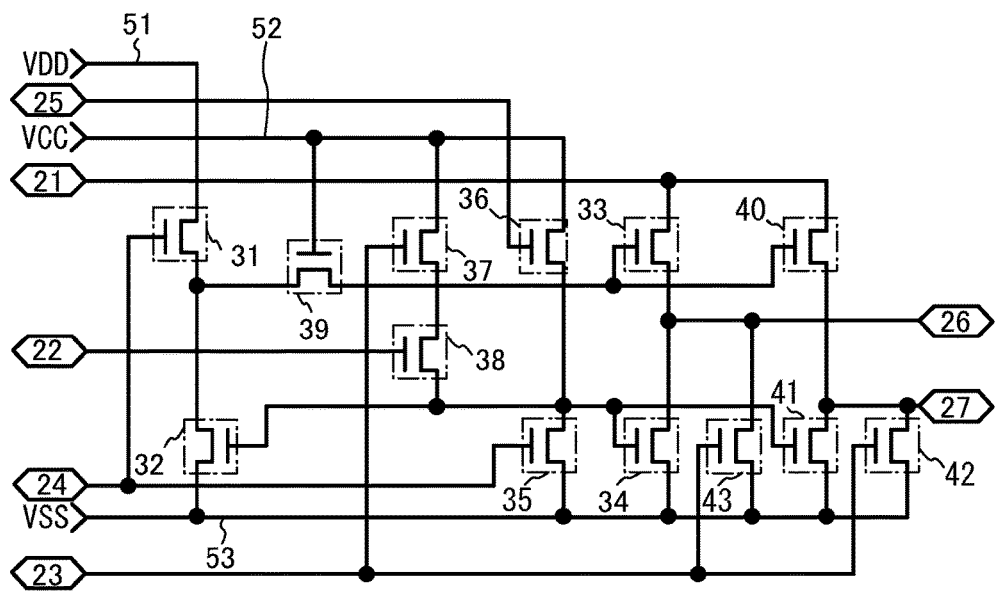

A pulse output circuit illustrated in FIG. 14D includes first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 14D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. Note that a thin film transistor having four terminals is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected depending on a control signal of the gate electrode, and can reduce a malfunction of the pulse output circuit by quick response (sharp rising of on-current) to the control signal input to the gate electrode. By using the thin film transistor 28 having four terminals, the threshold voltage can be controlled, and a malfunction of the pulse output circuit can be further reduced.

In FIG. 14D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 14D, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Figure 15A:
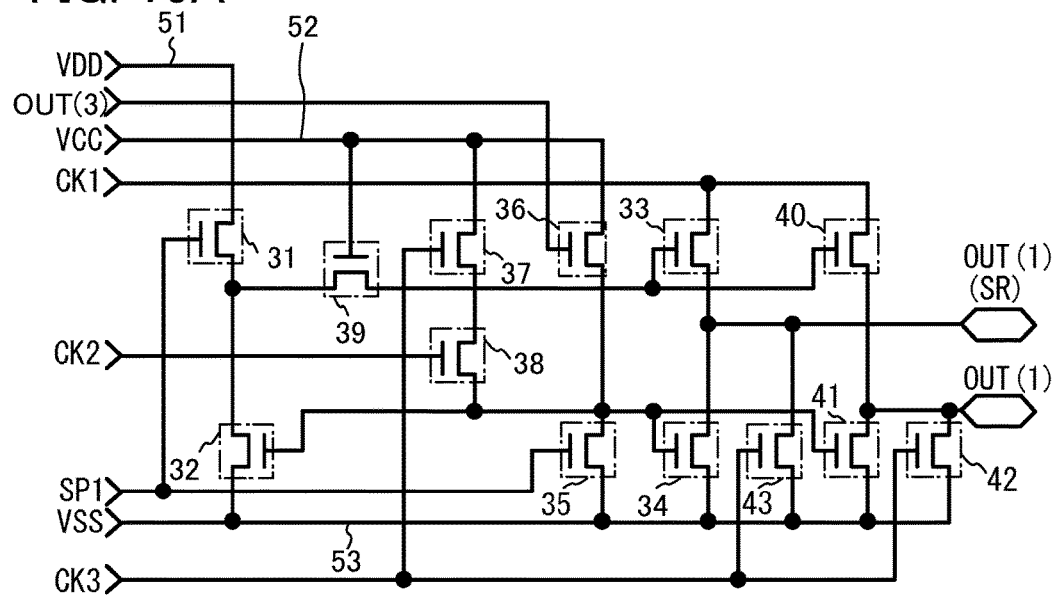
FIGS. 15A and 15B are a circuit diagram and a timing chart, respectively, illustrating operation of a shift register.

FIG. 15A illustrates signals that are input to or output from the first to fifth input terminals 21 to 25 and the first and second output terminals 26 and 27 in the case where the pulse output circuit illustrated in FIG. 14B is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the later-stage signal OUT(3) is input to the fifth input terminal 25; the first output signal OUT(1) (SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 14D and FIG. 15A, a capacitor for performing bootstrap operation by bringing the node A into a floating state may be additionally provided. Furthermore, a capacitor having one electrode electrically connected to the node B may be additionally provided in order to hold a potential of the node B.

Figure 15B:
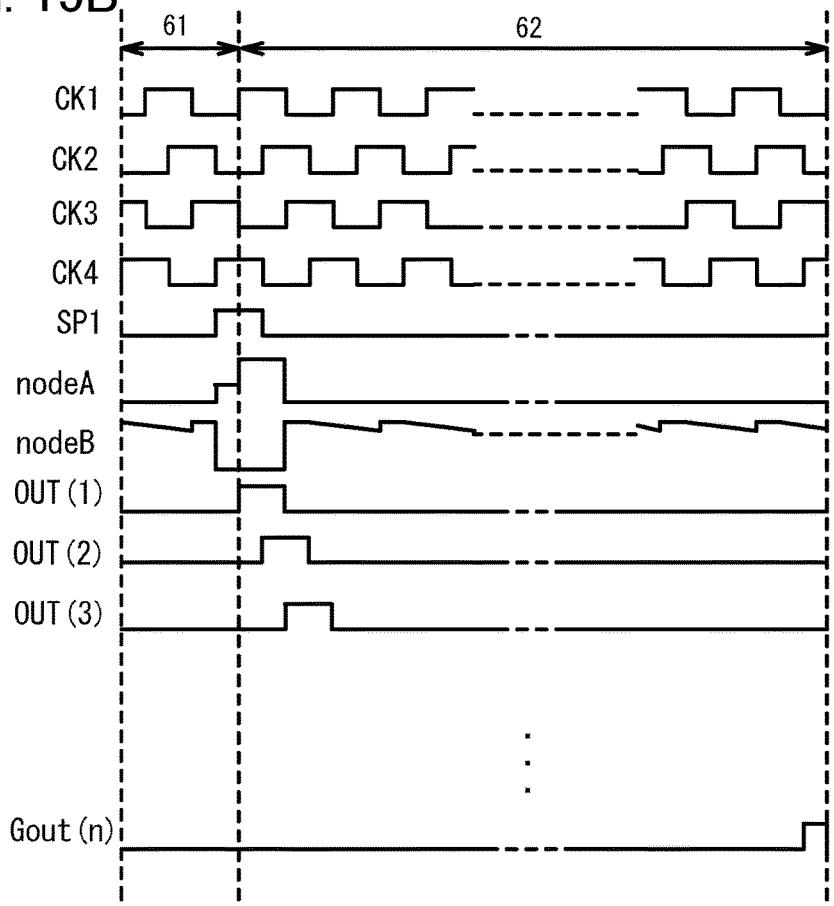

FIG. 15B is a timing chart of a shift register including a plurality of pulse output circuits illustrated in FIG. 15A. Note that when the shift register is included in a scan line driver circuit, a period 61 in FIG. 15B corresponds to a vertical retrace period and a period 62 corresponds to a gate selection period.

Note that by providing the ninth transistor 39 in which the second power supply potential VCC is applied to the gate as illustrated in FIG. 15A, the following advantages before and after bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31.

Consequently, in the first transistor 31, high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, provision of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the transistor including an oxide semiconductor less deteriorates by application of a high potential to a gate electrode as compared with a transistor including amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 may be supplied from the second input terminal 22 and the third input terminal 23, respectively. At this time, in the shift register illustrated in FIG. 15A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in the case where a state of the seventh transistor 37 and the eighth transistor 38 in the shift register illustrated in FIG. 15A is changed as in FIG. 15B so that both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by fall in potentials of the second input terminal 22 and the third input terminal 23, is caused only once by fall in potential of the gate electrode of the eighth transistor 38. Therefore, the connection relation, that is, the clock signal is supplied from the third input terminal 23 to the gate electrode of the seventh transistor 37 and the clock signal is supplied from the second input terminal 22 to the gate electrode of the eighth transistor 38, is preferable. That is because the number of times of the change in the potential of the node B can be reduced, whereby the noise can be decreased.

In such a manner, an H-level signal is regularly supplied to the node B in a period during which the potentials of the first output terminal 26 and the second output terminal 27 are held at an L level; thus, a malfunction of the pulse output circuit can be suppressed.

Embodiment 6

When a thin film transistor is manufactured and used for a pixel portion and further for a driver circuit, a semiconductor device having a display function (also referred to as a display device) can be manufactured. Furthermore, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. One embodiment of the present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having TAB tape or a TCP which is provided with a printed wiring board at the end thereof; and a module in which an integrated circuit (IC) is directly mounted on a display element by chip on glass (COG).

The appearance and a cross section of a liquid crystal display panel, which is one embodiment of a semiconductor device, will be described with reference to FIGS. 16A1, 16A2, and 16B. FIGS. 16A1 and 16A2 are each a top view of a panel in which thin film transistors 4010 and 4011 and a liquid crystal element 4013 are sealed between a first substrate 4001 and a second substrate 4006 with a sealant 4005. FIG. 16B is a cross-sectional view taken along line M-N of FIGS. 16A1 and 16A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the second substrate 4006, and the sealant 4005. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and COQ wire bonding, TAB, or the like can be used. FIG. 16A1 illustrates an example of mounting the signal line driver circuit 4003 by COQ and FIG. 16A2 illustrates an example of mounting the signal line driver circuit 4003 by TAB.

The pixel portion 4002 and the scan line driver circuit 4004 provided over the first substrate 4001 each include a plurality of thin film transistors. FIG. 16B illustrates the thin film transistor 4010 included in the pixel portion 4002 and the thin film transistor 4011 included in the scan line driver circuit 4004. Protective insulating layers 4020 and 4021 are provided over the thin film transistors 4010 and 4011.

As the thin film transistors 4010 and 4011, any of the highly reliable thin film transistors including the oxide semiconductor layer, which are described in Embodiments 1 to 5, can be employed. As the thin film transistor 4011 used for the driver circuit, any of the thin film transistors 180, 181, and 183 described in Embodiments 1, 2, and 4 can be employed. As the thin film transistor 4010 used for a pixel, any of the thin film transistors 170, 171, and 173 described in Embodiments 1, 2, and 4 can be employed. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided in the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Further, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

Note that a light-transmitting substrate can be used as the first substrate 4001 and the second substrate 4006; glass, ceramics, or plastics can be used. The plastic may be a fiberglass-reinforced plastics (FRP) plate, a polyvinyl fluoride (PVF) film, a polyester film, or an acrylic resin film.

Reference numeral 4035 denotes a columnar spacer obtained by selectively etching an insulating film and is provided to control the distance (a cell gap) between the pixel electrode layer 4030 and the counter electrode layer 4031. Alternatively, a spherical spacer may be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of the cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal exhibiting a blue phase and a chiral agent has a short response speed of 1 msec or less, has optical isotropy, which makes the alignment process unneeded, and has a small viewing angle dependence.

One embodiment of the present invention can also be applied to a semi-transmissive liquid crystal display device, in addition to a transmissive liquid crystal display device.

An example of the liquid crystal display device is described in which a polarizing plate is provided on the outer surface of the substrate (on the viewer side) and a coloring layer (a color filter) and an electrode layer used for a display element are provided on the inner surface of the substrate in this order; however, the polarizing plate may be provided on the inner surface of the substrate. The stacked-layer structure of the polarizing plate and the coloring layer is not limited to that described in this embodiment and may be set as appropriate in a manner that depends on materials of the polarizing plate and the coloring layer or conditions of manufacturing steps. Further, a light-blocking film serving as a black matrix may be provided in a portion other than the display portion.

The protective insulating layer 4020 is provided over the thin film transistors 4010 and 4011. The protective insulating layer 4020 can be formed using a material and a method similar to those of the oxide insulating layer 107 described in Embodiment 1, but here, a silicon nitride film is formed by an RF sputtering method as the protective insulating layer 4020.

The insulating layer 4021 is formed as the planarization insulating film. The insulating layer 4021 may be formed using a material and a method similar to those of the planarization insulating layer 109 described in Embodiment 1. Specifically, an organic material having heat resistance such as acrylic, polyimide, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using any of these materials.

There is no particular limitation on the method for forming the insulating layer 4021, and any of the following can be used depending on a material thereof: a method such as a sputtering method, an SOG method, spin coating, dipping, spray coating, or a droplet discharging method (e.g., an inkjet method, screen printing, or offset printing); a tool such as doctor knife, roll coater, curtain coater, or knife coater; or the like. The baking step of the insulating layer 4021 also serves as the annealing step of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used for the pixel electrode layer 4030 and the counter electrode layer 4031. The pixel electrode formed using the conductive composition preferably has a sheet resistance of 10000 ohms per square or less and a transmittance of 70% or more at a wavelength of 550 nm. Furthermore, the resistivity of the conductive macromolecule contained in the conductive composition is preferably 0.1 Ω·cm or less.

As the conductive macromolecule, a so-called t-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied from an FPC 4018 to the signal line driver circuit 4003 that is formed separately, and the scan line driver circuit 4004 or the pixel portion 4002.

A connection terminal electrode 4015 is formed from the same conductive film as the pixel electrode layer 4030 included in the liquid crystal element 4013, and a terminal electrode 4016 is formed from the same conductive film as source and drain electrode layers of the thin film transistor 4011.

The connection terminal electrode 4015 is electrically connected to a terminal included in the FPC 4018 through an anisotropic conductive film 4019.

Note that FIGS. 16A1, 16A2, and 16B illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Figure 17:
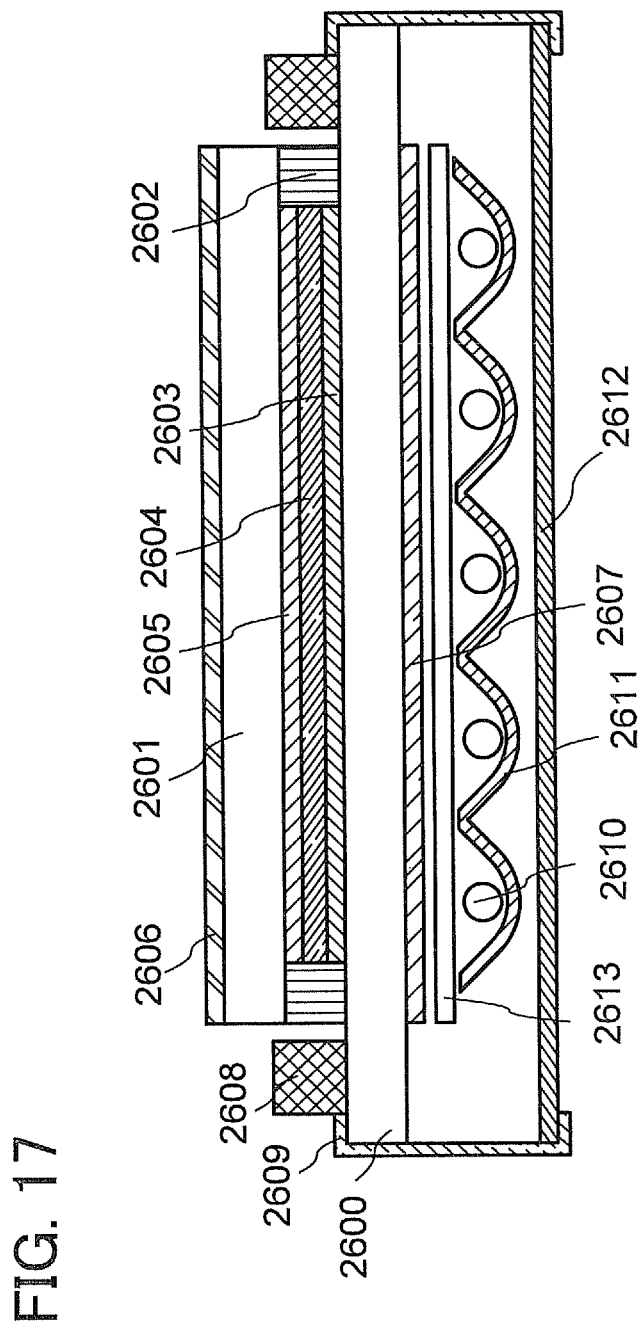
FIG. 17 is a diagram illustrating a semiconductor device.

FIG. 17 illustrates an example of a liquid crystal display module which is formed as a semiconductor device by using a TFT substrate 2600 manufactured in accordance with the manufacturing method disclosed in this specification.

FIG. 17 illustrates an example of a liquid crystal display module, in which the TFT substrate 2600 and a counter substrate 2601 are attached to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured.

This embodiment can be implemented in combination with any of the structures disclosed in the other embodiments as appropriate.

Embodiment 7

When a semiconductor device disclosed in this specification has flexibility, it can be applied to a display portion in electronic book (e-book) readers, posters, advertisement in vehicles such as trains, a variety of cards such as credit cards, and the like. An example of the electronic devices is illustrated in FIG. 18.

Figure 18:
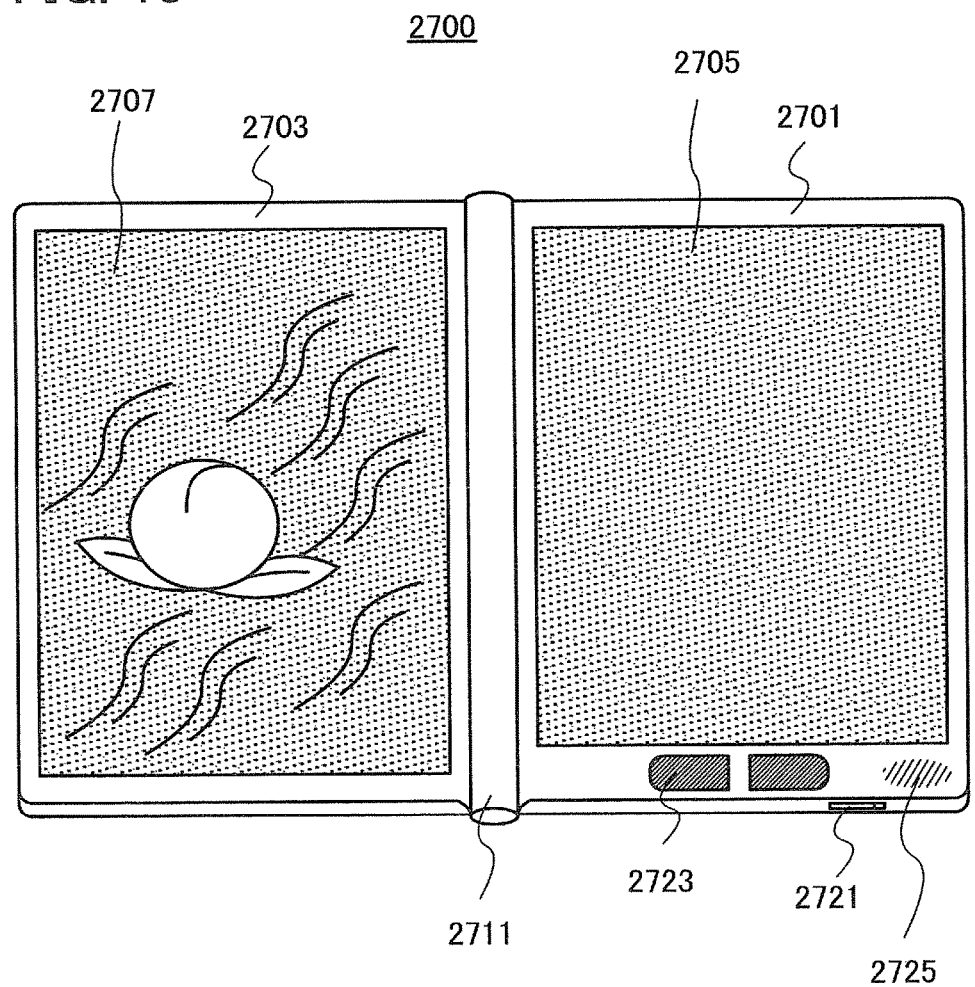
FIG. 18 is an external view illustrating an example of an electronic book reader.

FIG. 18 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 18) and images can be displayed on a display portion on the left side (the display portion 2707 in FIG. 18).

FIG. 18 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive information wirelessly. Through wireless communication, desired book data or the like can be purchased and downloaded from an electronic book server.

Embodiment 8

A semiconductor device disclosed in this specification can be applied to a variety of electronic devices (including amusement machines). Examples of electronic devices include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 19A:
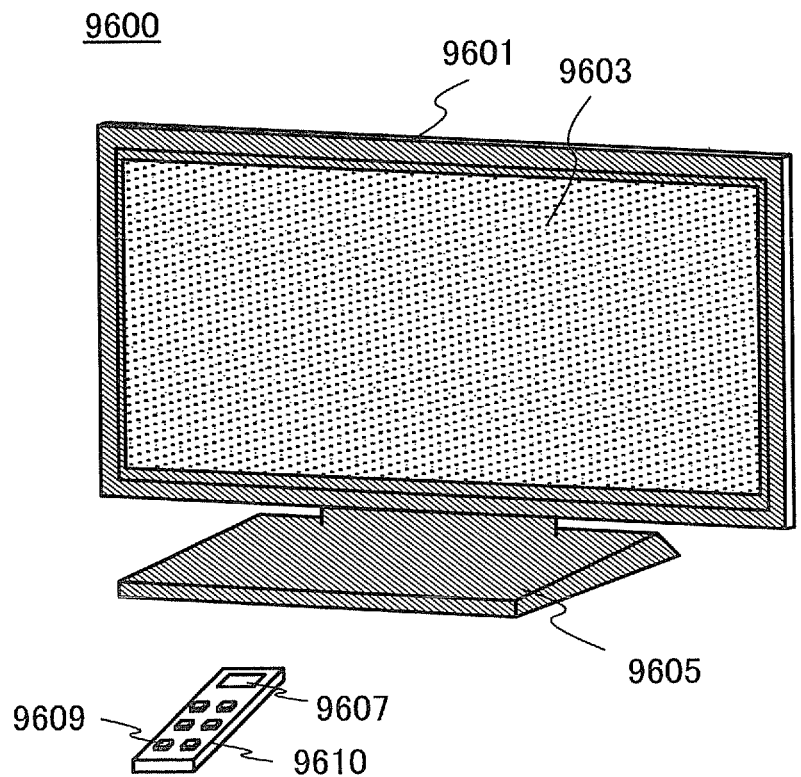
FIGS. 19A and 19B are external views illustrating examples of a television device and a digital photo frame, respectively.

FIG. 19A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 which displays data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 19B:
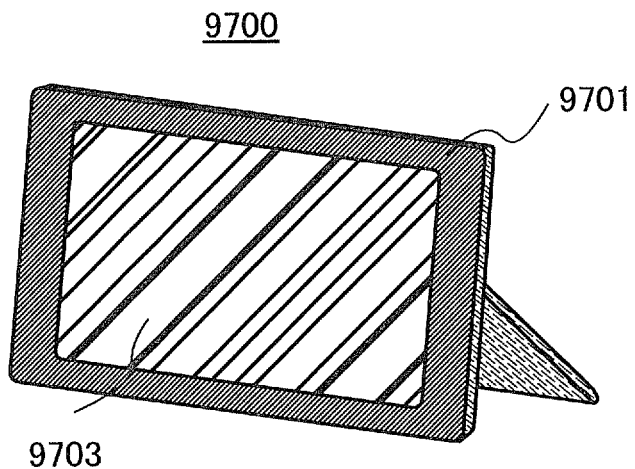

FIG. 19B illustrates an example of a digital photo frame. For example, in a digital photo frame 9700, a display portion 9703 is incorporated in a housing 9701. Various images can be displayed on the display portion 9703. For example, the display portion 9703 can display image data taken with a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion 9703, it is preferable to provide them on the side surface or the back surface because the design thereof is improved. For example, a memory in which image data taken with a digital camera is stored is inserted in the recording medium insertion portion of the digital photo frame 9700, whereby the image data can be displayed on the display portion 9703.

The digital photo frame 9700 may send and receive information wirelessly. Through wireless communication, desired image data can be downloaded to be displayed.

Figure 20A:
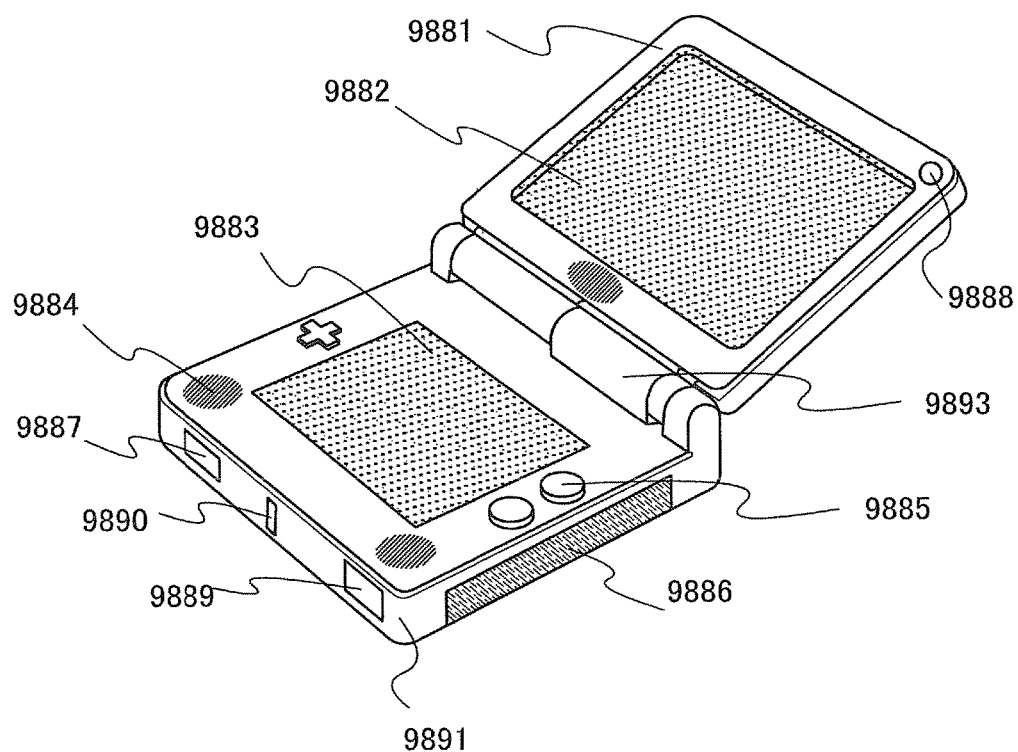
FIGS. 20A and 20B are external views illustrating examples of game machines.

FIG. 20A illustrates a portable amusement machine including two housings, a housing 9881 and a housing 9891. The housings 9881 and 9891 are connected with a connection portion 9893 so that the portable amusement machine can be opened and closed. A display portion 9882 and a display portion 9883 are incorporated in the housing 9881 and the housing 9891, respectively. In addition, the portable amusement machine illustrated in FIG. 20A includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above, and other structures provided with at least a semiconductor device disclosed in this specification may be employed. The portable amusement machine may include other accessory equipment as appropriate. The portable amusement machine illustrated in FIG. 20A has a function of reading a program or data stored in a recording medium to display it on the display portion, and a function of sharing information with another portable amusement machine by wireless communication. The portable amusement machine illustrated in FIG. 20A can have various functions without limitation to the above.

Figure 20B:
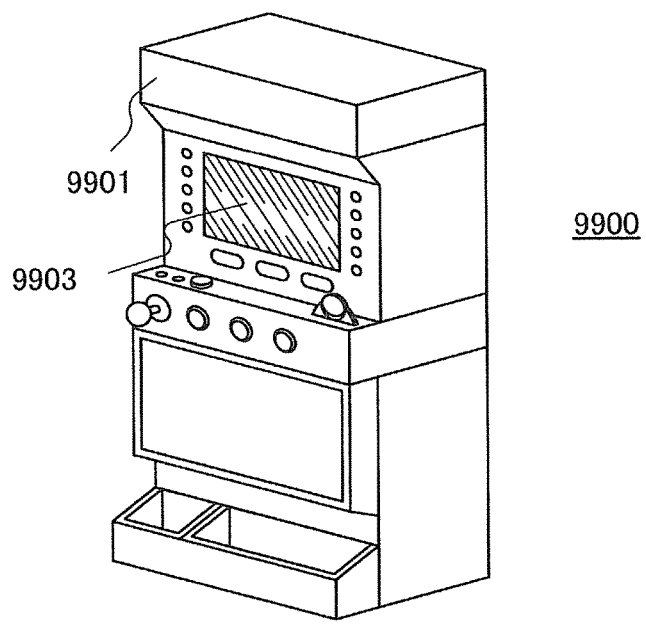

FIG. 20B illustrates an example of a slot machine which is a large-sized amusement machine. In a slot machine 9900, a display portion 9903 is incorporated in a housing 9901. In addition, the slot machine 9900 includes an operation unit such as a start lever or a stop switch, a coin slot, a speaker, and the like. It is needless to say that the structure of the slot machine 9900 is not limited to the above, and other structures provided with at least a semiconductor device disclosed in this specification may be employed. The slot machine 9900 may include other accessory equipment as appropriate.

Figure 21A:
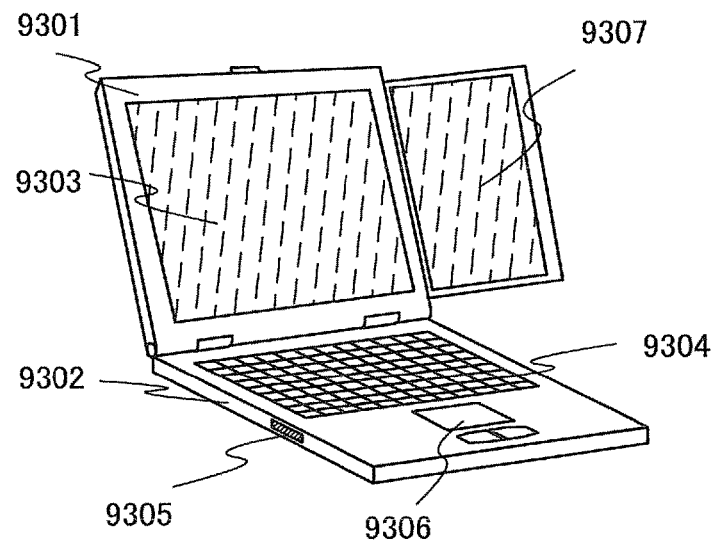
FIGS. 21A and 21B are external views illustrating examples of a portable computer and a cellular phone, respectively.

FIG. 21A is a perspective view illustrating an example of a portable computer.

In the portable computer in FIG. 21A, a top housing 9301 having a display portion 9303 and a bottom housing 9302 having a keyboard 9304 can overlap with each other by closing a hinge unit which connects the top housing 9301 and the bottom housing 9302. The portable computer in FIG. 21A can be convenient for carrying, and in the case of using the keyboard for input, the hinge unit is opened so that the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device of a liquid crystal display panel, a light-emitting display panel such as an organic light-emitting element or an inorganic light-emitting element, or the like.

In addition, the portable computer in FIG. 21A, which can be provided with a receiver and the like, can receive a television broadcast to display an image on the display portion 9303 or the display portion 9307. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit which displays the television broadcast is performed. Therefore, power consumption can be minimized, which is advantageous for the portable computer whose battery capacity is limited.

Figure 21B:
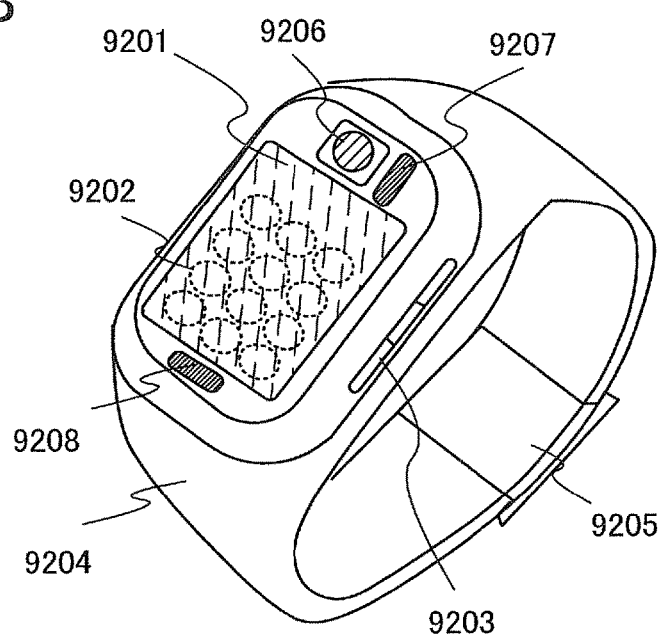

FIG. 21B is a perspective view illustrating an example of a cellular phone that the user can wear on the wrist like a wristwatch.

This cellular phone includes a main body which includes a battery and a communication device having at least a telephone function; a band portion 9204 which enables the main body to be worn on the wrist; an adjusting portion 9205 which adjusts the band portion 9204 to fit the wrist; a display portion 9201; a speaker 9207; and a microphone 9208.

In addition, the main body includes operation switches 9203. The operation switches 9203 serve, for example, as a switch for starting a program for the Internet when the switch is pushed, in addition to serving as a switch for turning on a power source, a switch for shifting a display, a switch for instructing to start taking images, or the like, and can be configured to have respective functions.

Input to this cellular phone is operated by touching the display portion 9201 with a finger, an input pen, or the like, by operating the operation switches 9203, or by inputting voice into the microphone 9208. Note that displayed buttons 9202 which are displayed on the display portion 9201 are illustrated in FIG. 21B. Input can be performed by touching the displayed buttons 9202 with a finger or the like.

Further, the main body includes a camera portion 9206 including an image pick-up unit having a function of converting an image of an object, which is formed through a camera lens, to an electronic image signal. Note that the camera portion is not necessarily provided.

The cellular phone illustrated in FIG. 21B, which can be provided with a receiver of a television broadcast and the like, can display an image on the display portion 9201 by receiving a television broadcast. In addition, the cellular phone illustrated in FIG. 21B may be provided with a storage device and the like such as a memory, and thus can record a television broadcast in the memory. The cellular phone illustrated in FIG. 21B may have a function of collecting location information, such as GPS.

The display portion 9201 is formed using an image display device of a liquid crystal display panel, a light-emitting display panel such as an organic light-emitting element or an inorganic light-emitting element, or the like. The cellular phone illustrated in FIG. 21B is compact and lightweight and thus has limited battery capacity. Therefore, a panel which can be driven with low power consumption is preferably used as a display device for the display portion 9201.

Note that FIG. 21B illustrates the electronic device which is worn on the wrist; however, this embodiment is not limited thereto as long as a portable shape is employed.

Embodiment 9

In this embodiment, an example of a display device including the thin film transistor described in any of Embodiments 1 to 6 will be described as one embodiment of a semiconductor device with reference to FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, and FIG. 35. In this embodiment, an example of a liquid crystal display device including a liquid crystal element as a display element will be described with reference to FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, and FIG. 35. As TFTs 628 and 629 used for the liquid crystal display devices in FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, and FIG. 35, the thin film transistor described in any of Embodiments 1, 2, 5, and 6 can be employed. The TFTs 628 and 629 are thin film transistors having high electric characteristics and reliability, which can be manufactured in a process similar to that described in any of Embodiments 1 to 6.

First, a vertical alignment (VA) liquid crystal display device is described. The VA liquid crystal display device employs a method of controlling alignment of liquid crystal molecules of a liquid crystal display panel. In the VA liquid crystal display device, liquid crystal molecules are aligned in a vertical direction with respect to a panel surface when no voltage is applied. In this embodiment, in particular, a pixel is divided into several regions (subpixels), and molecules are aligned in different directions in their respective regions. This is referred to as multi-domain or multi-domain design. A liquid crystal display device of multi-domain design is described below.

Figure 22:
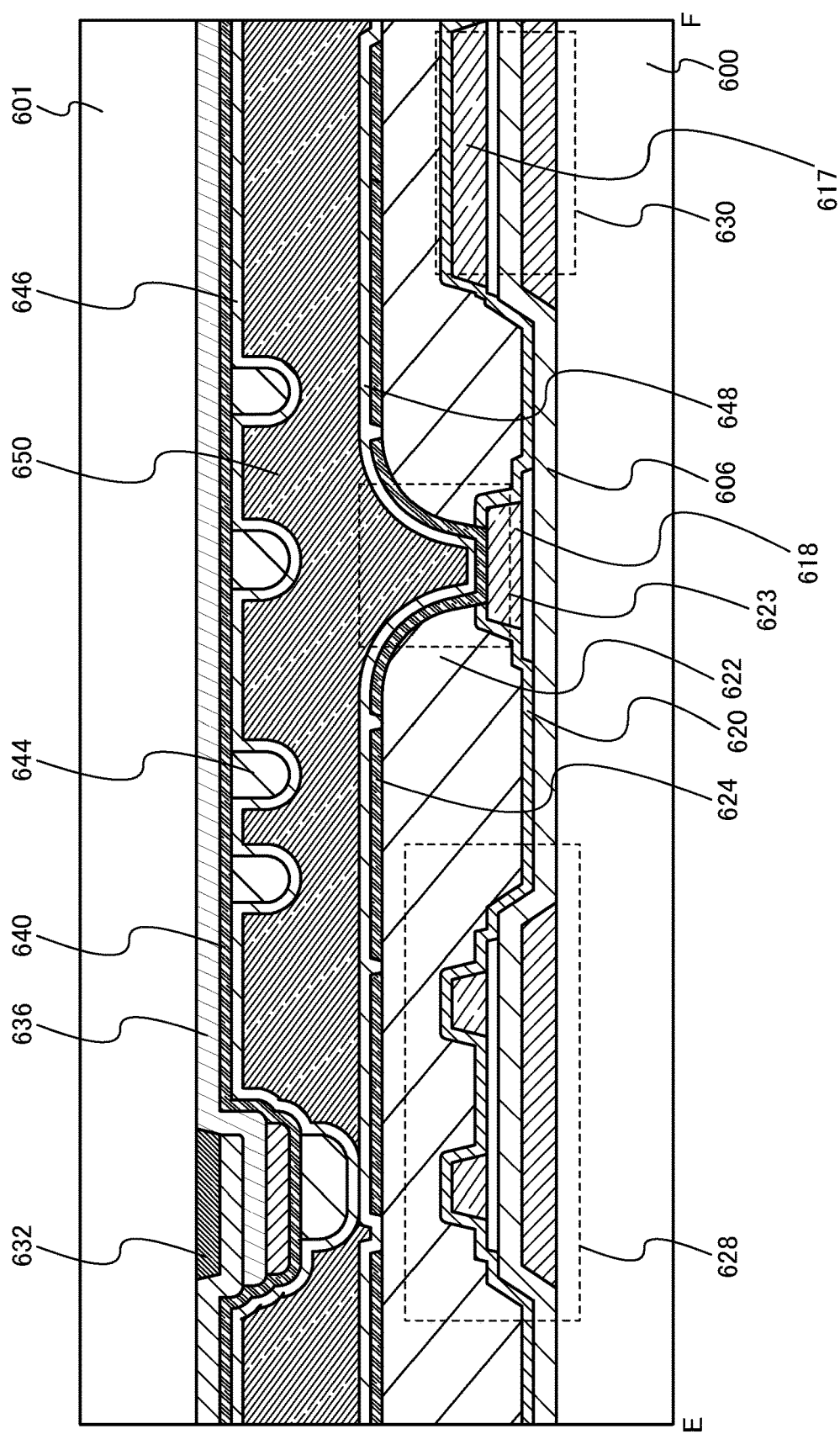
FIG. 22 is a diagram illustrating a semiconductor device.
Figure 23:
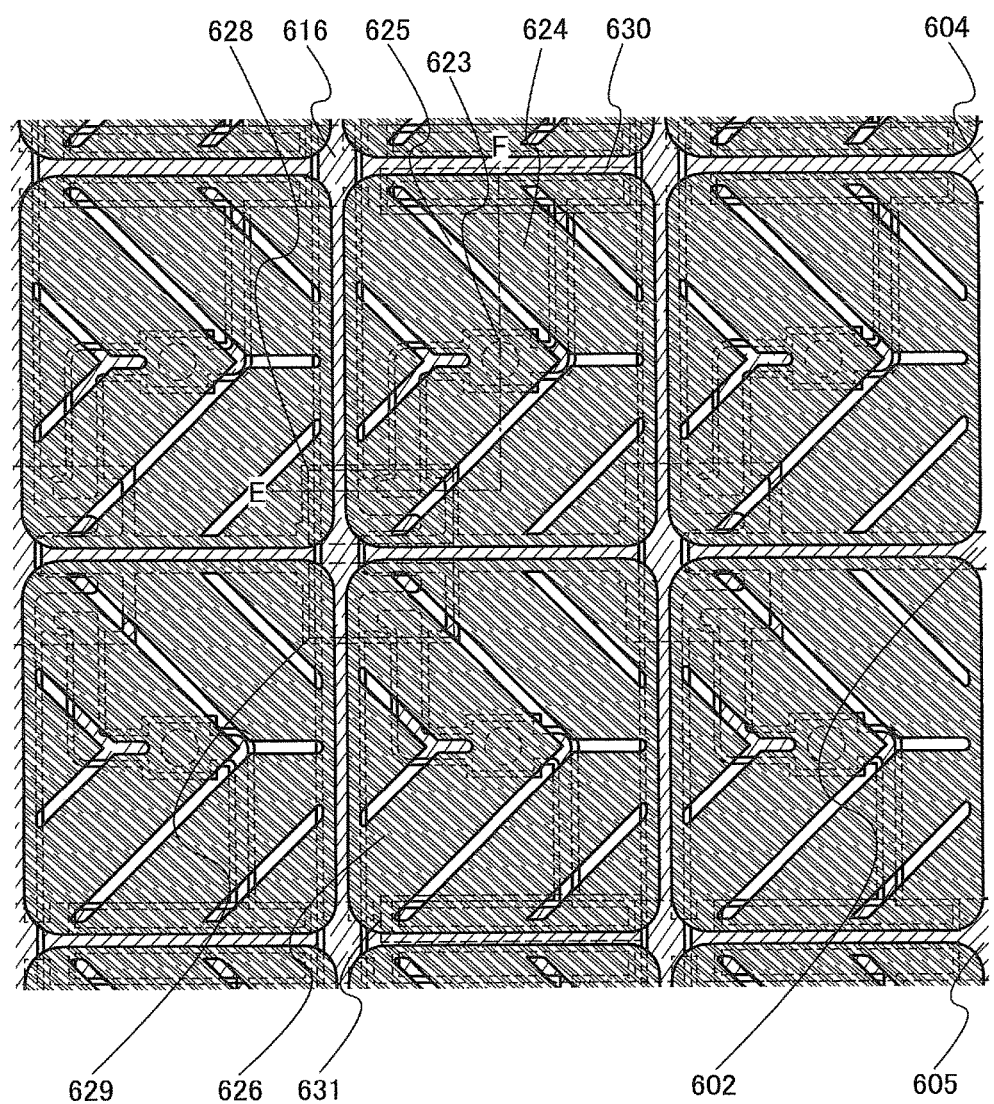
FIG. 23 is a diagram illustrating a semiconductor device.
Figure 24:
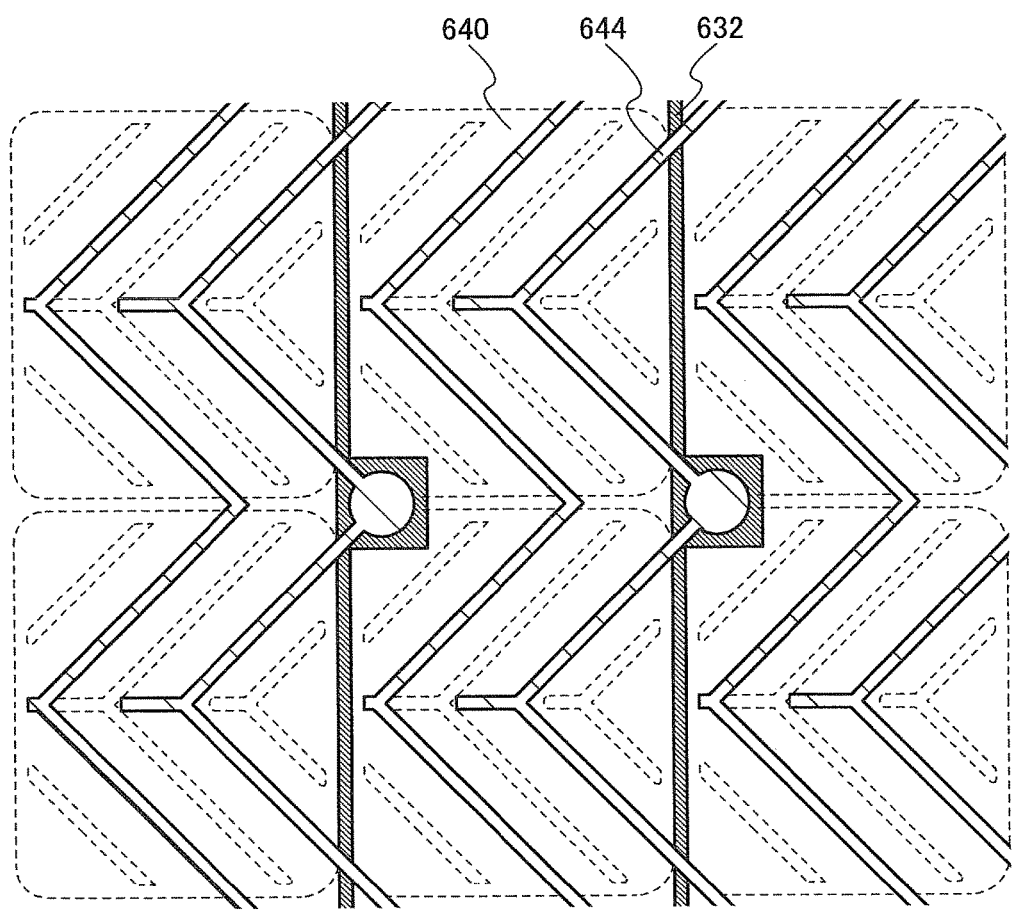
FIG. 24 is a diagram illustrating a semiconductor device.

FIG. 23 and FIG. 24 illustrate a pixel electrode and a counter electrode, respectively. FIG. 23 is a plan view on a substrate side over which the pixel electrode is formed. FIG. 22 illustrates a cross-sectional structure taken along line E-F of FIG. 23. FIG. 24 is a plan view on a substrate side on which the counter electrode is formed. Hereinafter, description is made with reference to these drawings.

In FIG. 22, a substrate 600 over which the TFT 628, a pixel electrode layer 624 connected to the TFT 628, and a storage capacitor portion 630 are formed and a counter substrate 601 on which a counter electrode layer 640 and the like are formed overlap with each other, and liquid crystals are injected between the substrates.

The counter substrate 601 is provided with a coloring film 636 and the counter electrode layer 640, and projections 644 are formed on the counter electrode layer 640. An alignment film 648 is formed over the pixel electrode layer 624. Similarly, the counter electrode layer 640 and the projections 644 are provided with an alignment film 646. A liquid crystal layer 650 is formed between the substrate 600 and the counter substrate 601.

As the spacer, a columnar spacer may be formed or a bead spacer may be dispersed. When the spacer has a light-transmitting property, it may be formed over the pixel electrode layer 624 over the substrate 600.

The TFT 628, the pixel electrode layer 624 connected to the TFT 628, and the storage capacitor portion 630 are formed over the substrate 600. The pixel electrode layer 624 is connected to a wiring 618 in a contact hole 623 that is formed in an insulating film 620 covering the TFT 628, the wiring 616, and the storage capacitor portion 630, and an insulating film 622 covering the insulating film 620. The thin film transistor described in any of Embodiments 1 to 6 can be used as appropriate as the TFT 628. Further, the storage capacitor portion 630 includes a first capacitor wiring 604 that is formed at the same time as a gate wiring 602 of the TFT 628; a gate insulating layer 606; and a second capacitor wiring 617 that is formed at the same time as the wiring 618.

The pixel electrode layer 624, the liquid crystal layer 650, and the counter electrode layer 640 overlap with each other, so that a liquid crystal element is formed.

FIG. 23 illustrates a structure over the substrate 600. The pixel electrode layer 624 is formed using a material described in Embodiment 1. Slits 625 are formed in the pixel electrode layer 624. The slits 625 are formed to control alignment of the liquid crystals.

The TFT 629, a pixel electrode layer 626 connected to the TFT 629, and a storage capacitor portion 631, which are illustrated in FIG. 23, can be formed in a similar manner to that of the TFT 628, the pixel electrode layer 624, and the storage capacitor portion 630, respectively. Both of the TFTs 628 and 629 are connected to the wiring 616. A pixel of this liquid crystal display panel includes the pixel electrode layers 624 and 626. The pixel electrode layers 624 and 626 are subpixels.

FIG. 24 illustrates a plan structure on the counter substrate side. The counter electrode layer 640 is formed over a light-blocking film 632. The counter electrode layer 640 is preferably formed using a material similar to that of the pixel electrode layer 624. The projections 644 that control alignment of liquid crystals are formed over the counter electrode layer 640. Note that in FIG. 24, dashed line indicates the pixel electrode layers 624 and 626 which are formed over the substrate 600, and the counter electrode layer 640 is provided to overlap with the pixel electrode layers 624 and 626.

Figure 25:
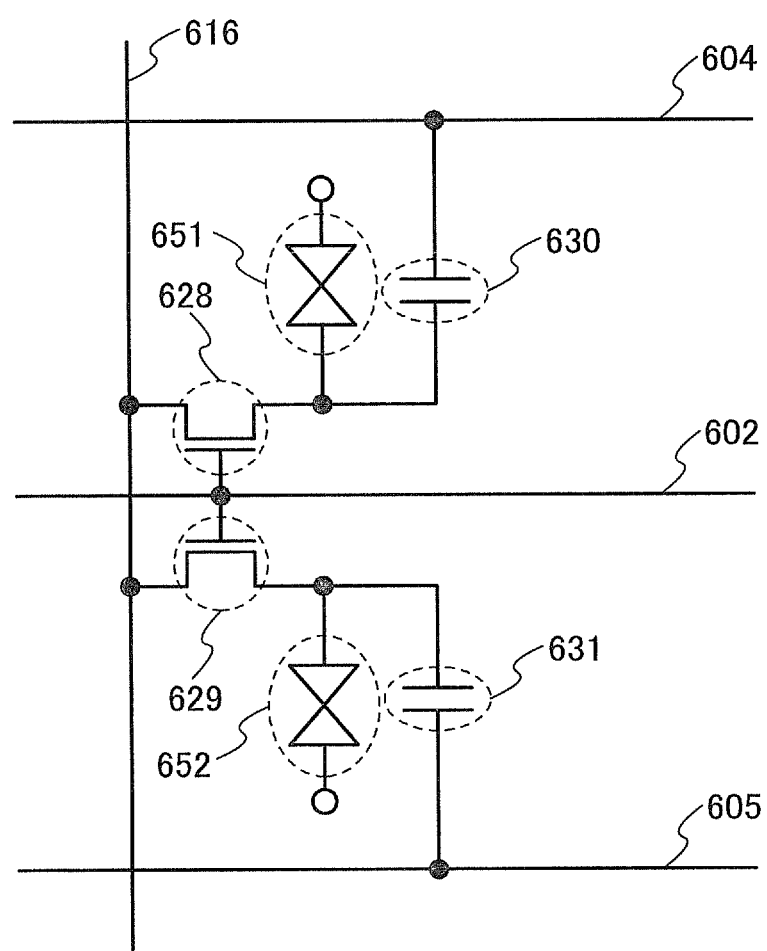
FIG. 25 is a diagram illustrating a semiconductor device.

FIG. 25 illustrates an equivalent circuit of this pixel structure. Both of the TFTs 628 and 629 are connected to the gate wiring 602 and the wiring 616. In this case, by making the potential of the capacitor wiring 604 different from that of a capacitor wiring 605, operation of a liquid crystal element 651 can be different from that of a liquid crystal element 652. That is, potentials of the capacitor wirings 604 and 605 are controlled individually, whereby alignment of liquid crystals is precisely controlled and the viewing angle is increased.

When voltage is applied to the pixel electrode layer 624 provided with the slits 625, a distorted electric field (an oblique electric field) is generated in the vicinity of the slits 625. The slits 625 and the projections 644 on the counter substrate 601 side are disposed so as not to overlap with each other, whereby the oblique electric field is effectively generated to control alignment of the liquid crystals, and thus the direction in which the liquid crystals are aligned is different depending on the location. That is, the viewing angle of a liquid crystal display panel is increased by employing multi-domain.

Next, a VA liquid crystal display device different from the above is described with reference to FIG. 26, FIG. 27, FIG. 28, and FIG. 29.

Figure 26:
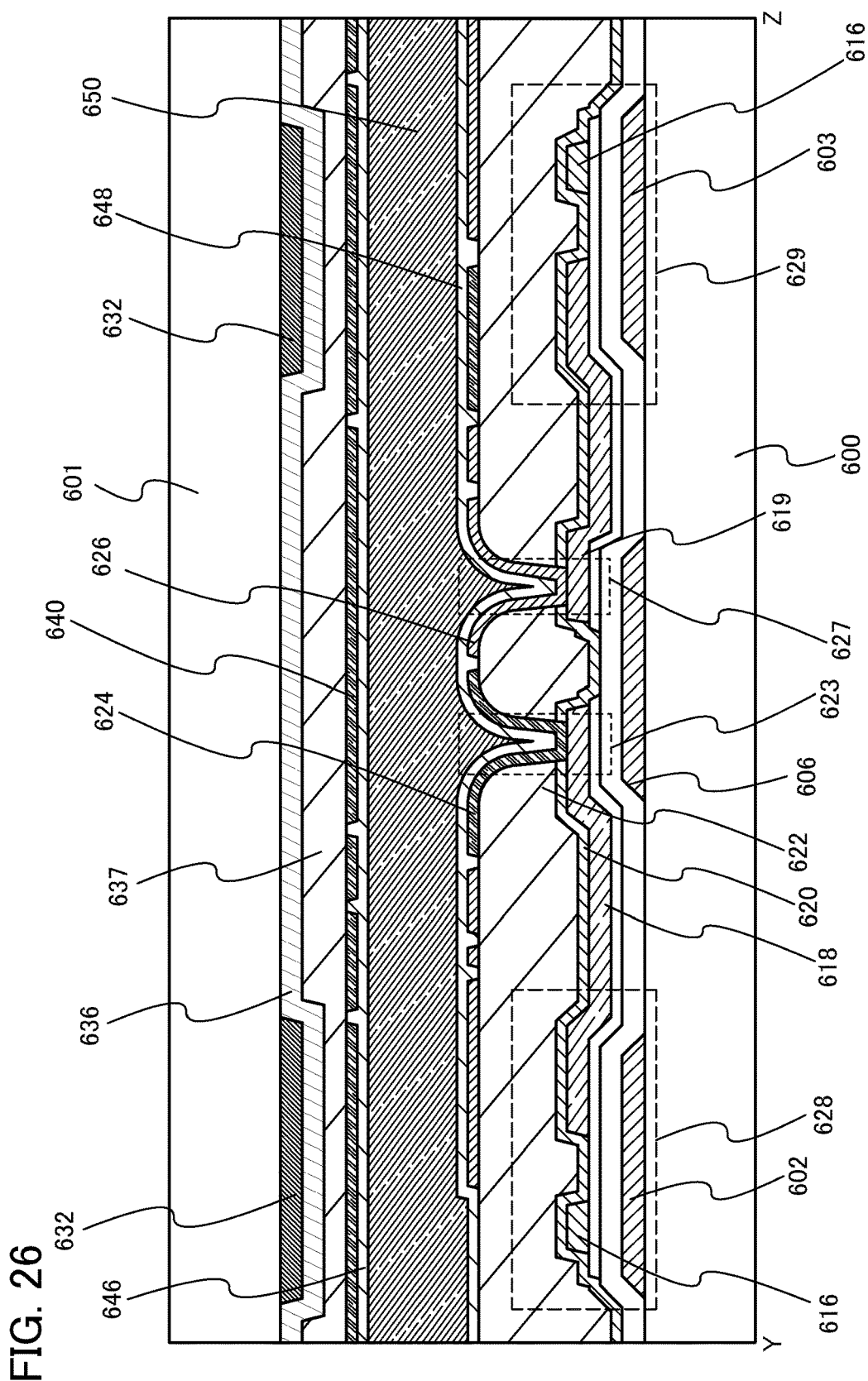
FIG. 26 is a diagram illustrating a semiconductor device.
Figure 27:
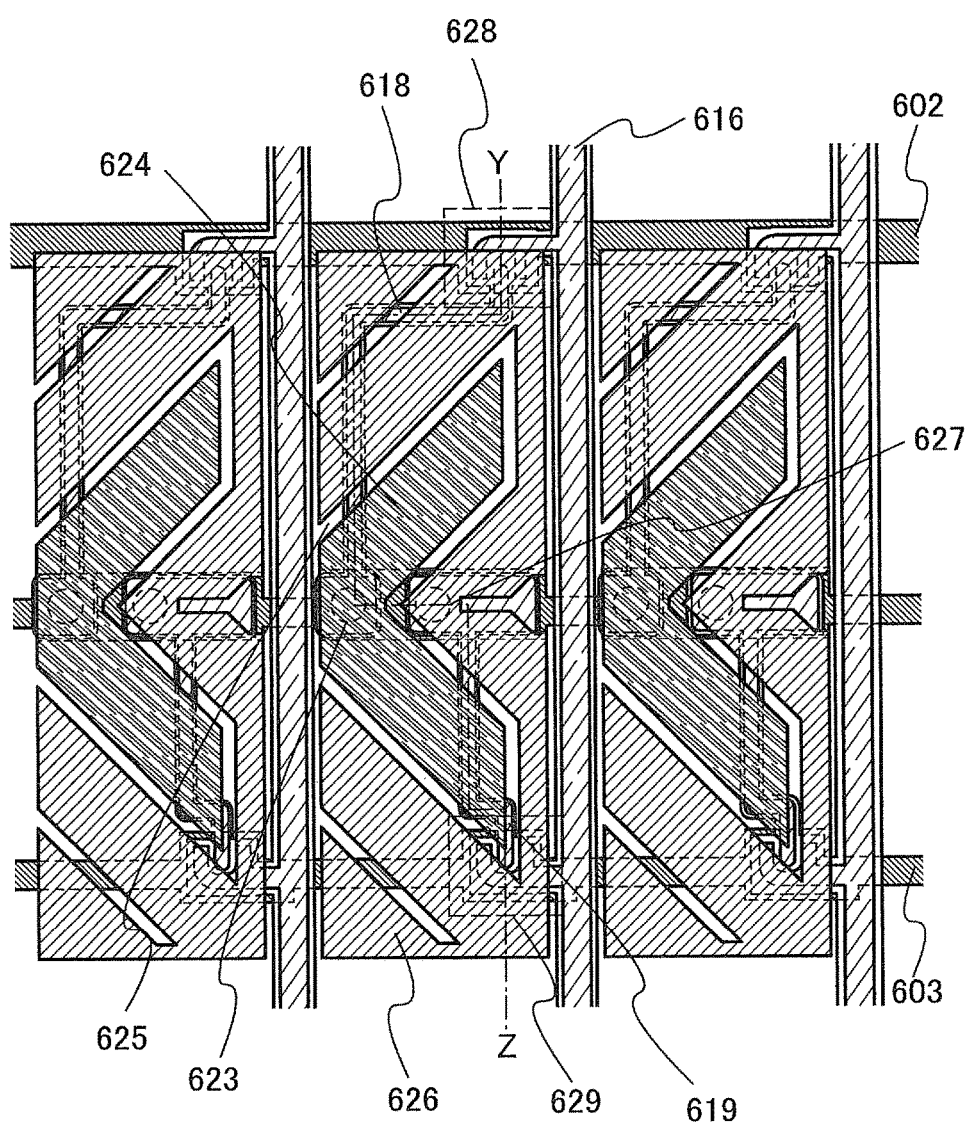
FIG. 27 is a diagram illustrating a semiconductor device.

FIG. 26 and FIG. 27 illustrate a pixel structure of a VA liquid crystal display panel. FIG. 27 is a plan view over the substrate 600. FIG. 26 illustrates a cross-sectional structure taken along line Y-Z in FIG. 27.

In this pixel structure, one pixel has a plurality of pixel electrodes, and a TFT is connected to each of the pixel electrodes. Each TFT is driven with a gate signal different from each other. Specifically, in the pixel of multi-domain design, a signal applied to each pixel electrode is controlled independently.

The pixel electrode layer 624 is connected to the TFT 628 in the contact hole 623 which is formed in the insulating film 620 and the insulating film 622 through the wiring 618. In addition, the pixel electrode layer 626 is connected to the TFT 629 in a contact hole 627 which is formed in the insulating film 620 and the insulating film 622 through a wiring 619. The gate wiring 602 of the TFT 628 is separated from a gate wiring 603 of the TFT 629 so that different gate signals can be supplied. On the other hand, the wiring 616 functioning as a data line is shared by the TFTs 628 and 629. The thin film transistors described in any of Embodiments 1 to 6 can be used as appropriate as the TFTs 628 and 629. Note that the gate insulating layer 606 is formed over the gate wiring 602 and the gate wiring 603.

Figure 29:
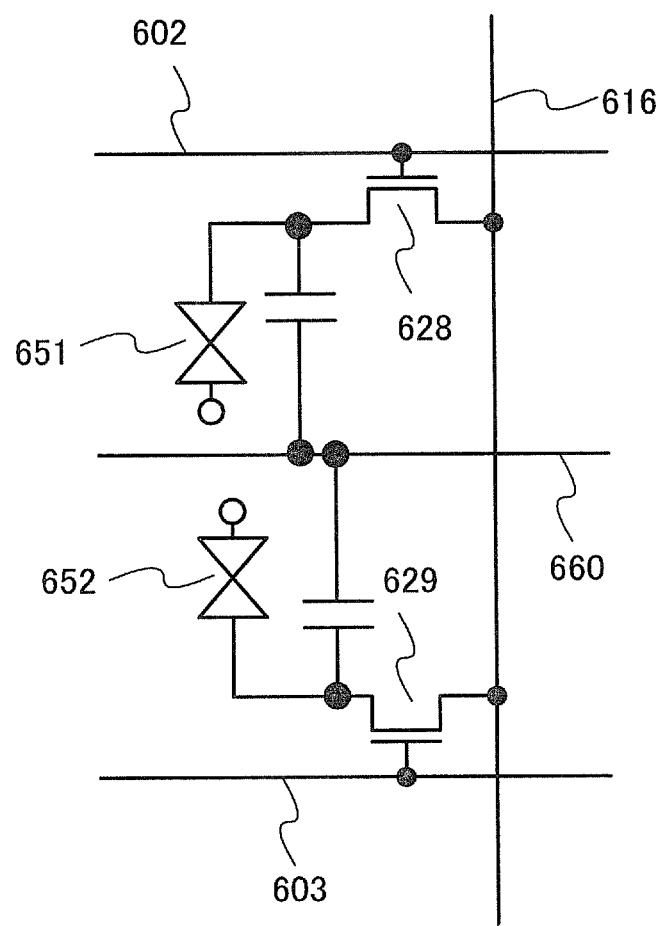
FIG. 29 is a diagram illustrating a semiconductor device.

The shape of the pixel electrode layer 624 is different from that of the pixel electrode layer 626, and the pixel electrode layers are separated by the slits 625. The pixel electrode layer 626 surrounds the pixel electrode layer 624, which has a V-shape. A voltage applied to the pixel electrode layer 624 by the TFT 628 is made to be different from a voltage applied to the pixel electrode layer 626 by the TFT 629, whereby alignment of liquid crystals is controlled. FIG. 29 illustrates an equivalent circuit of this pixel structure. The TFT 628 is connected to the gate wiring 602, and the TFT 629 is connected to the gate wiring 603. Further, the TFTs 628 and 629 are both connected to the wiring 616, and are connected to a capacitor wiring 660 through the capacitor. If different gate signals are supplied to the gate wirings 602 and 603, operation of the liquid crystal elements 651 and 652 can be different. In other words, when operation of the TFTs 628 and 629 is individually controlled, alignment of liquid crystals can be precisely controlled; accordingly, viewing angle can be increased.

Figure 28:
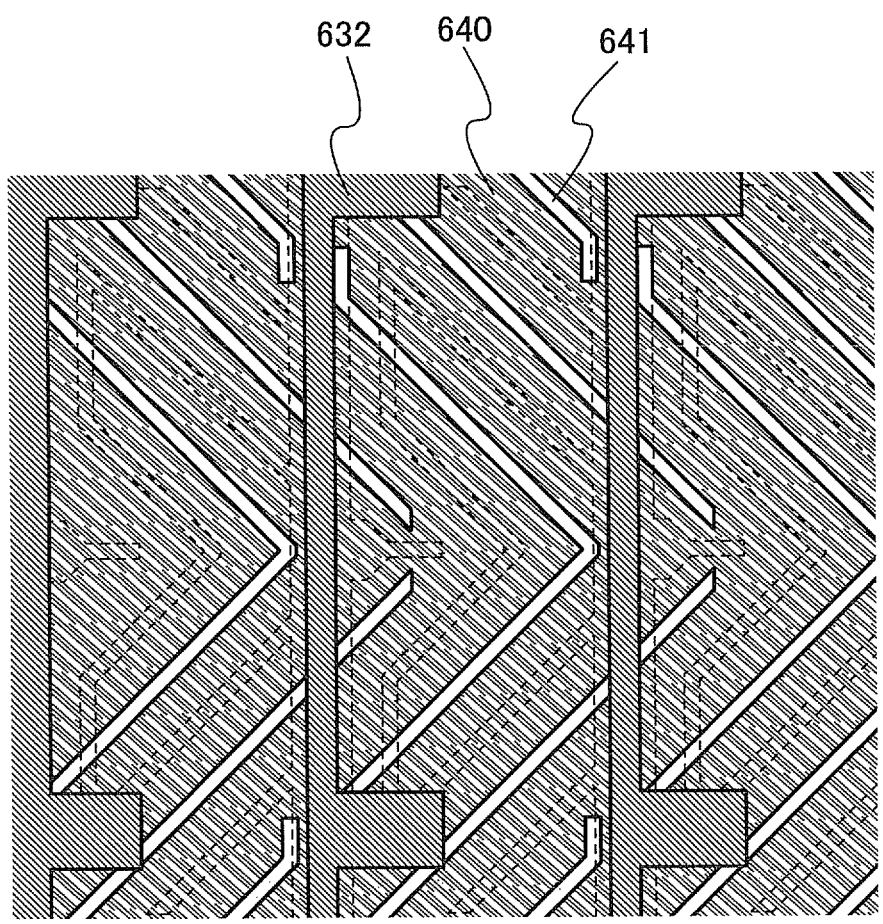
FIG. 28 is a diagram illustrating a semiconductor device.

The counter substrate 601 is provided with the coloring film 636 and the counter electrode layer 640. In addition, a planarization film 637 is formed between the coloring film 636 and the counter electrode layer 640, thereby preventing alignment disorder of liquid crystals. FIG. 28 illustrates a structure of the counter substrate side. The counter electrode layer 640 is shared by plural pixels, and slits 641 are formed in the counter electrode layer 640. The slits 641 and the slits 625 on the pixel electrode layers 624 and 626 side are disposed so as not to overlap with each other, whereby an oblique electric field is effectively generated and alignment of liquid crystals is controlled. Accordingly, the direction in which liquid crystals are aligned can be different depending on the location, and thus the viewing angle is increased. Note that in FIG. 28, dashed line indicates the pixel electrode layers 624 and 626 which are formed over the substrate 600, and the counter electrode layer 640 is provided to overlap with the pixel electrode layers 624 and 626.

The alignment film 648 is formed over the pixel electrode layers 624 and 626, and the alignment film 646 is formed on the counter electrode layer 640 in a similar manner. The liquid crystal layer 650 is formed between the substrate 600 and the counter substrate 601. Further, the pixel electrode layer 624, the liquid crystal layer 650, and the counter electrode layer 640 overlap with each other, so that a first liquid crystal element is formed. The pixel electrode layer 626, the liquid crystal layer 650, and the counter electrode layer 640 overlap with each other, so that a second liquid crystal element is formed. Furthermore, the pixel structure of the display panel illustrated in FIG. 30, FIG. 31, FIG. 32, and FIG. 33 is a multi-domain structure in which the first liquid crystal element and the second liquid crystal element are provided in one pixel.

Next, a liquid crystal display device of a horizontal electric field mode is described. In a horizontal electric field mode, an electric field is applied in a horizontal direction with respect to liquid crystal molecules in a cell, whereby liquid crystals are driven to express gray scales. In accordance with this method, the viewing angle can be expanded to approximately 180°. Hereinafter, a liquid crystal display device of the horizontal electric field mode is described.

Figure 30:
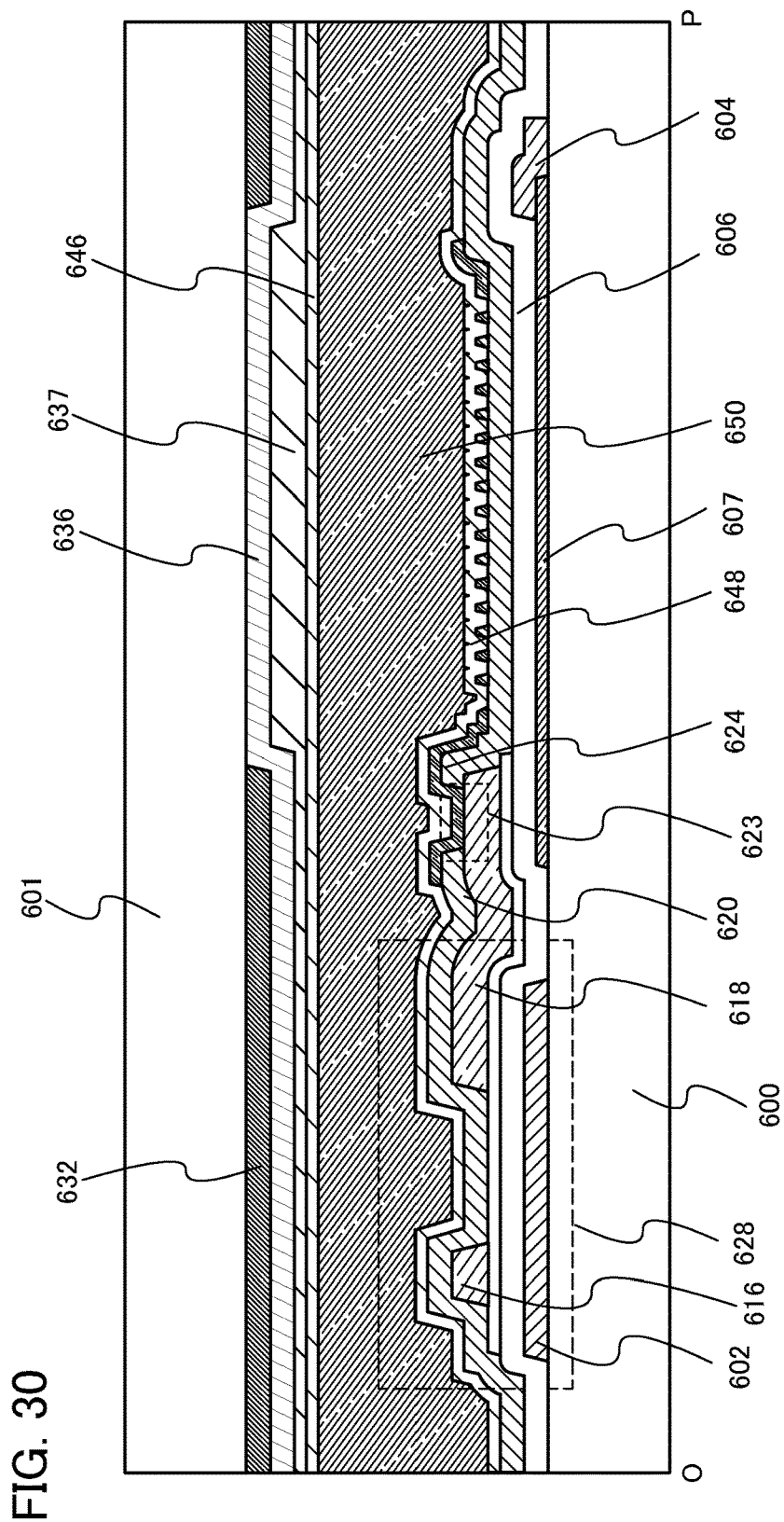
FIG. 30 is a diagram illustrating a semiconductor device.

In FIG. 30, the counter substrate 601 is superposed on the substrate 600 over which an electrode layer 607, the TFT 628, and the pixel electrode layer 624 connected to the TFT 628 are formed, and liquid crystals are injected therebetween. The counter substrate 601 is provided with the coloring film 636, the planarization film 637, and the like. Note that a counter electrode layer is not provided on the counter substrate 601 side. The liquid crystal layer 650 is formed between the substrate 600 and the counter substrate 601 with the alignment film 646 and the alignment film 648 interposed therebetween.

The electrode layer 607, the capacitor wiring 604 connected to the electrode layer 607, and the TFT 628 are formed over the substrate 600. The capacitor wiring 604 can be formed at the same time as the gate wiring 602 of the TFT 628. The thin film transistor described in any of Embodiments 1 to 6 can be employed as the TFT 628. The electrode layer 607 can be formed using a material similar to that of the pixel electrode layer described in any of Embodiments 1 to 6. The electrode layer 607 is formed in a shape which is compartmentalized roughly in a pixel shape. The gate insulating layer 606 is formed over the electrode layer 607 and the capacitor wiring 604.

The wirings 616 and 618 of the TFT 628 are formed over the gate insulating layer 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624.

The insulating film 620 is formed over the wirings 616 and 618. Further, the pixel electrode layer 624 that is connected to the wiring 618 through the contact hole 623 formed in the insulating film 620 is formed over the insulating film 620. The pixel electrode layer 624 is formed using a material similar to that of the pixel electrode layer described in any of Embodiments 1 to 6.

In this manner, the TFT 628 and the pixel electrode layer 624 connected thereto are formed over the substrate 600. A storage capacitor is formed with the electrode layer 607 and the pixel electrode layer 624.

Figure 31:
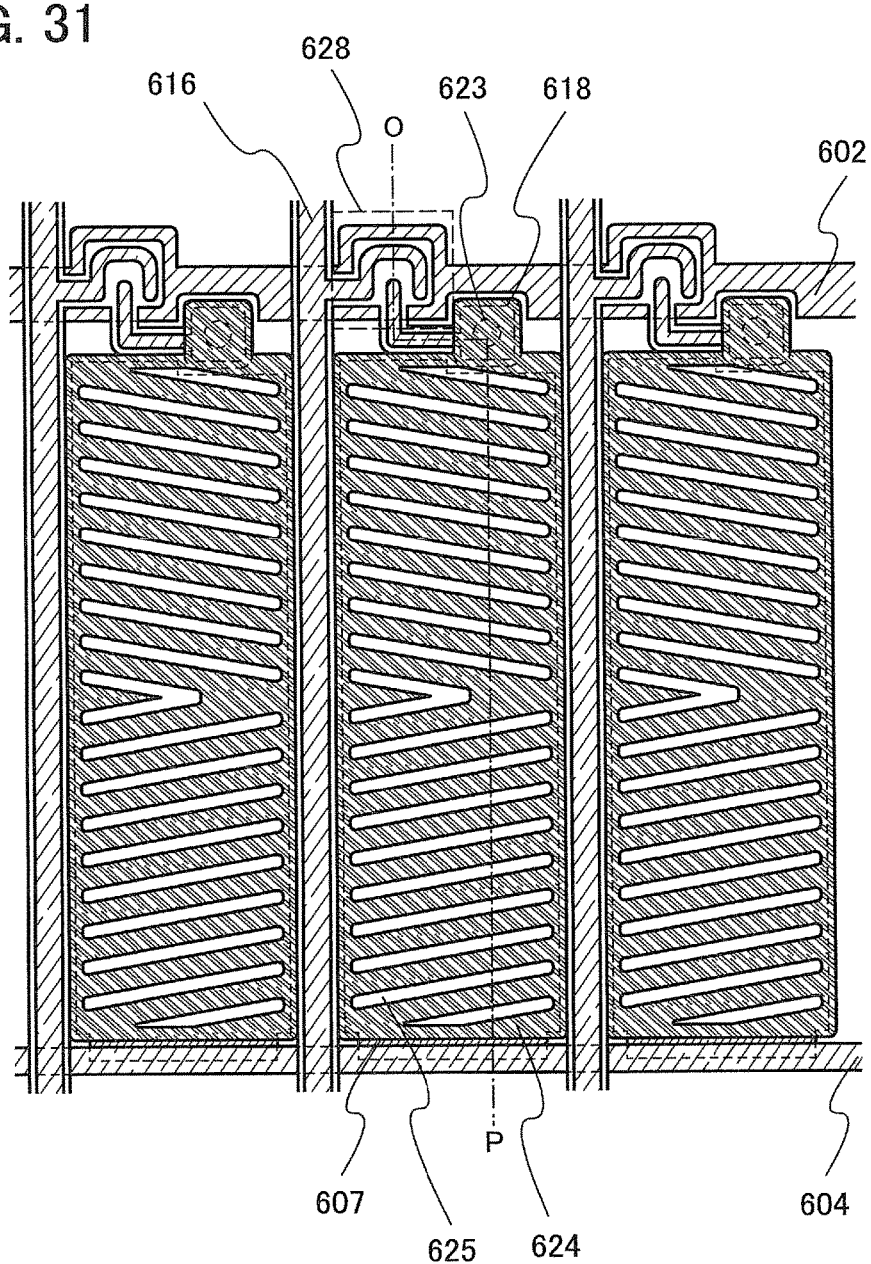
FIG. 31 is a diagram illustrating a semiconductor device.

FIG. 31 is a plan view illustrating a structure of the pixel electrode layer. A cross-sectional structure taken along line O-P of FIG. 31 is illustrated in FIG. 30. The pixel electrode layer 624 is provided with the slits 625. The slits 625 are provided to control alignment of liquid crystals. In this case, an electric field is generated between the electrode layer 607 and the pixel electrode layer 624. The gate insulating layer 606 is formed between the electrode layer 607 and the pixel electrode layer 624; however, the gate insulating layer 606 has a thickness of 50 nm to 200 nm, which is thin enough as compared with that of the liquid crystal layer with a thickness of 2 μm to 10 μm. Therefore, an electric field is generated in a direction which is substantially parallel to the substrate 600 (a horizontal direction). The alignment of the liquid crystals is controlled with this electric field. Liquid crystal molecules are horizontally rotated with the use of the electric field in the direction roughly parallel to the substrate.

In this case, since the liquid crystal molecules are horizontally aligned in any state, the contrast or the like is less influenced by the viewing angle; thus, the viewing angle is increased. In addition, the aperture ratio can be improved because both the electrode layer 607 and the pixel electrode layer 624 are light-transmitting electrodes.

Next, another example of a liquid crystal display device of a horizontal electric field mode is described.

Figure 32:
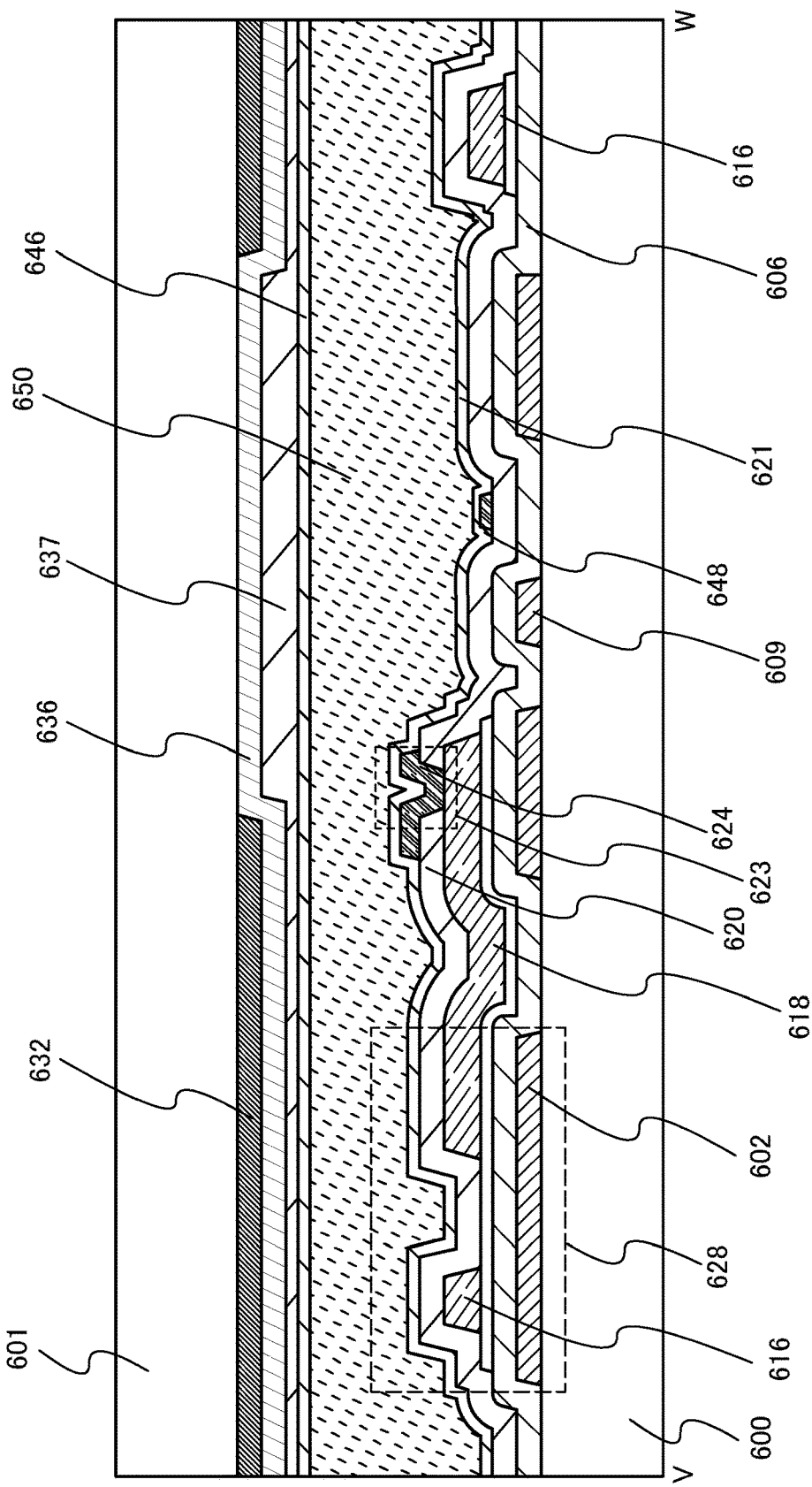
FIG. 32 is a diagram illustrating a semiconductor device.
Figure 33:
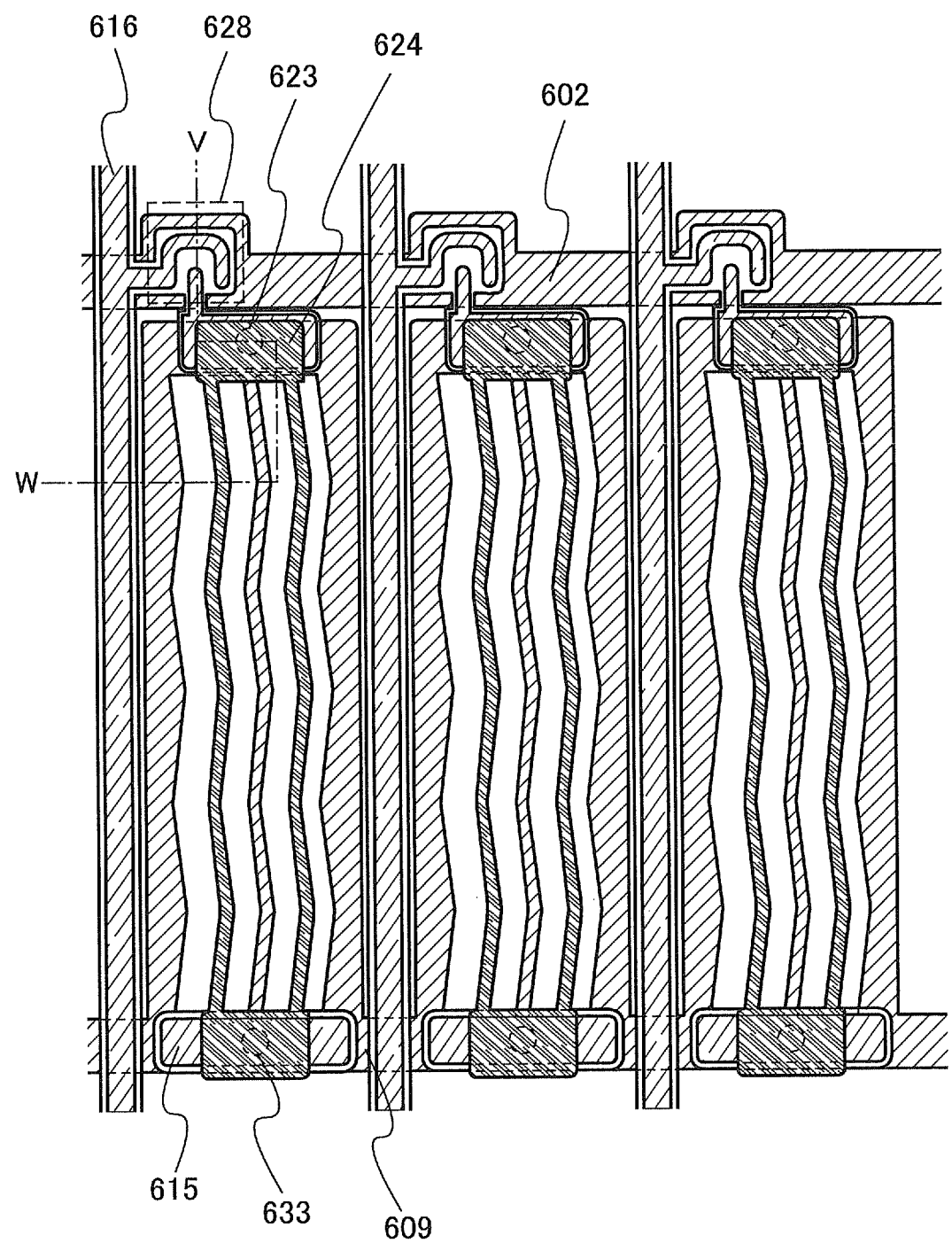
FIG. 33 is a diagram illustrating a semiconductor device.

FIG. 32 and FIG. 33 illustrate a pixel structure of a liquid crystal display device of an IPS mode. FIG. 33 is a plan view, and FIG. 32 illustrates a cross-sectional structure taken along line V-W of FIG. 33. Hereinafter, description is made with reference to both of the drawings.

In FIG. 32, the counter substrate 601 is superposed on the substrate 600 over which the TFT 628 and the pixel electrode layer 624 connected thereto are formed, and liquid crystals are injected between the substrates. The counter substrate 601 is provided with the coloring film 636, the planarization film 637, and the like. Note that a counter electrode layer is not provided on the counter substrate 601 side. The liquid crystal layer 650 is formed between the substrate 600 and the counter substrate 601 with the alignment films 646 and 648 interposed therebetween.

A common potential line 609 and the TFT 628 are formed over the substrate 600. The common potential line 609 can be formed at the same time as the gate wiring 602 of the TFT 628. The thin film transistor described in any of Embodiments 1 to 6 can be employed as the TFT 628.

The wirings 616 and 618 of the TFT 628 are formed over the gate insulating layer 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624.

The insulating film 620 and an insulating film 621 are formed over the wirings 616 and 618. Further, the pixel electrode layer 624 that is connected to the wiring 618 through the contact hole 623 formed in the insulating film 620 is formed over the insulating film 620. The pixel electrode layer 624 is formed using a material similar to that of the pixel electrode layer described in any of Embodiments 1 to 6. As illustrated in FIG. 33, the pixel electrode layer 624 is formed such that the pixel electrode layer 624 and a comb-like electrode that is formed at the same time as the common potential line 609 can generate a horizontal electric field. Further, a comb-like portion of the pixel electrode layer 624 and the comb-like electrode that is formed at the same time as the common potential line 609 are formed so as not to overlap with each other.

When an electric field is generated between the potential applied to the pixel electrode layer 624 and that applied to the common potential line 609, the alignment of liquid crystals is controlled with this electric field. Liquid crystal molecules are horizontally rotated with the use of the electric field in the direction roughly parallel to the substrate. In this case, since the liquid crystal molecules are horizontally aligned in any state, the contrast or the like is less influenced by the viewing angle; thus, the viewing angle is increased.

In this manner, the TFT 628 and the pixel electrode layer 624 connected thereto are formed over the substrate 600. A storage capacitor is formed by providing the gate insulating layer 606 between the common potential line 609 and a capacitor electrode 615. The capacitor electrode 615 is connected to the pixel electrode layer 624 through a contact hole 633.

Next, a mode of a liquid crystal display device in a TN mode is described.

Figure 34:
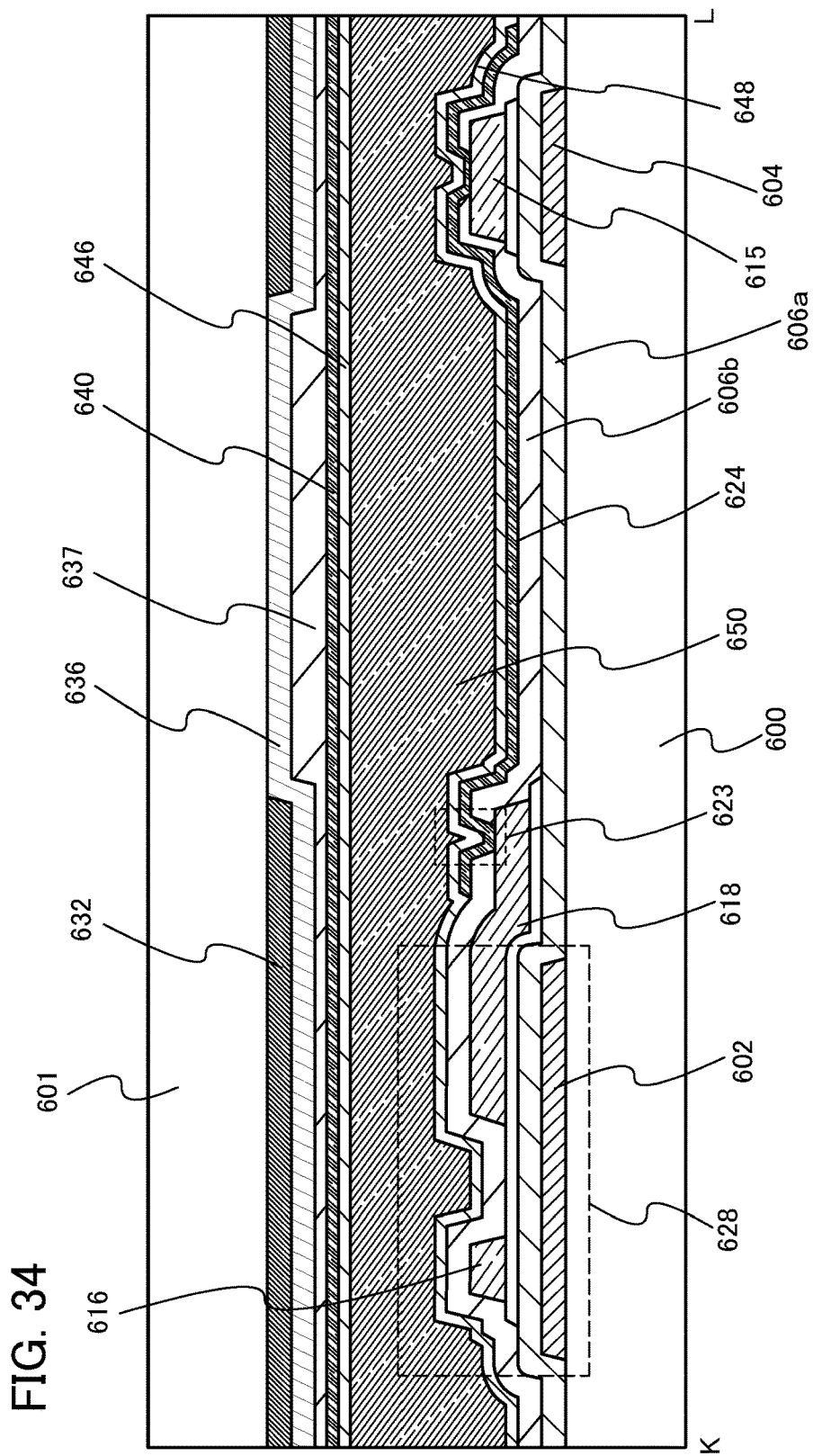
FIG. 34 is a diagram illustrating a semiconductor device.
Figure 35:
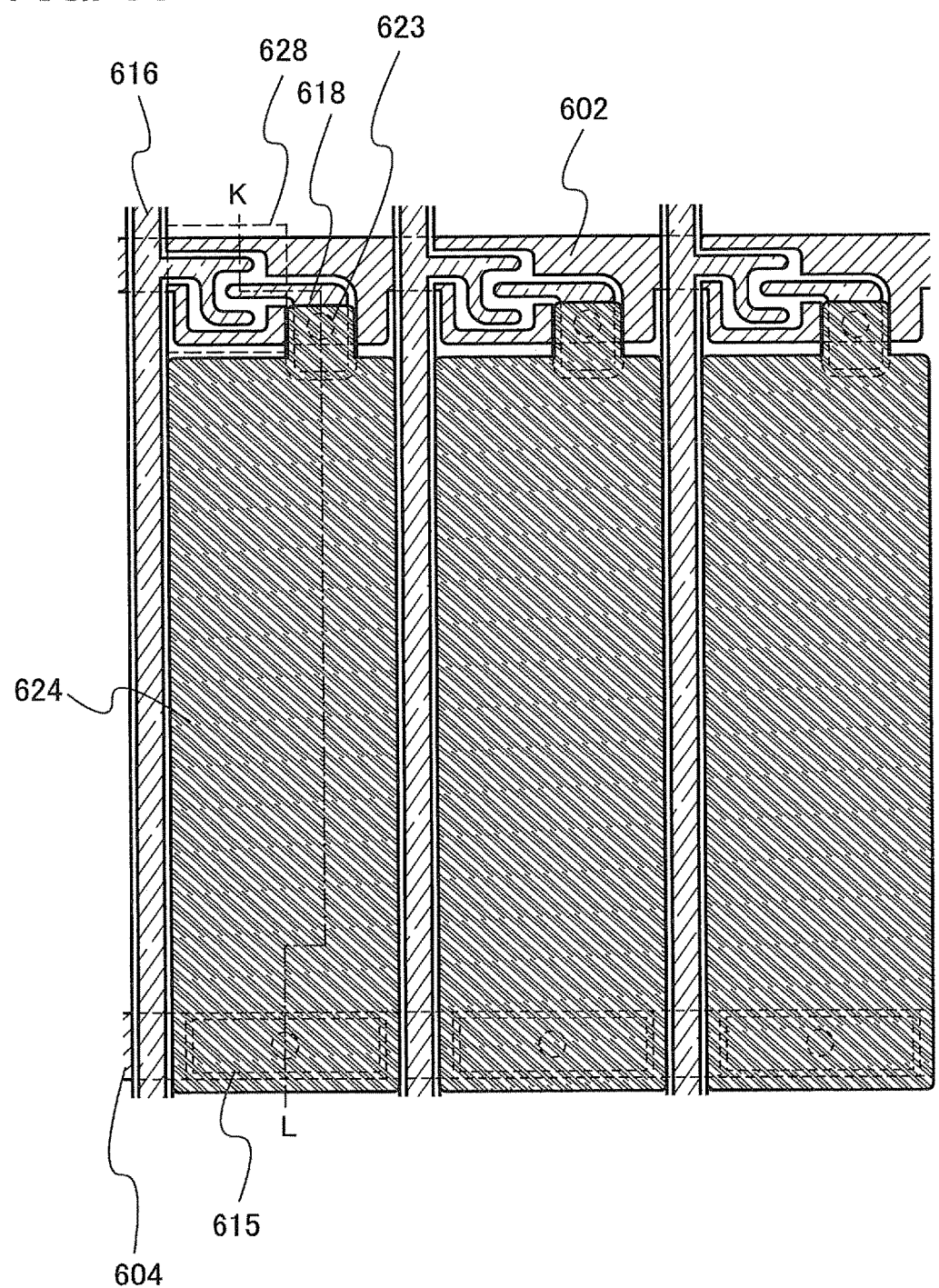
FIG. 35 is a diagram illustrating a semiconductor device.

FIG. 34 and FIG. 35 illustrate a pixel structure of a liquid crystal display device in a TN mode. FIG. 35 is a plan view. FIG. 34 illustrates a cross-sectional structure along line K-L in FIG. 35. Description below is given with reference to both the drawings.

The pixel electrode layer 624 is connected to the TFT 628 through the wiring 618 through the contact hole 623 formed in a second gate insulating layer 606b. The wiring 616 functioning as a data line is connected to the TFT 628. The TFT described in any of Embodiments 1 to 6 can be used as the TFT 628.

The pixel electrode layer 624 is formed using the pixel electrode described in any of Embodiments 1 to 6. The capacitor wiring 604 can be formed at the same time as the gate wiring 602 of the TFT 628. A first gate insulating layer 606a and the second gate insulating layer 606b are formed over the gate wiring 602 and the capacitor wiring 604. The first gate insulating layer 606a and the second gate insulating layer 606b are provided between the capacitor wiring 604 and the capacitor electrode 615, whereby a storage capacitor is formed. The capacitor electrode 615 and the pixel electrode layer 624 are connected to each other through the contact hole 623.

The counter substrate 601 is provided with the coloring film 636 and the counter electrode layer 640. The planarization film 637 is formed between the coloring film 636 and the counter electrode layer 640 to prevent alignment disorder of liquid crystals. The liquid crystal layer 650 is formed between the pixel electrode layer 624 and the counter electrode layer 640 with the alignment films 646 and 648 therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is the reverse of the surface provided with the thin film transistor, and another polarizing plate is attached to a surface of the counter substrate 601, which is the reverse of the surface provided with the counter electrode layer 640.

Through the above steps, a liquid crystal display device can be manufactured as a display device.

This application is based on Japanese Patent Application serial no. 2009-185318 filed with Japan Patent Office on Aug. 7, 2009, the entire contents of which are hereby incorporated by reference.

What is claimed is:

1. A semiconductor device comprising:
   a driver circuit portion and a pixel portion each comprising:
      a gate electrode layer; and
      a gate insulating layer over the gate electrode layer;
   an oxide semiconductor layer over the gate insulating layer, the oxide semiconductor layer overlapping the gate electrode layer;
   a first conductive layer over the oxide semiconductor layer, the first conductive layer being electrically connected to the oxide semiconductor layer;
   a second conductive layer over the oxide semiconductor layer, the second conductive layer being electrically connected to the oxide semiconductor layer;

an oxide insulating layer over the oxide semiconductor layer, the first conductive layer and the second conductive layer, the oxide insulating layer being in contact with a first end portion of the oxide semiconductor layer and a second end portion of the oxide semiconductor layer; and a terminal portion comprising:
a second oxide semiconductor layer; and
a fourth conductive layer, wherein the pixel portion comprises a pixel electrode layer over the oxide insulating layer, wherein the driver circuit portion comprises a third conductive layer which overlaps with the oxide semiconductor layer over the oxide insulating layer, wherein the third conductive layer is not provided over the gate electrode layer of the pixel portion, wherein the second conductive layer of the pixel portion is electrically connected to the pixel electrode layer, and wherein an end portion of the second oxide semiconductor layer protrudes from an end portion of the fourth conductive layer.

2. The semiconductor device according to claim 1, wherein each of the pixel electrode layer and the third conductive layer is formed from a same conductive film.

3. The semiconductor device according to claim 1,
wherein each of the pixel electrode layer and the third conductive layer comprises an indium oxide-zinc oxide alloy.

4. The semiconductor device according to claim 1, wherein the third conductive layer is configured to be a gate electrode.

5. The semiconductor device according to claim 1, wherein the third conductive layer and the gate electrode of the driver circuit portion have a same potential.

6. The semiconductor device according to claim 1, wherein the third conductive layer is in a floating state.

7. The semiconductor device according to claim 1,
wherein the gate insulating layer has a single-layer structure or a stacked-layer structure of a silicon oxide layer, a silicon oxynitride layer, or an aluminum oxide layer.

8. The semiconductor device according to claim 1, wherein a peak of water at 300° C. is not detected when a TDS (Thermal Desorption Spectroscopy) is performed on the oxide semiconductor layer.

9. A semiconductor device comprising:
a driver circuit portion and a pixel portion each comprising:
a gate electrode layer; and
a gate insulating layer over the gate electrode layer;
an oxide semiconductor layer over the gate insulating layer, the oxide semiconductor layer overlapping the gate electrode layer;
a first conductive layer over the oxide semiconductor layer, the first conductive layer being electrically connected to the oxide semiconductor layer;
a second conductive layer over the oxide semiconductor layer, the second conductive layer being electrically connected to the oxide semiconductor layer;
an oxide insulating layer over the oxide semiconductor layer, the first conductive layer and the second conductive layer, the oxide insulating layer being in contact with a first end portion of the oxide semiconductor layer and a second end portion of the oxide semiconductor layer; and a terminal portion comprising:
a second oxide semiconductor layer; and
a fourth conductive layer, wherein the pixel portion comprises a pixel electrode layer over the oxide insulating layer, wherein the driver circuit portion comprises a third conductive layer which overlaps with the oxide semiconductor layer over the oxide insulating layer, wherein the third conductive layer is not provided over the gate electrode layer of the pixel portion, wherein the second conductive layer of the pixel portion is electrically connected to the pixel electrode layer, wherein the oxide insulating layer includes a region in an oxygen-excess state, wherein oxygen in the region in the oxygen-excess state is diffused into the oxide semiconductor layer through a heat treatment, and wherein an end portion of the second oxide semiconductor layer protrudes from an end portion of the fourth conductive layer.

10. The semiconductor device according to claim 9, wherein each of the pixel electrode layer and the third conductive layer is formed from a same conductive film.

11. The semiconductor device according to claim 9,
wherein each of the pixel electrode layer and the third conductive layer comprises an indium oxide-zinc oxide alloy.

12. The semiconductor device according to claim 9, wherein the third conductive layer is configured to be a gate electrode.

13. The semiconductor device according to claim 9, wherein the third conductive layer and the gate electrode of the driver circuit portion have a same potential.

14. The semiconductor device according to claim 9, wherein the third conductive layer is in a floating state.

15. The semiconductor device according to claim 9,
wherein the gate insulating layer has a single-layer structure or a stacked-layer structure of a silicon oxide layer, a silicon oxynitride layer, or an aluminum oxide layer.

16. The semiconductor device according to claim 9, wherein a peak of water at 300° C. is not detected when a TDS (Thermal Desorption Spectroscopy) is performed on the oxide semiconductor layer.

* * * * *